United States Patent
Zheng et al.

(10) Patent No.: US 8,477,824 B2
(45) Date of Patent: Jul. 2, 2013

(54) SEMICONDUCTOR LASER APPARATUS HAVING COLLIMATOR LENS AND PATH ROTATOR

(75) Inventors: Yujin Zheng, Hamamatsu (JP); Hirofumi Kan, Hamamatsu (JP); Xin Gao, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 614 days.

(21) Appl. No.: 12/676,313

(22) Filed: Mar. 3, 2010

(65) Prior Publication Data

US 2011/0206083 A1    Aug. 25, 2011

Related U.S. Application Data

(62) Division of application No. 10/555,923, filed as application No. PCT/JP2004/006503 on May 7, 2004, now Pat. No. 7,693,206.

(30) Foreign Application Priority Data

| May 9, 2003 | (JP) | ............................... P2003-132198 |
| Jun. 12, 2003 | (JP) | ............................... P2003-167983 |
| Jul. 31, 2003 | (JP) | ............................... P2003-284464 |
| Dec. 17, 2003 | (JP) | ............................... P2003-419735 |
| Jan. 28, 2004 | (JP) | ............................... P2004-020338 |

(51) Int. Cl.
    *H01S 3/08*      (2006.01)
    *H01S 5/00*      (2006.01)

(52) U.S. Cl.
    USPC ........................... 372/50.23; 372/98; 372/101

(58) Field of Classification Search
    USPC ........................ 372/50.23, 98, 101
    See application file for complete search history.

(56) References Cited

U.S. PATENT DOCUMENTS

| 5,027,359 | A | | 6/1991 | Leger et al. |
| 5,386,426 | A | * | 1/1995 | Stephens ........................ 372/20 |
| 5,524,012 | A | | 6/1996 | Wang et al. |
| 6,243,210 | B1 | * | 6/2001 | Yan ............................... 359/641 |
| 6,584,133 | B1 | | 6/2003 | Walker et al. |

FOREIGN PATENT DOCUMENTS

| JP | 5-048200 | 2/1993 |
| JP | 6-181356 | 6/1994 |
| JP | 6-196779 | 7/1994 |
| JP | 6-244505 | 9/1994 |

(Continued)

*Primary Examiner* — Tod T Van Roy
*Assistant Examiner* — Marcia Golub-Miller
(74) *Attorney, Agent, or Firm* — Drinker Biddle & Reath LLP

(57) ABSTRACT

This invention relates to semiconductor laser apparatus with a structure for reducing the divergence angle of output light and for narrowing the spectral width. The semiconductor laser apparatus has at least a semiconductor laser array, a collimator lens, a path rotator, and an optical element with a reflecting function. The collimator lens collimates a plurality of laser beams from the semiconductor laser array, in a predetermined direction. The path rotator outputs each beam collimated in the predetermined direction, with a predetermined divergence angle in the predetermined direction in a state in which a transverse section of the beam is rotated by about 90°. The optical element is arranged at a position where at least a part of each beam from the path rotator arrives, and constitutes at least a part of an external resonator. This optical element reflects a part of each beam from the path rotator to return the reflected part of each beam to the active layer in the semiconductor laser array.

2 Claims, 55 Drawing Sheets

FOREIGN PATENT DOCUMENTS

| | | |
|---|---|---|
| JP | 6-252489 | 9/1994 |
| JP | 7-30203 | 1/1995 |
| JP | 7-098402 | 4/1995 |
| JP | 9-54347 | 2/1997 |
| JP | 11/072743 | 3/1999 |
| JP | 11/307879 | 11/1999 |
| JP | 2002-239773 | 8/2002 |
| WO | 02/054116 | 7/2002 |

* cited by examiner

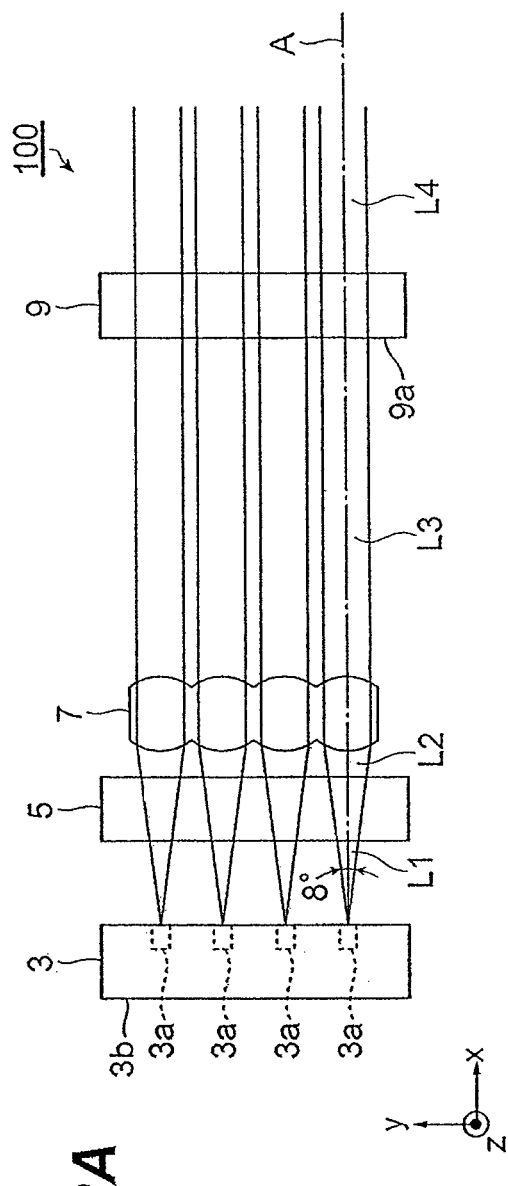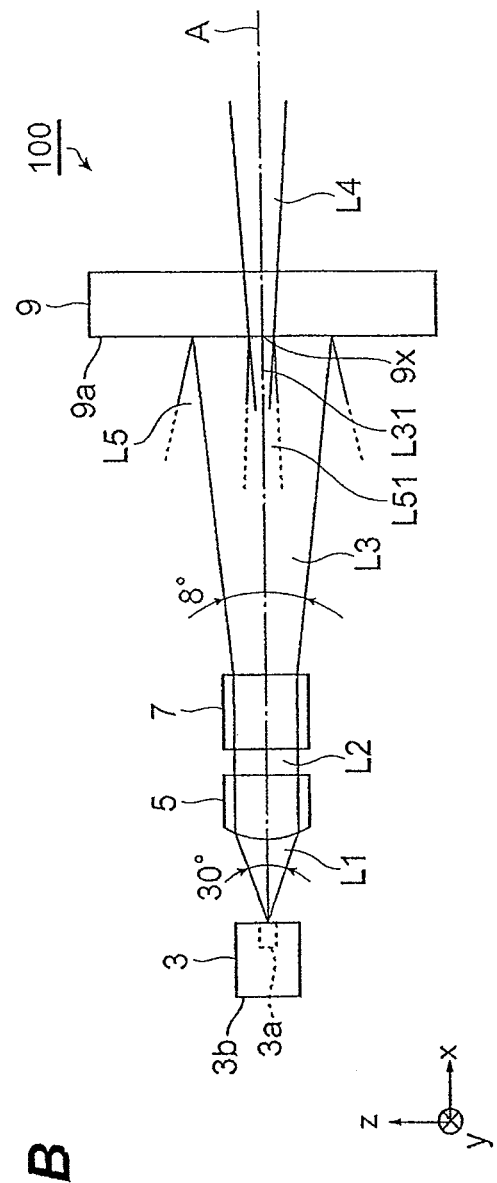
Fig.2A
Fig.2B

Fig.6
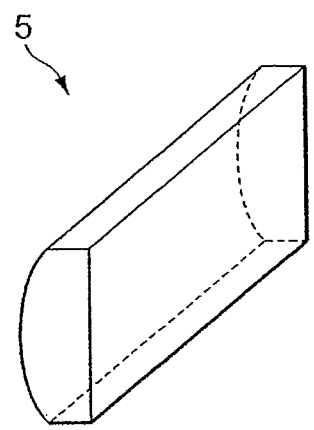
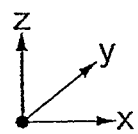

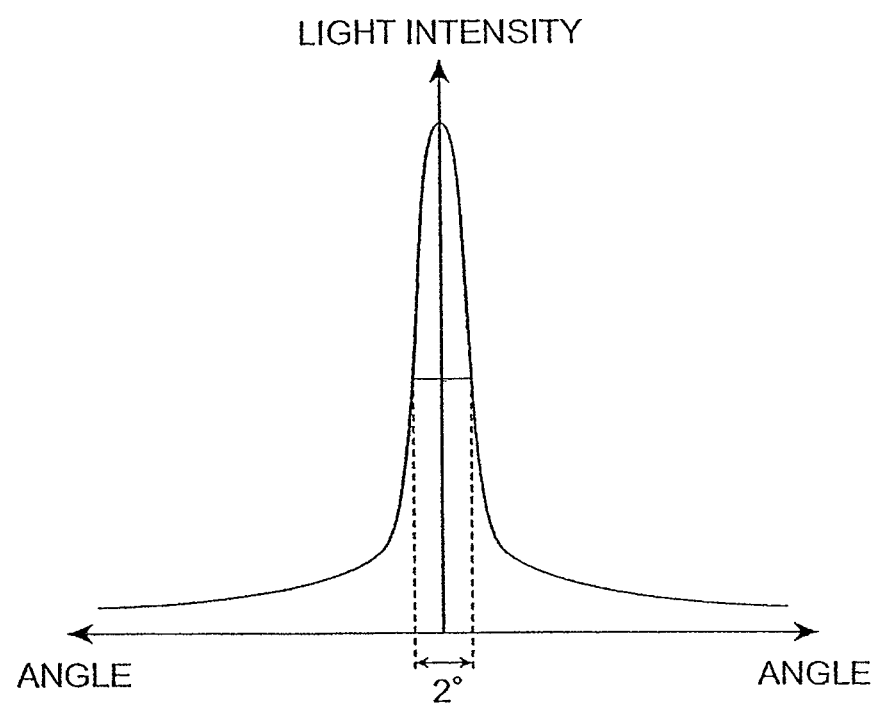

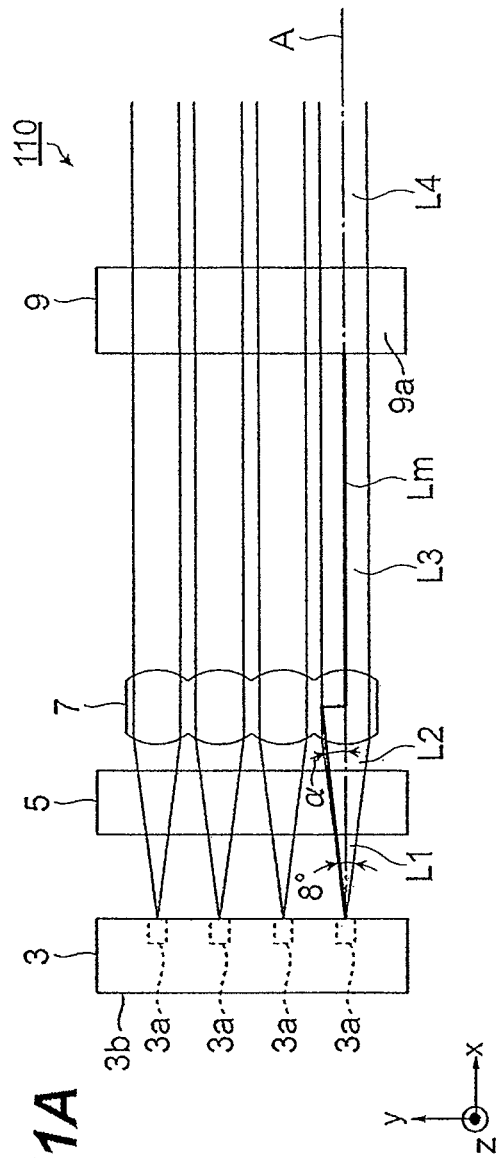
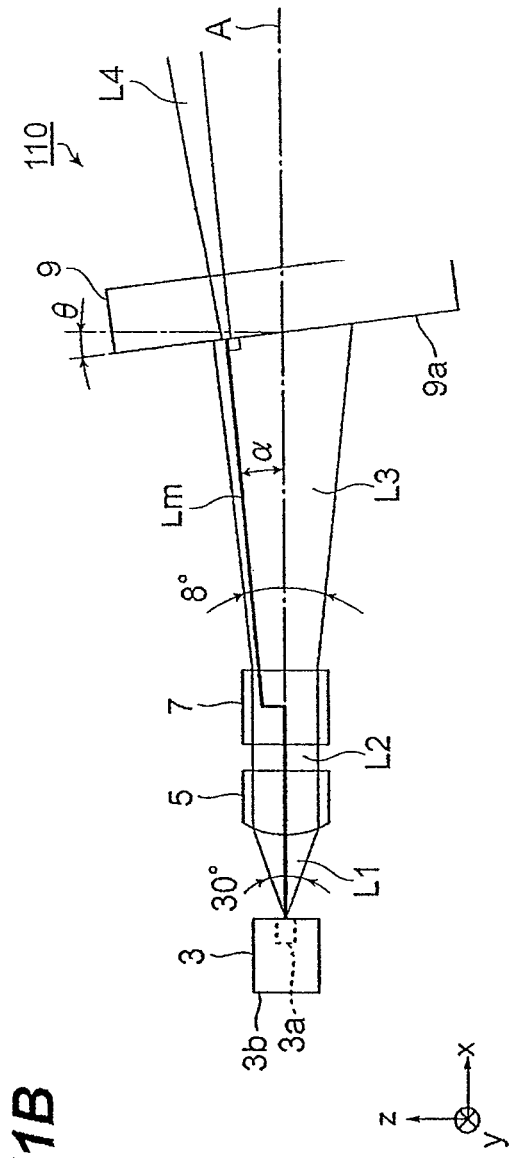
Fig.11A
Fig.11B

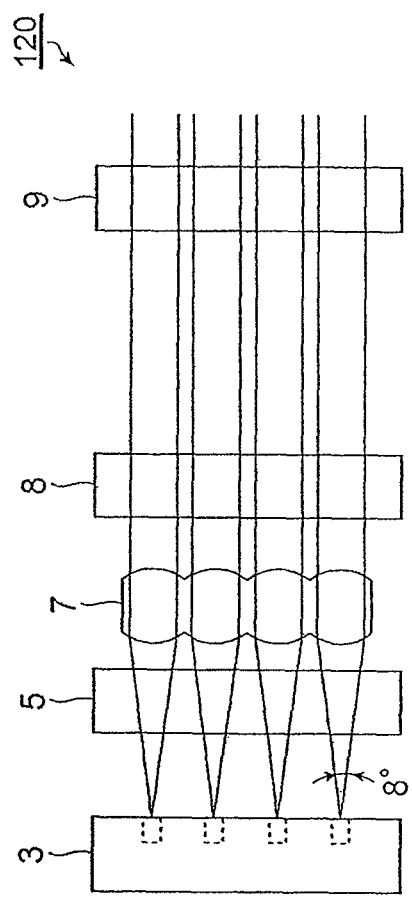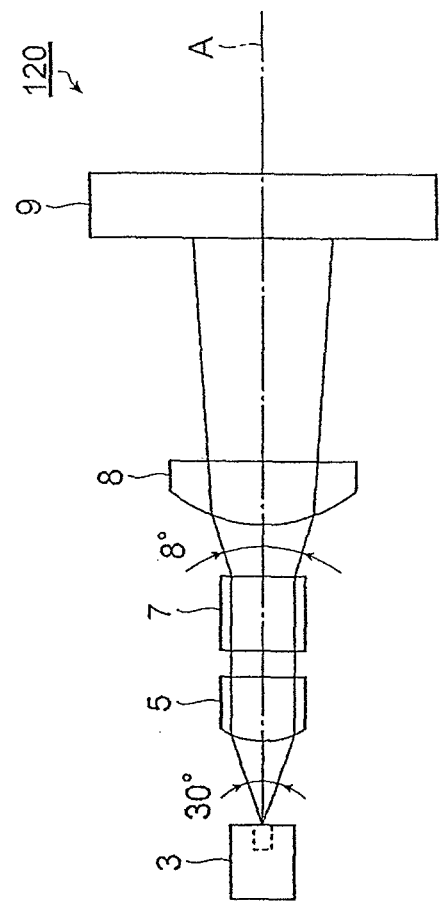
Fig.13A
Fig.13B

Fig.14
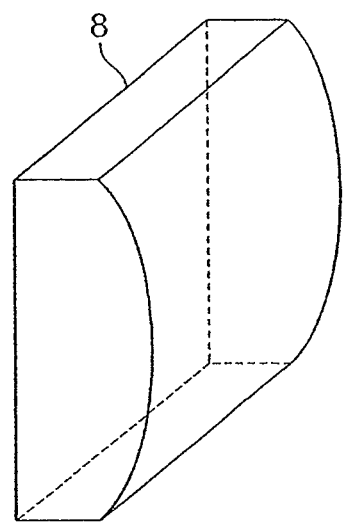
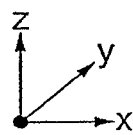

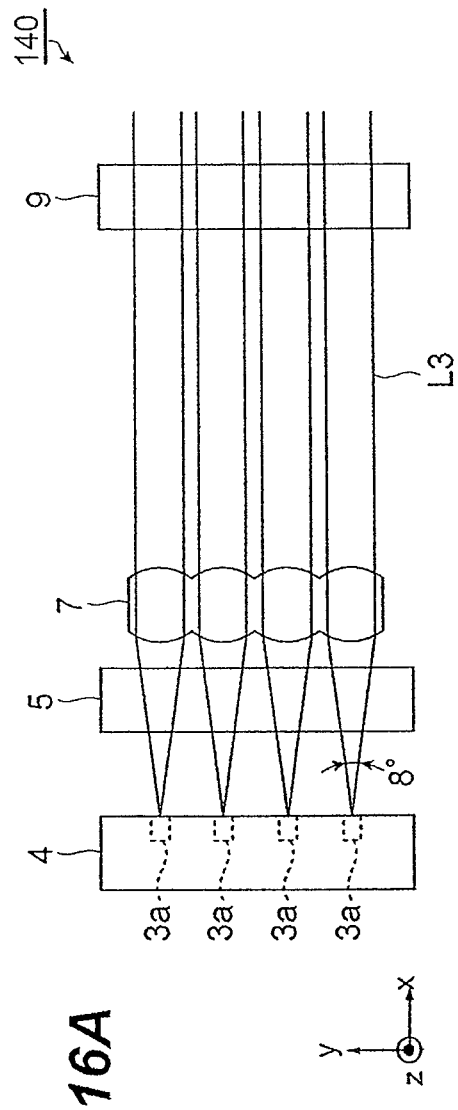
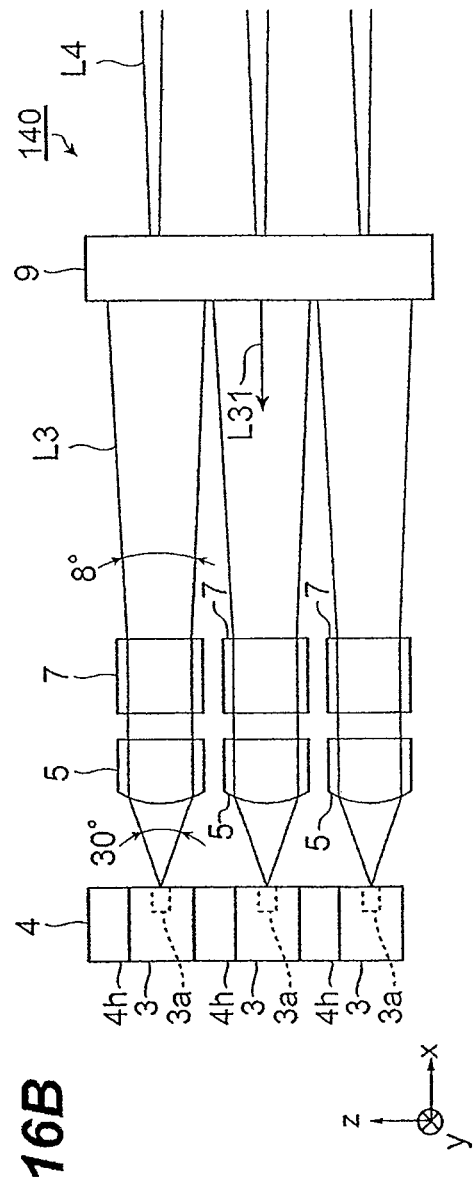
Fig. 16A
Fig. 16B

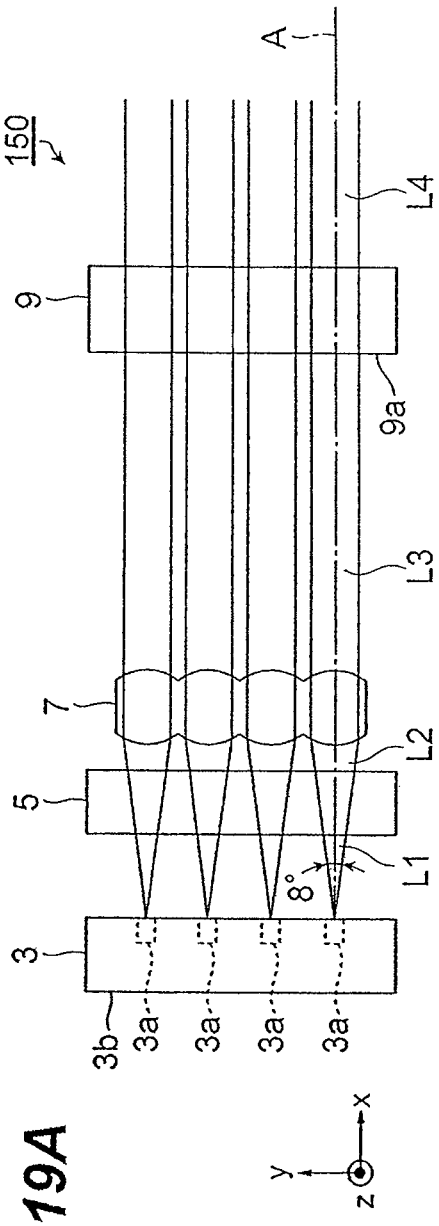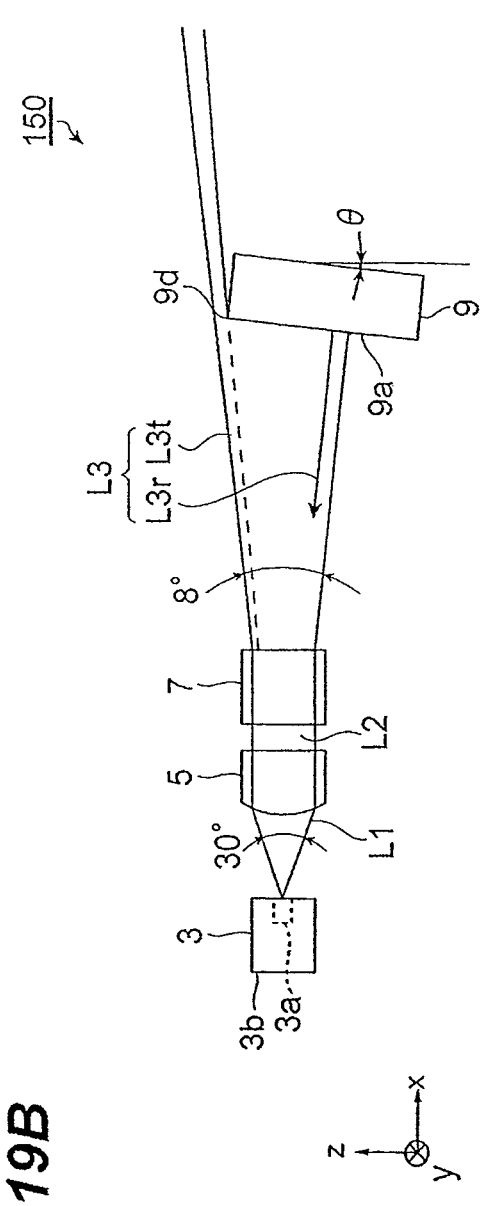

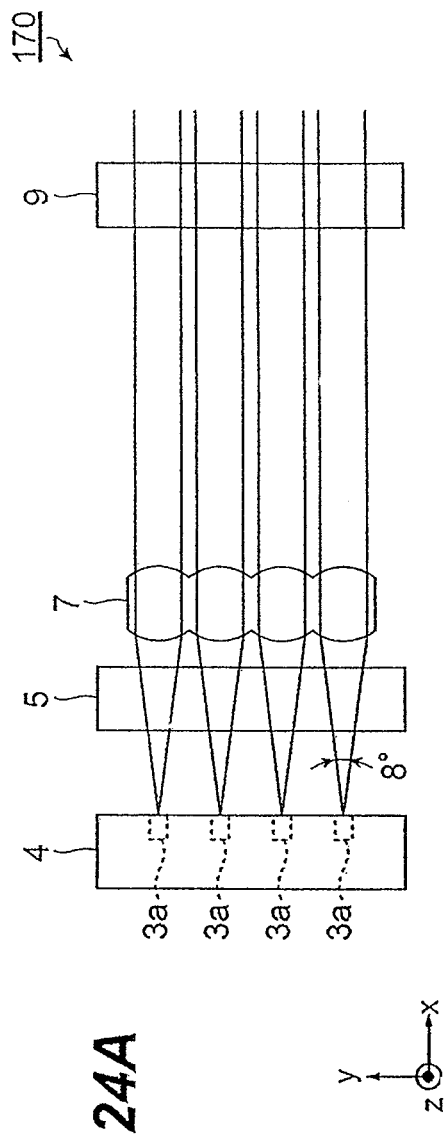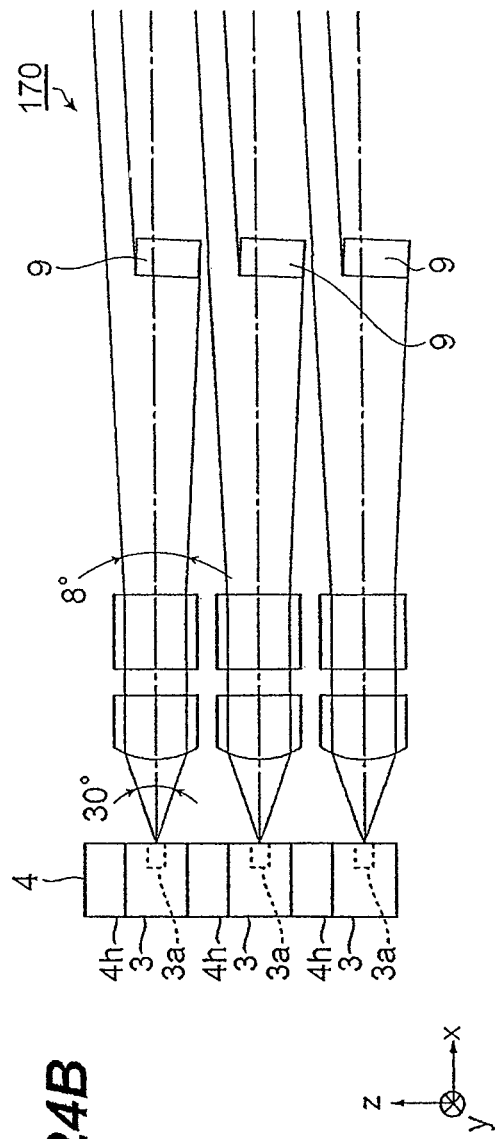

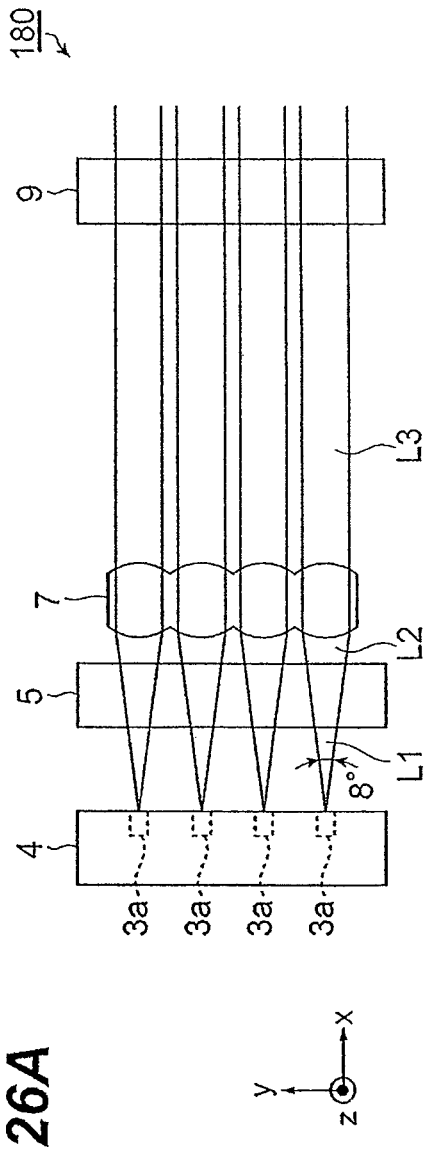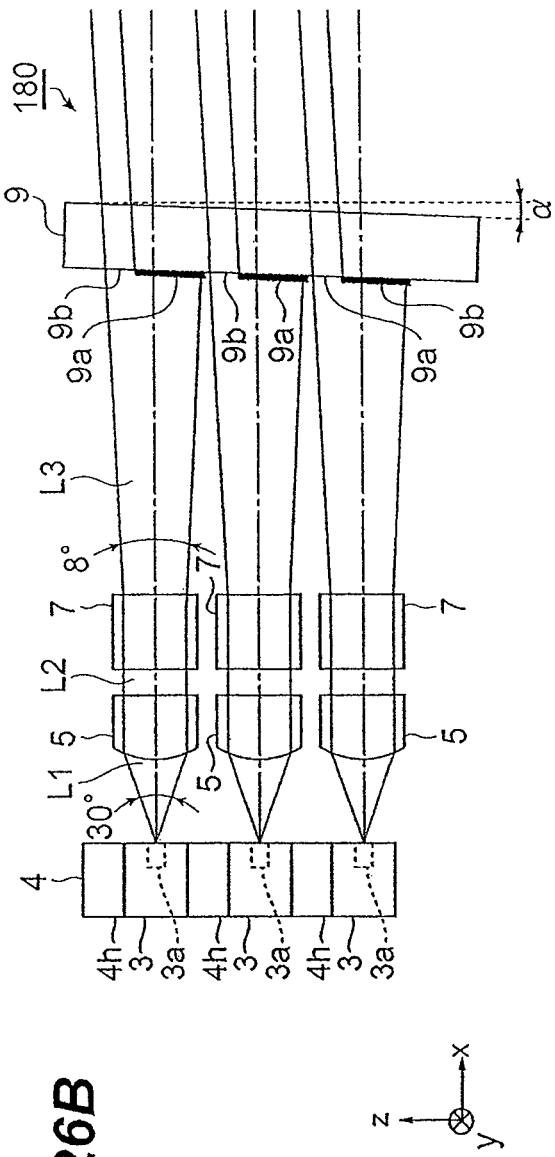

SEMICONDUCTOR LASER APPARATUS HAVING COLLIMATOR LENS AND PATH ROTATOR

This is a divisional application of copending application Ser. No. 10/555,923, having a §371 date of Sep. 27, 2006, which is a national stage filing based on PCT International Application No. PCT/JP2004/006503, filed on May 7, 2004. The copending application Ser. No. 10/555,923 is incorporated by reference herein in its entirety.

TECHNICAL FIELD

The present invention relates to semiconductor laser apparatus having a plurality of laser light sources.

BACKGROUND ART

One of the conventionally known semiconductor laser apparatus is a semiconductor laser apparatus comprising a semiconductor laser array having a plurality of active layers arrayed in parallel along a predetermined direction, a collimator lens for collimating a plurality of beams emitted from the plurality of active layers, in a direction perpendicular to the array direction of the active layers, and a path changing element for receiving the beams collimated by the collimator and for rotating the transverse sections of the beams by about 90° (e.g., cf. Document 1: Japanese Patent No. 3071360).

FIGS. 1A and 1B are views for explaining the divergence angle of a beam emitted from each active layer 103 of the semiconductor laser array 101 in the semiconductor laser apparatus described in this Document 1. FIG. 1A is a side view showing the divergence angle of the beam and FIG. 1B a plan view showing the divergence angle of the beam. The coordinate axes (x-axis, y-axis, and z-axis) are set as follows: the direction of the x-axis is defined along a direction of emission of laser light from the semiconductor laser array, the direction of the y-axis along the array direction of the active layers, and the direction of the z-axis along the direction perpendicular to both the x-axis direction and the y-axis direction. The divergence angle in the z-axis direction of the beam emitted from each active layer is 30°-40° with a center on the optical axis 105 (FIG. 1A), and the divergence angle in the y-axis direction 8-10° (FIG. 1B). The semiconductor laser apparatus described in the foregoing Document 1 is constructed in a structure in which the collimator lens collimates the beams in the vertical direction and thereafter the path changing element rotates the sections of the beams by 90°, so as to keep the adjacent beams less likely to intersect with each other.

DISCLOSURE OF THE INVENTION

The Inventors investigated the conventional semiconductor laser apparatus and found the following problem. Specifically, the laser light emitted from the laser apparatus is generally demanded to have a small divergence angle and a narrow spectral width in view of a variety of applications.

However, since the semiconductor laser apparatus of Document 1 is constructed to rotate the cross sections of the beams by 90° by the path changing element, the divergence angle in the y-axis direction is converted directly into the divergence angle in the z-axis direction. The laser light finally emitted from the semiconductor laser apparatus still has the divergence angle of 8-10° in the z-axis direction. In addition, the semiconductor laser apparatus of Document 1 has a wide spectral width of the emitted light from each active layer 103 in the semiconductor laser array 101, and thus also has a wide spectral width of the laser light finally emitted from the semiconductor laser apparatus.

The present invention has been accomplished in order to solve the problem as described above, and an object of the present invention is therefore to provide a semiconductor laser apparatus having a structure capable of emitting laser light with a small divergence angle and narrowing the spectral width of the laser light.

In order to solve the above problem, a semiconductor laser apparatus of the present invention comprises at least a semiconductor laser array, a first collimator lens, a path changing element (hereinafter referred to as a path rotator), and an optical element. The semiconductor laser apparatus may comprise a semiconductor laser array stack, a first collimator lens, a path rotator, and an optical element.

The semiconductor laser array has a plurality of active layers each extending along a first direction on a predetermined plane and arranged along a second direction perpendicular to the first direction and in parallel on the predetermined plane. The first collimator lens collimates a plurality of beams emitted from the respective active layers, in a third direction perpendicular to the predetermined plane. The path rotator outputs each of the beams coming from the first collimator lens and collimated in the third direction, with a predetermined divergence angle in the third direction in a state in which a transverse section thereof is rotated by approximately 90°. The foregoing optical element is located at a position where at least a part of each beam with the predetermined divergence angle in the third direction, outputted from the path rotator, arrives, and constitutes at least a portion of an external resonator in cooperation with the active layer. This optical element functions to reflect a part of each beam arriving from the path rotator, so as to return the reflected part of each beam to the active layer.

The foregoing semiconductor laser array stack is constructed in a structure in which a plurality of semiconductor laser arrays, each of which has a plurality of active layers each extending along a first direction on a predetermined plane and arranged along a second direction perpendicular to the first direction and in parallel on the predetermined plane, are stacked in a third direction perpendicular to the predetermined plane.

In the semiconductor laser apparatus according to the present invention, each beam having passed through the path rotator has the divergence in the third direction (vertical direction), and a partial beam component having an optical path under a fixed condition in each beam is returned to the active layer in the semiconductor laser array by the optical element. The beam component returned to the active layer comes back to an end face opposite to an output surface of the semiconductor laser array to be reflected there, and thus resonance occurs between the end face opposite to the output surface of the semiconductor laser array, and the optical element (hereinafter referred to as an external resonator). Namely, the beam component with the optical path under the fixed condition is selectively returned to the end face opposite to the output surface to resonate in the external resonator so as to be amplified (the condition of the beam for occurrence of such amplification will be referred to hereinafter as "amplification condition"). Therefore, a light intensity distribution of the laser light transmitted by the optical element and finally emitted from the semiconductor laser apparatus comes to have a more prominent peak in a direction corresponding to the beam component satisfying the amplification condition. Namely, it is feasible to decrease the divergence angle of the laser light emitted from the semiconductor laser apparatus.

In the semiconductor laser apparatus according to the present invention, the optical element may have a reflecting surface for reflecting the beam from the path rotator. In this case, the reflecting surface is preferably inclined relative to a plane perpendicular to the optical axis, so as to return a beam at a position distant from the optical axis of the beam from the path rotator, to the active layer. It is often the case with the laser light emitted from the semiconductor laser array that the light intensity distribution indicating the relationship between the first direction (the direction of emission agreeing with the extending direction of the active layer) and light intensity is not a Gaussian distribution with a peak on the optical axis in the second direction (the array direction of the active layers) and that there appear peaks at positions deviating from the optical axis. Even in such cases, the semiconductor laser apparatus permits the direction of the peak to be aligned so as to satisfy the amplification condition, by properly adjusting the angle of the reflecting surface of the optical element. Since resonance can be induced while selecting the laser light in the emission direction at the peak of light intensity as described above, the light density can be further enhanced.

The semiconductor laser apparatus according to the present invention may further comprise a second collimator lens arranged on a resonance path between the path rotator and the optical element and configured to collimate each beam with a predetermined divergence angle in the third direction, outputted from the path rotator, in the third direction. According to the semiconductor laser apparatus having such structure, the collimator lens is able to refract the laser light transmitted by the path rotator, so as to make the laser light closer to a parallel beam in the vertical direction (third direction). This makes it feasible to increase the distance between the path rotator and the optical element and thus to offer greater degree of freedom of design for the semiconductor laser apparatus.

The foregoing optical element is an element having a function of reflecting a beam of a specific wavelength, and may be a mirror, a wavelength selector, or the like.

Another semiconductor laser apparatus according to the present invention comprises at least either of a semiconductor laser array and a semiconductor array stack, a first collimator lens, a path rotator, and an optical element, and, particularly, the foregoing optical element is preferably arranged at a position where the optical element crosses a part of each beam with a predetermined divergence angle in a third direction, outputted from the path rotator, but allows the rest of the beam to pass; and constitutes an off-axis external resonator with a resonance path off an optical axis of each beam emitted from an active layer, in cooperation with the active layer. In this case, a reflecting surface is inclined at a predetermined angle relative to a plane perpendicular to the optical axis of each beam outputted from the path rotator, so as to totally reflect a part of each beam arriving thereat and thereby return the totally reflected part of each beam to the active layer. In the present specification, the term "total reflection" means reflection of 95% or more of incident light (reflectance of not less than 95%).

In the semiconductor laser apparatus according to the present invention, each beam transmitted by the path rotator is radiated with divergence in the third direction. Since the optical element is arranged so as to cross a part of the optical path of each beam transmitted by the path rotator, a part of each diverging beam is incident to the reflecting surface of the optical element and the rest is not incident to the reflecting surface. The beam incident to the reflecting surface is totally reflected by the reflecting surface. Since the optical element is inclined relative to the optical axis of the beam outputted from the path rotator, at least a part of the beam reflected by the optical element returns in the direction opposite to an input path to the semiconductor laser array and comes back to the end face opposite to the output surface of the semiconductor laser array. Furthermore, this beam is reflected on the end face opposite to the output surface and is outputted again from the light emitting region (active layer). In this manner, part of the laser light generated in the active layer travels back and forth between the reflecting surface and the end face opposite to the output surface of the semiconductor laser array, to resonate. Namely, an external resonator for the laser light is formed between the reflecting surface and the end face opposite to the output surface of the semiconductor laser array. When the laser light emitted from the semiconductor laser array resonates in the external resonator, the spatial transverse mode becomes closer to the single mode, so as to decrease the divergence angle.

On the other hand, the beam part not entering the reflecting surface, which is a part of the beam radiated from the path rotator, is outputted to the other side of the semiconductor laser array when viewed from the optical element, i.e., to the outside of the semiconductor laser apparatus. Therefore, the laser light with the divergence angle decreased by the external resonator is finally outputted as output light from the semiconductor laser apparatus. In this manner, the semiconductor laser apparatus is able to decrease the divergence angle of the outputted laser light. Since the semiconductor laser apparatus is arranged to separate the optical path of the resonance light (hereinafter referred to as a resonance path) in the external resonator and the optical path of the output light (hereinafter referred to as an output path) by the physical installation location of the reflecting surface, a reflecting surface of total reflection can be used as the reflecting surface. Therefore, the resonance light can be made stronger, whereby stronger output light can be obtained.

In the semiconductor laser apparatus according to the present invention, the installation angle of the reflecting surface is preferably smaller than a half of a divergence angle of each beam outputted from the path rotator. When the angle of the reflecting surface of the optical element relative to the plane perpendicular to the optical axis is smaller than a half of the divergence angle of the beam emitted from the optical element, a beam perpendicularly entering the reflecting surface and returning to the active layer is always present in the beam incident from the optical element to the reflecting surface, whereby the aforementioned external resonator is always formed.

In the semiconductor laser apparatus according to the present invention, the reflecting surface of the optical element is arranged so as to cross the optical axis of each beam outputted from the path rotator. When the reflecting surface is arranged to cross the optical axis, it becomes feasible to set the reflecting surface so that the reflecting surface reflects half or more of the cross section of each beam outputted from the path rotator and outputs the output light in the rest cross section of not more than half, to the outside. In this case, since half or more of each beam is reflected, strong resonance light can result, whereby strong output light can be obtained.

The semiconductor laser apparatus according to the present invention may comprise a second collimator lens arranged on the resonance path between the path rotator and the optical element and configured to collimate each beam with the predetermined divergence angle in the third direction, outputted from the path rotator, in the third direction. In this case, the collimator lens is able to refract the laser light transmitted by the path rotator, so as to make the laser light closer to a parallel beam in the plane perpendicular to the second direction (the array direction of the active layers). This makes it feasible to increase the distance between the path rotator and the optical element and thus to offer greater degree of freedom of design for the semiconductor laser apparatus.

Another semiconductor laser apparatus according to the present invention comprises at least a semiconductor laser array stack, a first collimator lens, a path rotator, and an optical element, and, particularly, the foregoing optical element may be located at a position where at least a part of each beam with a predetermined divergence angle in a third direction, outputted from the path rotator, arrives, and constitute an off-axis external resonator with a resonance path deviating from an optical axis of each beam emitted from an active layer, in cooperation with the active layer. In this case, preferably, reflecting portions for reflecting a part of each beam arriving from the path rotator, so as to return the reflected part to the active layer, and transmitting portions for guiding the rest of each arriving beam to the outside are alternately arranged along the third direction on a surface of the optical element facing the path rotator.

In the semiconductor laser apparatus according to the present invention, beams emitted from the respective active layers in a plurality of semiconductor laser arrays stacked in the third direction as the semiconductor laser array stack are refracted by the first collimator lens to become approximately collimated in the third direction, and thereafter the transverse sections thereof are rotated by about 90° by the path rotator. Each beam having passed through this path rotator is radiated with divergence in the third direction to enter the optical element. In the optical element, the reflecting portions and transmitting portions for each received beam are alternately provided along the third direction (the laminate direction of the semiconductor laser arrays). Then at least a part of the light reflected by each reflecting portion of the optical element is returned to the active layer having emitted the light, thereby to form an external resonator, in which induced emission occurs in the active layer to effect lasing. On the other hand, the light transmitted by the transmitting portions of the optical element is outputted from the optical element to the outside.

In the semiconductor laser apparatus according to the present invention, the optical element may be comprised of a substrate of flat plate shape made of an optically transparent material and having a surface on which reflecting portions and transmitting portions are alternately formed along a predetermined direction. In this case, since the optical element is the integral member in which the reflecting portions and transmitting portions for the respective beams are alternately formed along the predetermined direction on the substrate, it becomes easier to handle the optical element and to achieve the assembly of the semiconductor laser apparatus and adjustment of the optical axis.

In the semiconductor laser apparatus according to the present invention, preferably, the substrate of flat plate shape of the optical element is arranged in an inclined state relative to a plane perpendicular to the optical axis of each beam outputted from the path rotator, in order to make at least part of incident light to a reflecting portion, incident perpendicularly to the reflecting portion. In this case, a part of a beam radiated with divergence in the third direction from the path rotator is incident perpendicularly to the reflecting portion to be returned through the path opposite to the input path to the active layer. This makes an external resonator to enable lasing at high efficiency.

Each reflecting portion of the optical element may be a total reflection film formed on a surface of the substrate of flat plate shape, a diffraction grating, or an etalon. Each transmitting portion may be a reflection reducing film formed on a surface of the substrate of flat plate shape.

The semiconductor laser apparatus according to the present invention may further comprise a second collimator lens arranged on the resonance path between the path rotator and the optical element and configured to collimate each beam with the predetermined divergence angle in the third direction, outputted from the path rotator, in the third direction. In this case, it also becomes feasible to increase the distance between the path rotator and the optical element and thus to offer greater degree of freedom of design for the semiconductor laser apparatus.

Another semiconductor laser apparatus according to the present invention comprises either of a semiconductor laser array and a semiconductor array stack, a first collimator lens, a path rotator, and an optical element and may further comprise a wavelength selector. The wavelength selector is arranged on a resonance path between the path rotator and an active layer, constitutes an off-axis external resonator with a resonance path deviating from the optical axis of each beam emitted from the active layer, in cooperation with the optical element, and selectively outputs light of a specific wavelength in the light arriving from the path rotator, toward the path rotator. In this configuration, the optical element is located at a position where at least a part of each beam with the predetermined divergence angle in the third direction, outputted from the path rotator, arrives, and the optical element has a reflecting portion for reflecting a part of each beam arriving from the path rotator so as to return the reflected part to the active layer, and a transmitting portion for guiding the rest of each arriving beam to the outside, on a surface facing the path rotator.

In the semiconductor laser apparatus according to the present invention, a beam emitted from each active layer in the semiconductor laser array has divergence in the third direction, and, when refracted by the first collimator lens, the beam becomes approximately collimated in the third direction and the transverse section thereof is then rotated by about 90° by the path rotator. Each beam having passed through this path rotator is radiated with divergence in the third direction to enter the optical element. The optical element has the reflecting portion and transmitting portion for each received beam. Since at least part of light reflected by the reflecting portion of the optical element is returned to the active layer having emitted the light, an external resonator is formed by it, whereby induced emission occurs in the active layer to achieve lasing. On the other hand, light transmitted by the transmitting portion of the optical element is outputted from the optical element to the outside.

In the semiconductor laser apparatus according to the present invention, the wavelength selector is provided on the resonance path between the reflecting portion of the optical element and the active layer, and the light of the specific wavelength in the light incident through the optical path to the wavelength selector is selectively outputted from the wavelength selector onto the optical path. Therefore, the light of the specific wavelength selected by the wavelength selector resonates and the light of the specific wavelength passes through the transmitting portion of the optical element to be outputted to the outside, whereby this output light comes to have a sufficiently narrow spectral width.

This semiconductor laser apparatus of the present invention may also further comprise a second collimator lens arranged on the resonance path between the path rotator and the optical element and configured to collimate each beam with the predetermined divergence angle in the third direction, outputted from the path rotator, in the third direction. In this case, it is feasible to increase the distance between the path rotator and the optical element and thus to offer greater degree of freedom of design for the semiconductor laser apparatus.

The wavelength selector is preferably a diffraction grating element, an etalon filter, or a dielectric multilayer filter. The wavelength selector may be a transmitting element provided separately from the reflecting portion of the optical element, or may be a reflecting element provided on the reflecting portion of the optical element. Where the wavelength selector is a reflecting element, the wavelength selector is preferably formed integrally with the optical element. In either case, the laser light emitted from the semiconductor laser apparatus can have a sufficiently narrow spectral width. Where a diffraction grating element is applied as the wavelength selector, the wavelength of the laser light emitted from the semiconductor laser apparatus can be changed by adjusting the angle of inclination of the diffraction grating element.

The optical element may be an element wherein simply a reflecting mirror serves as the reflecting portion and no medium is provided as the transmitting portion. In this case, the reflecting mirror is arranged so as to reflect a part of each beam arriving from the path rotator, and the rest of the beam becomes output light of the semiconductor laser apparatus.

The optical element is preferably a substrate of flat plate shape made of an optically transparent material and having a surface on which a reflecting portion and a transmitting portion are formed. In this case, since the substrate of flat plate shape has the reflecting portion and transmitting portion formed thereon, it becomes easier to handle the optical element and to achieve the assembly of the semiconductor laser apparatus and adjustment of the optical axis.

The optical element is preferably configured so that reflecting portions and transmitting portions are alternately provided along a third direction (a direction in which a plurality of semiconductor laser arrays are stacked in the semiconductor laser array stack), or may be constructed so that reflecting portions and transmitting portions are alternately formed along a predetermined direction (the third direction in which a plurality of semiconductor laser arrays are stacked in the semiconductor laser array stack).

Furthermore, the optical element is preferably configured so that the reflecting portion is arranged in an inclined state relative to a plane perpendicular to the optical axis of each beam outputted from the path rotator and so that at least part of light incident to the reflecting portion is reflected in the same output direction as the input direction. In this case, the substrate of flat plate shape is inclined relative to the plane perpendicular to the optical axis of the beam outputted from the path rotator, and a part of the beam incident from the path rotator to the optical element is reflected in the same output direction as the input direction thereof; therefore, the reflected part of the beam is returned through the path opposite to the input path to the active layer. This forms an external resonator to achieve lasing at high efficiency.

In a case where the reflecting portion of the optical element is merely a reflecting mirror or in a case where an etalon filter or a dielectric multilayer filter is integrated with the reflecting portion, at least part of light incident to the reflecting portion can be made incident perpendicularly to the reflecting portion. In a case where a reflective diffraction grating element is integrated with the reflecting portion of the optical element, the reflecting portion is arranged in an inclined state so as to make the input direction and output direction of light of the wavelength identical with each other, according to the wavelength of the light to be finally outputted as output light of the semiconductor laser apparatus.

Another semiconductor laser apparatus according to the present invention comprises either of a semiconductor laser array and a semiconductor array stack, a first collimator lens, a path rotator, and an optical element and may further comprise a wavelength selector. The wavelength selector is arranged so that a part of each beam with a divergence angle in a third direction, outputted from the path rotator, arrives from the vertical direction, and constitutes an off-axis external resonator with a resonance path deviating from the optical axis of each beam emitted from an active layer, in cooperation with the optical element. This wavelength selector Bragg-reflects part of light of a specific wavelength in the light arriving from the vertical direction so as to return the reflected part to the active layer, and transmits the rest of the light of the specific wavelength. The optical element is arranged at a position where at least a part of each beam with the predetermined divergence angle in the third direction, outputted from the path rotator, arrives. The optical element has a reflecting portion for reflecting at least a part of each beam arriving from the path rotator so as to return the reflected part to the active layer, and a transmitting portion for guiding the rest of each arriving beam to the outside, on a surface facing the path rotator.

In the semiconductor laser apparatus according to the present invention, a beam emitted from each active layer of the semiconductor laser array is emitted with divergence in the third direction from each active layer, and is refracted by the first collimator lens to become approximately collimated in the third direction, and thereafter the transverse section thereof is rotated by about 90° by the path rotator. Each beam having passed through this path rotator is radiated with divergence in the third direction and is then incident to the reflecting portion of the optical element or to the wavelength selector. Then at least part of light reflected by the reflecting portion of the optical element is returned to the active layer having emitted the light. Part of light of a specific wavelength in the light incident to the wavelength selector is Bragg-reflected by the wavelength selector, and at least part of the reflected light is returned to the active layer having emitted the light. This configuration forms an external resonator between the reflecting portion of the optical element and the wavelength selector, in which induced emission occurs in the active layer located inside the resonator, to achieve lasing. On the other hand, the light transmitted by the transmitting portion of the optical element is outputted as output light of the semiconductor laser apparatus to the outside.

The semiconductor laser apparatus according to the present invention may comprise a wavelength selector for diffracting and reflecting light by diffraction, instead of the aforementioned wavelength selector for effecting Bragg reflection. Namely, the wavelength selector in this configuration reflects each beam with the transverse section rotated by the path rotator (the beam having the predetermined divergence angle in the third direction) through diffraction, returns light of a specific diffraction order having the specific wavelength in the diffracted light, to the active layer having emitted the light, and outputs light other than the light of the specific diffraction order with the specific wavelength, to the outside.

In this semiconductor laser apparatus, a beam emitted from each active layer of the semiconductor laser array is emitted with divergence in the third direction from each active layer, and is refracted by the collimator lens to become approximately collimated in the third direction, and thereafter the transverse section thereof is rotated by about 90° by the path rotator. Each beam having passed through this path rotator is radiated with divergence in the third direction to enter the reflecting portion of the optical element or the wavelength selector. Then at least part of light reflected by the reflecting portion of the optical element is returned to the active layer having emitted the light. Light of the specific diffraction order having the specific wavelength in the light incident to the wavelength selector, is returned to the active layer having emitted the light. This configuration forms an external resonator between the reflecting portion of the optical element and the wavelength selector, in which induced emission occurs in the active layer located inside the resonator, to achieve lasing. On the other hand, light other than the light of the specific diffraction order having the specific wavelength in the light incident to the wavelength selector is outputted as output light of the semiconductor laser apparatus to the outside.

The semiconductor laser apparatus according to the present invention may further comprise a second collimator lens arranged so as to cross each of a resonance path between the optical element and the path rotator and a resonance path between the wavelength selector and the path rotator, and configured to collimate each beam with the predetermined divergence angle in the third direction, outputted from the path rotator, in the third direction. In this case, it becomes feasible to increase the distance between the optical element and the path rotator or the distance between the wavelength selector and the path rotator and thus to offer greater degree of freedom of design for the semiconductor laser apparatus.

The optical element may be configured so that simply a reflecting mirror serves as the reflecting portion and so that no medium is provided as the transmitting portion. In this case, the reflecting mirror is arranged so as to reflect a part of a beam arriving from the path rotator, and the rest of the beam enters the wavelength selector.

The optical element is preferably comprised of a substrate of flat plate shape made of an optically transparent material and having a surface on which a reflecting portion and a transmitting portion are formed. In this case, reflecting portions and transmitting portions for the respective beams are alternately formed along the second direction on the surface of the substrate and the optical element is integrally formed; therefore, it becomes easier to handle this optical element and to achieve the assembly of the semiconductor laser apparatus and adjustment of the optical axis.

In the optical element, preferably, the reflecting portions and the transmitting portions are alternately provided along a third direction (a direction in which a plurality of semiconductor laser arrays are stacked in the semiconductor laser array stack).

Furthermore, in the above optical element the reflecting portion is preferably arranged in an inclined state relative to a plane perpendicular to the optical axis of each beam outputted from the path rotator, so as to make at least part of incident light to the reflecting portion, perpendicularly incident thereto. In this case, a part of a beam radiated with divergence in the third direction from the path rotator is incident perpendicularly to the reflecting portion to be returned through the path opposite to the input path to the active layer. This forms an external resonator, so as to achieve lasing at high efficiency.

The wavelength selector for Bragg reflection is preferably located at a position of the transmitting portion in the optical element. Where the optical element is comprised of a substrate of flat plate shape made of an optically transparent material and having a surface on which a reflecting portion and a transmitting portion are formed, it is preferable to provide the wavelength selector as the transmitting portion on the substrate. This configuration decreases the number of parts of the semiconductor laser apparatus and facilitates the assembly.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 2A is a plan view showing a configuration of the first embodiment of the semiconductor laser apparatus according to the present invention, and FIG. 2B a side view thereof.

FIG. 6 is a perspective view showing a configuration of a first collimator lens applied to the semiconductor laser apparatus of the first embodiment.

FIG. 10 is a light intensity distribution in the horizontal direction (y-axis direction) of a beam emitted from the semiconductor laser apparatus of the first embodiment.

FIG. 11A is a plan view showing a configuration of the second embodiment of the semiconductor laser apparatus according to the present invention, and FIG. 11B a side view thereof.

FIG. 13A is a plan view showing a configuration of the third embodiment of the semiconductor laser apparatus according to the present invention, and FIG. 13B a side view thereof.

FIG. 14 is a perspective view showing a configuration of a second collimator lens.

FIG. 16A is a plan view showing a configuration of the fifth embodiment of the semiconductor laser apparatus according to the present invention, and FIG. 16B a side view thereof.

FIG. 19A is a plan view showing a configuration of the sixth embodiment of the semiconductor laser apparatus according to the present invention, and FIG. 19B a side view thereof.

FIG. 24A is a plan view showing a configuration of the eighth embodiment of the semiconductor laser apparatus according to the present invention, and FIG. 24B a side view thereof.

FIG. 26A is a plan view showing a configuration of the ninth embodiment of the semiconductor laser apparatus according to the present invention, and FIG. 26B a side view thereof.

BEST MODES FOR CARRYING OUT THE INVENTION

Figure 1A:
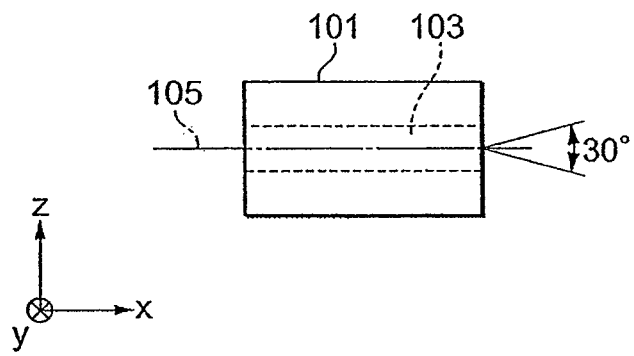
FIG. 1A is a side view showing the divergence angle in the vertical direction (z-axis direction) of a beam emitted from a semiconductor laser, and FIG. 1B a plan view showing the divergence angle in the horizontal direction (y-axis direction) of the beam.
Figure 1B:
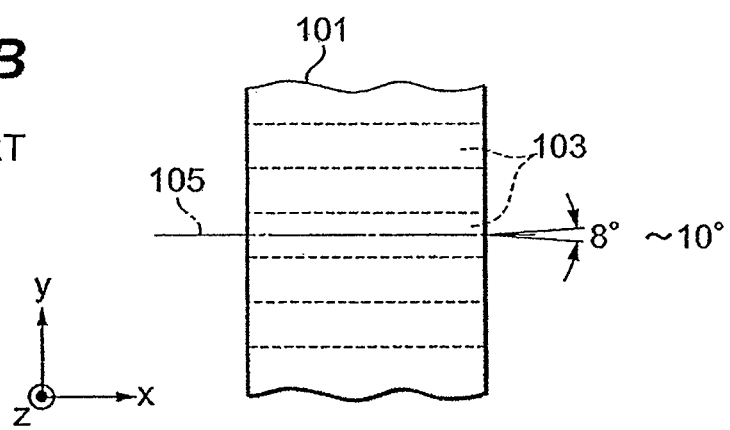

Each of embodiments of the semiconductor laser apparatus according to the present invention will be described below in detail using FIGS. 2A-2B, 3, 4A-4B, 5-8, 9A-9C, 10, 11A-11B, 12, 13A-13B, 14, 15A-16B, 17, 18A-19B, 20-22, 23A-24B, 25, 26A-26B, 27-28, 29A-29C, 30-31, 32A-32B, 33-34, 35A-35C, 36-37, 38A-41B, 42, 43A-43C, 44-45, 46A-48B, 49, 50A-54A, 55, 56A, and 56B. The same elements will be denoted by the same reference symbols, without redundant description.

First Embodiment

FIG. 2A is a plan view showing a configuration of the first embodiment of the semiconductor laser apparatus according to the present invention, and FIG. 2B a side view thereof. The semiconductor laser apparatus 100 of this first embodiment has a semiconductor laser array 3, a first collimator lens 5, a path rotator 7, and a reflecting mirror 9 as an optical element. As shown in these FIGS. 2A and 2B, the coordinate axes (x-axis, y-axis, and z-axis) are set as follows to be used in the description hereinafter: the y-axis direction (second direction) is defined as a direction in which active layers 3a are arrayed in the semiconductor laser array 3; the x-axis direction (first direction) as a direction in which the active layers 3a extend, i.e., direction in which laser light is emitted; and the z-axis direction (third direction) as a direction perpendicular to the both directions.

Figure 3:
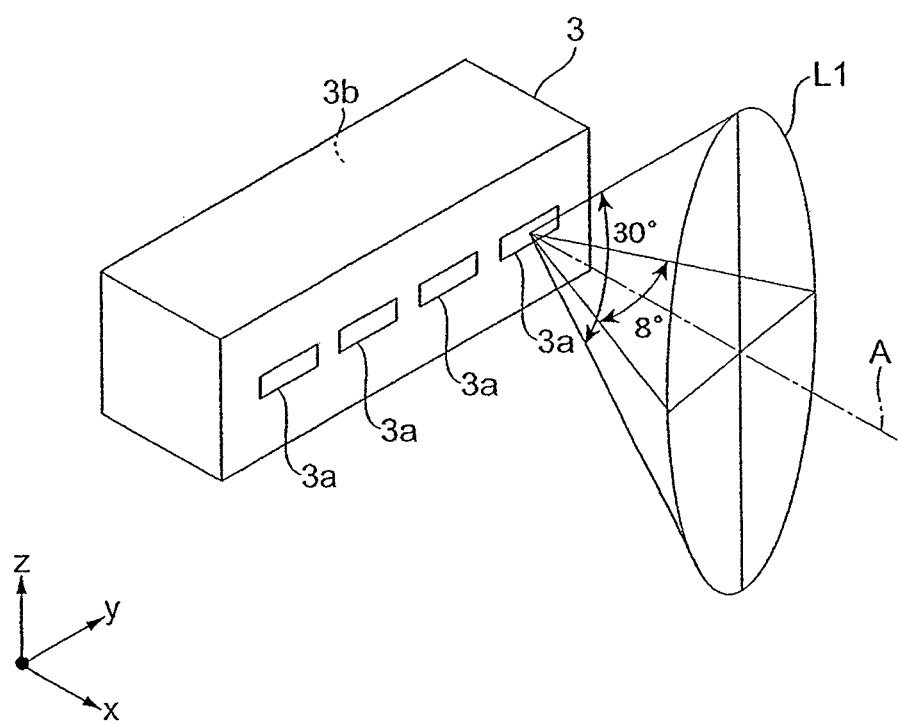
FIG. 3 is a perspective view showing a semiconductor laser array and a beam emitted from the semiconductor laser array.
Figure 4A:
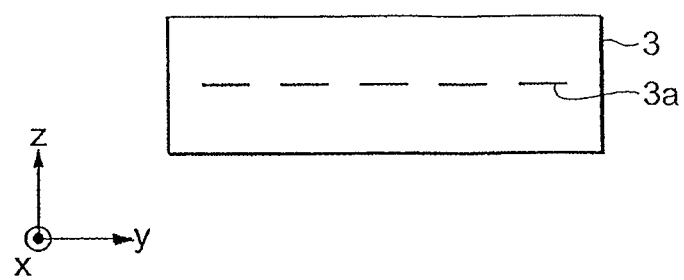
FIG. 4A is an illustration showing a front end face (light output surface) of a semiconductor laser array, and FIG. 4B an illustration showing a front end face of an active layer.

FIG. 3 is a perspective view showing a configuration of the semiconductor laser array 3 applied to the semiconductor laser apparatus 100 of the first embodiment. The semiconductor laser array 3 has a plurality of active layers 3a arrayed in parallel along the y-axis direction (longitudinal direction). Beams of laser light are emitted along the optical axis A from the respective active layers 3a. Here the optical axis A is an axis that is parallel to the x-axis and that passes the center of active layer 3a. FIG. 4A is an illustration showing a front end face (light output surface) of the semiconductor laser array 3, and FIG. 4B an illustration showing a front end face of an active layer 3a. The semiconductor laser array 3 has a structure in which active layers 3a are aligned at intervals of 500 μm and in the y-axis direction in the width of 1 cm. A cross section of each active layer 3a has the width of 100 μm and the thickness of 1 μm.

Figure 5:
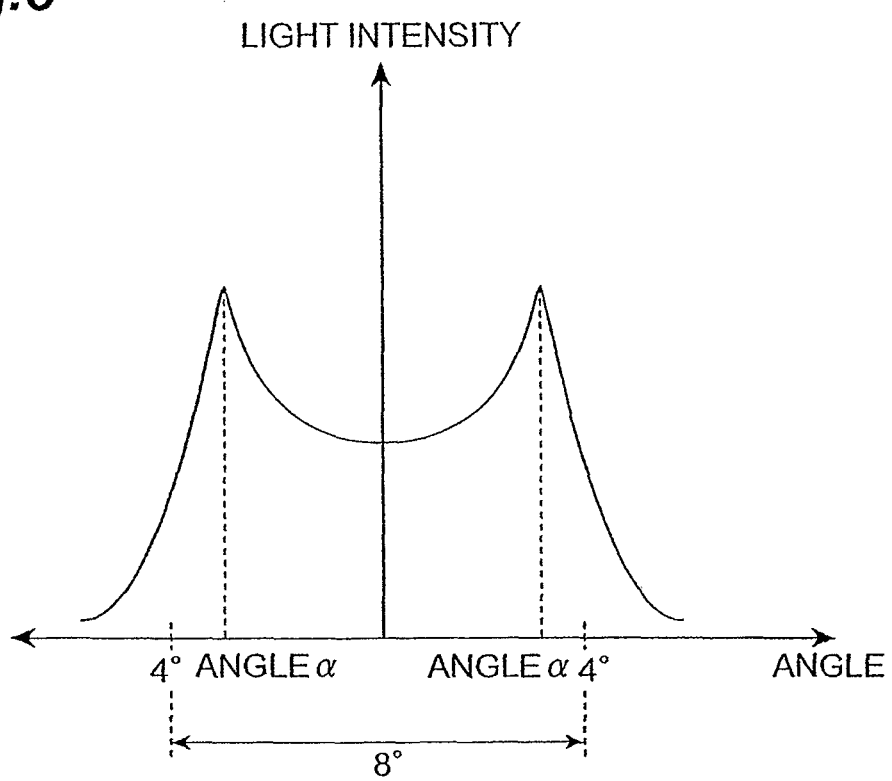
FIG. 5 is a light intensity distribution in the horizontal direction (y-axis direction) of output light from a semiconductor laser array applied to the semiconductor laser apparatus of the first embodiment.

A beam L1 of laser light emitted from one active layer 3a has the divergence angle of about 30° in the z-axis direction and about 8° in the y-axis direction with a center on the optical axis A. FIG. 5 is a light intensity distribution in the y-axis direction of the beam L1 emitted from the active layer 3a. The horizontal axis of this graph represents the angle from the optical axis A, and the vertical axis the light intensity of the laser beam. As seen from this FIG. 5, the intensity distribution is not a Gaussian distribution and has peaks at angle α. Namely, the beam component emitted into directions at angle α has the strongest light intensity in the beam emitted from each active layer 3a.

FIG. 6 is a perspective view showing a configuration of the first collimator lens 5 applied to the semiconductor laser apparatus 100 of the first embodiment. This first collimator lens 5 has the length of 0.4 mm along the x-axis direction, the length of 12 mm along the y-axis direction, and the length of 0.6 mm along the z-axis direction. The first collimator lens 5 is of an elongated shape along the y-axis direction. The front and back lens surfaces of the first collimator lens 5 are cylindrical surfaces with a generatrix along the y-axis direction.

The first collimator lens 5 has no refracting action in the plane including the generatrix direction, but has the refracting action in the plane perpendicular to the generatrix. Since the beam emitted from each active layer 3a has the large divergence angle in the vertical direction (z-axis direction) as described above, it is necessary to suppress the divergence of the beam by making use of the refracting action of the first collimator lens 5, in order to increase the efficiency of collection of the beam. The first collimator lens 5 and the semiconductor laser array 3 are set in such a positional relation that the generatrix of the first collimator lens 5 is perpendicular to the vertical direction of the semiconductor laser array 3 (z-axis direction). By this setup, the beam emitted from the active layer 3a can be refracted in the plane perpendicular to the generatrix of the first collimator lens 5 to be collimated. Namely, the first collimator lens 5 refracts the components in the vertical direction (z-axis direction) of the beam emitted from each active layer 3a, to collimate the beam. For achieving efficient collimation, the first collimator lens 5 is located in the vicinity of the active layers 3a. All the beams emitted from the active layers 3a of the semiconductor laser array 3 are incident to one first collimator lens 5.

Figure 7:
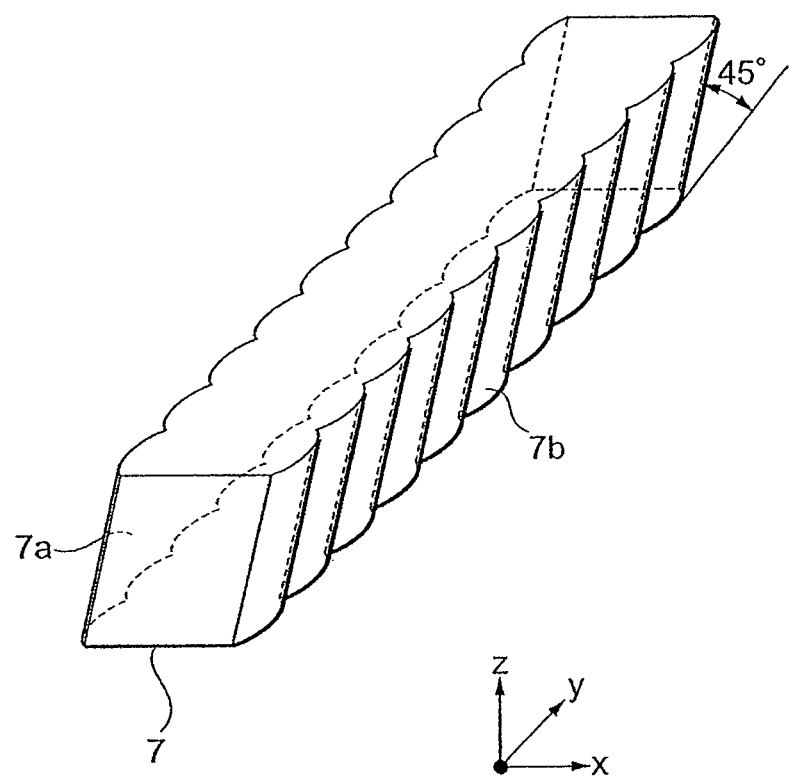
FIG. 7 is a perspective view showing a configuration of a path rotator applied to the semiconductor laser apparatus of the first embodiment.

FIG. 7 is a perspective view showing a configuration of the path rotator 7 applied to the semiconductor laser apparatus 100 of this first embodiment. The path rotator 7 is made of an optically transparent material such as glass or quartz. The length in the x-axis direction is 1.5 mm, the length in the y-axis direction 12 mm, and the length in the z-axis direction 1.5 mm. Thus the path rotator 7 has an elongated shape along the y-axis direction.

The path rotator 7 rotates the transverse section of each beam collimated by the first collimator lens 5, by about 90°. All the beams emitted from the first collimator lens 5 are incident to the path rotator 7. The path rotator 7 has an input surface 7a and an output surface 7b facing each other. This input surface 7a has a plurality of cylindrical surfaces with the width of 0.5 mm arranged in parallel. These cylindrical surfaces extend at the angle of 45° relative to the y-axis direction. The number of these cylindrical surfaces is equal to the number of active layers 3a in the semiconductor laser array 3. Namely, these cylindrical surfaces are in one-to-one correspondence to the active layers 3a. Similarly, the output surface 7b also has a plurality of cylindrical surfaces with the width of 0.5 mm arranged in parallel. These cylindrical surfaces also extend at the angle of 45° relative to the y-axis direction. These cylindrical surfaces are also in one-to-one correspondence to the active layers 3a. Therefore, the beams emitted from the respective active layers 3a of the semiconductor laser array 3 are incident all to one corresponding path rotator 7.

Other examples of the path rotator are described in aforementioned Document 1.

Figure 8:
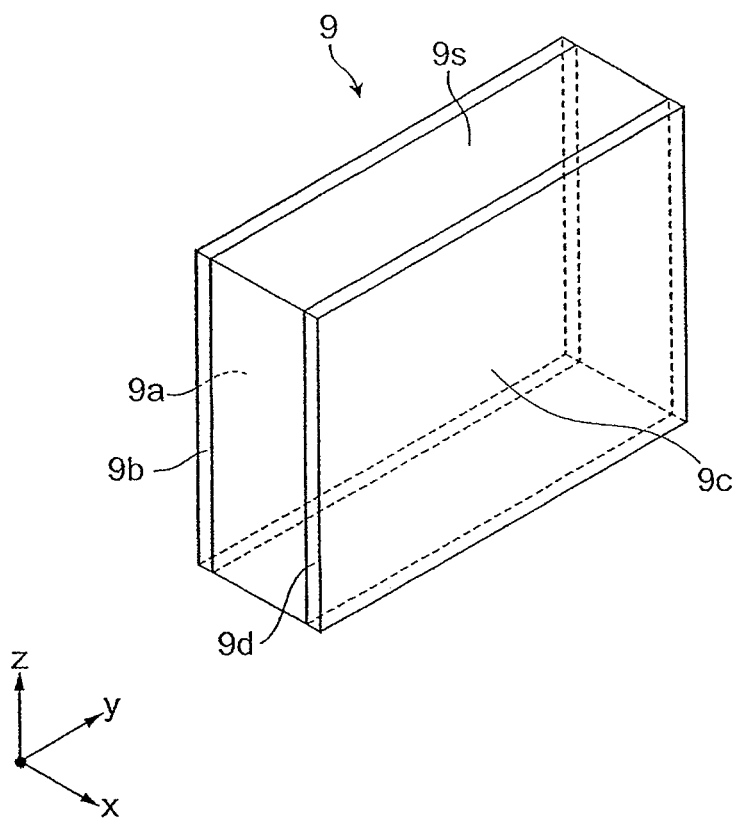
FIG. 8 is a perspective view showing a configuration of an optical element applied to the semiconductor laser apparatus of the first embodiment.

FIG. 8 is a perspective view showing a configuration of the reflecting mirror 9 which is an optical element applied to the semiconductor laser apparatus of the first embodiment. The reflecting mirror 9 has a substrate 9s of rectangular parallelepiped shape made of an optically transparent material such as glass or quartz, and has a reflecting surface 9a and an output surface 9c facing each other. The reflecting surface 9a is provided with a reflecting film 9b and the reflecting surface 9a reflects a part of each beam from the path rotator 7. The reflecting film 9b has the reflectance of several % to several ten %. A beam not reflected but transmitted by the reflecting surface 9a passes through the substrate 9s and emerges from the output surface 9c. The output surface 9c is provided with an AR coat 9d so that the beam transmitted by the substrate 9s is transmitted without being reflected by the output surface. The reflecting mirror 9 is installed so that the reflecting surface 9a is perpendicular to the x-axis direction. The dimensions of the reflecting mirror 9 are the length of 1-2 mm in the x-axis direction, the length of 12-15 mm in the y-axis direction, and the length of 1-5 mm in the z-axis direction.

Figure 9C:
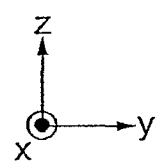
FIG. 9A shows transverse sections (output patterns) upon output of light generated in active layers, FIG. 9B transverse sections of beams after passage through the first collimator lens, and FIG. 9C transverse sections of the beams after passage through the path rotator.

Subsequently, the operation of semiconductor laser apparatus 100 will be described using FIGS. 2A-2B and FIGS. 9A-9C. FIG. 9A shows the transverse sections (output patterns) upon emission of light generated in the active layers 3a, FIG. 9B the transverse sections of the beams after passage of the beams emitted from the active layers 3a, through the first collimator lens 5, and FIG. 9C the transverse sections of the beams after passage of the beams transmitted by the first collimator lens 5, through the path rotator 7.

Figure 4B:
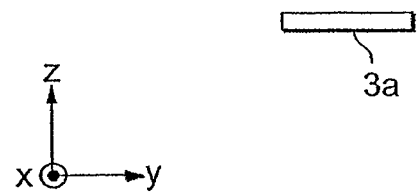

First, the active layers 3a of the semiconductor laser array 3 emit their respective beams L1 into the x-axis direction. Each beam L1 has the divergence angle of 8° in the y-axis direction and the divergence angle of 30° in the z-axis direction with the center on the optical axis A (FIG. 9A). The vertical length of the transverse section of each active layer 3a is one hundredth of the horizontal length (FIGS. 4A and 4B). Therefore, the transverse section of each beam is elongated in the horizontal direction upon emission from the active layer 3a. The beam emitted from the active layer 3a somewhat diffuses before arrival at the first collimator lens 5, but the vertical length of the transverse section of the beam can be controlled to double or less of the horizontal length. Namely, the transverse section of each beam incident to the first collimator lens 5 also has a horizontally elongated shape.

Next, the beams L1 are incident to the first collimator lens 5. The first collimator lens 5 refracts the beams L1 in the plane perpendicular to the y-axis (i.e., a plane parallel to the xz plane) to output beams L2 into the x-axis direction. The beams L2 have the divergence angle of approximately 0° in the z-axis direction and are not subjected to refraction in the z-axis direction; therefore, the beams are nearly parallel beams (FIG. 9B). Since the first collimator lens 5 has no refracting action in the plane including the y-axis, the divergence angle in the y-axis direction is 8° as in the case of the beams L1 with 8°.

Next, the beams L2 are incident to the path rotator 7 before adjacent beams intersect with each other. The path rotator 7 rotates the transverse sections of the beams L2 by about 90° and outputs beams L3 into the x-axis direction. The beams collimated in the vertical direction are converted here into beams collimated in the horizontal direction. This makes the transverse sections of the beams long in the vertical direction and short in the horizontal direction (FIG. 9C). Since the beams L3 result from the rotation of the transverse sections of the beams L2 by about 90°, the directions of the divergence angles in the beams L2 are also rotated by about 90°. Namely, the beams L3 are nearly parallel light in the y-axis direction and have the divergence angle of 8° in the z-axis direction. Since the beams are nearly parallel light in the y-axis direction, the adjacent beams L3 can be prevented from intersecting with each other.

Next, the beams L3 are incident to the reflecting mirror 9. The beams L3 are reflected at the reflectance of several % to several ten % on the reflecting surface 9a to emerge as beams L5, and the rest is transmitted by the reflecting mirror 9. A partial beam L31 incident to the vicinity of intersection 9x between the optical axis A and the reflecting surface 9a in each beam L3 is reflected by the reflecting surface 9a to become a beam L51. Since the beam L31 is a beam incident nearly perpendicularly to the reflecting surface 9a, it is reflected as a beam L51 into the almost opposite direction on the reflecting surface 9a. Each beam L51 returns in the right opposite direction to the optical path from the active layer 3a to the reflecting surface 9a and comes back to the active layer 3a of the semiconductor laser array 3. The beam L51 further travels to an end face 3b facing the end face from which the laser light of the semiconductor laser array 3 is emitted. The beam arriving at the end face 3b is reflected on the end face 3b and is emitted again from the active layer 3a into the x-axis direction. The emitted beam travels again through the aforementioned optical path to the reflecting surface 9a and only a part incident to the vicinity of the intersection 9x in the beam arriving at the reflecting surface 9a returns in the opposite direction again through the optical path to the end face 3b. As the partial beam travels back and forth between the reflecting surface 9a and the end face 3b (in the external resonator) as described above, the light intensity is amplified. Part of the amplified light passes through the reflecting surface 9a to be finally outputted as beams L4.

In the semiconductor laser apparatus 100 of the first embodiment, as described above, the beam whose light intensity is to be amplified in the beam emitted from each active layer 3a is only the beam L31 incident at angles near 90° (incident to the vicinity of intersection 9x) to the reflecting surface 9a in the beam L3 incident to the reflecting surface 9a, and the other beam part is not subjected to the amplification as described above. Namely, only the beam with small angles relative to the optical axis A like the beam L31 satisfies the amplification condition, and is selectively amplified by the external resonator. Accordingly, the emitted beams L4 are beams resulting from the selective amplification of components with small angles to the optical axis A.

For this reason, each beam L4 (i.e., the laser light finally emitted from the semiconductor laser apparatus 100) includes an increased amount of beam components with an extremely small divergence angle, and the light intensity distribution of the beam L4 is that as shown in FIG. 10. The horizontal axis of FIG. 10 represents the angle from the optical axis A and the vertical axis the light intensity of the laser beam. When compared with the light intensity distribution of the beam emitted from the active layer 3a (cf. FIG. 5), the distribution has only one peak and the peak is sharper. In other words, the laser light emitted from the semiconductor laser apparatus 100 has the smaller divergence angle. This divergence angle differs depending upon various conditions such as the size of the active layers, but, in the case of the above semiconductor laser apparatus 100, it is approximately 2°, which is smaller than the divergence angle of 8° of the beams emitted from the active layers 3a.

Second Embodiment

FIG. 11A is a plan view (a view from the z-axis direction) showing a configuration of the second embodiment of the semiconductor laser apparatus according to the present invention, and FIG. 11B a side view thereof (a view from the y-axis direction).

The semiconductor laser apparatus 100 of the first embodiment has the reflecting mirror 9 installed so that the reflecting surface 9a is perpendicular to the x-axis direction, whereas the semiconductor laser apparatus 110 has the reflecting mirror 9 installed so that the reflecting surface 9a is inclined relative to the plane perpendicular to the optical axis A (a plane parallel to the yz plane). The reflecting surface 9a, as shown in figures, is inclined so that a normal to the reflecting surface 9a is kept in parallel with the xz plane, and the angle of inclination is θ. The configuration of the semiconductor laser apparatus 110 of the second embodiment except for this difference is the same as the configuration of the semiconductor laser apparatus 100 of the aforementioned first embodiment and is thus omitted from the description herein.

Figure 12:
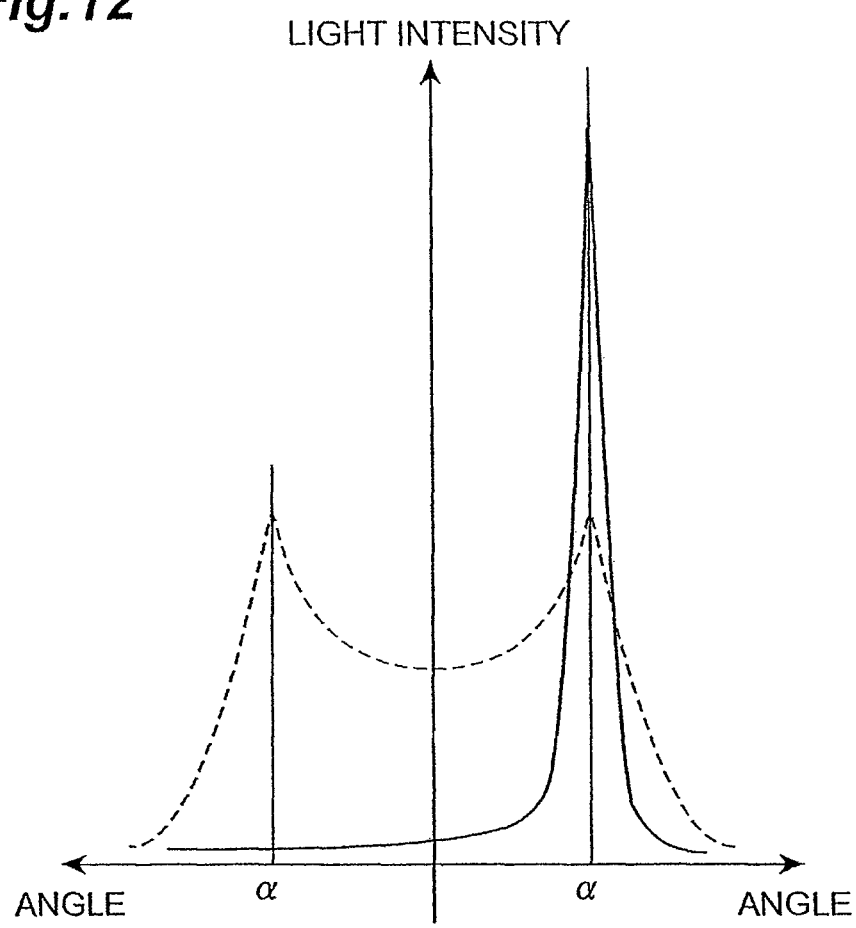
FIG. 12 is a light intensity distribution in the horizontal direction (y-axis direction) of output light from a semiconductor laser array applied to the semiconductor laser apparatus of the second embodiment.

The angle θ thus set will be described with reference to FIGS. 11A, 11B and 12. In FIG. 12, the horizontal axis of the graph represents the angle from the optical axis A and the vertical axis the light intensity of the laser beam. A dashed line represents a light intensity distribution of a beam emitted from an active layer 3a. The light intensity distribution in the y-axis direction of the beam emitted from the active layer 3a of the semiconductor laser array 3 has peaks in the directions at the angle α as described above. Namely, the beam Lm emitted near the direction of angle α has the largest light intensity. The beam Lm, after emitted from the active layer 3a, travels through the optical path of Lm indicated by a thick line in each of FIGS. 11A and 11B, to the reflecting surface 9a. Since the angle θ herein is set to θ=α, the beam Lm is incident vertically to the reflecting surface 9a and is reflected into the right opposite direction, whereby the beam Lm at the position distant from the optical axis A can be returned to the active layer 3a in the semiconductor laser array 3. For this reason, the beam Lm satisfies the amplification condition.

Each beam emitted from the semiconductor laser array 3 has the peaks of light intensity in the directions of angle α different from the direction of the optical axis A, but the semiconductor laser apparatus 110 permits the angle θ of inclination of the reflecting surface 9a to be so set that the beam Lm emitted at the angle α from the active layer 3a can satisfy the amplification condition. Therefore, the semiconductor laser apparatus 110 is able to select the beam at the peak of light intensity to effect such resonance as to amplify the beam, and thus to emit the laser light with stronger light intensity. The solid line in FIG. 12 indicates the light intensity distribution of the beam emitted from the semiconductor laser apparatus 110.

Third Embodiment

FIG. 13A is a plan view (a view from the z-axis direction) showing a configuration of the third embodiment of the semiconductor laser apparatus according to the present invention, and FIG. 13B a side view thereof (a view from the y-axis direction).

In the semiconductor laser apparatus 120 of the third embodiment, a second collimator lens 8 is installed between the path rotator 7 and the reflecting mirror 9. The configuration of the semiconductor laser apparatus 120 of the third embodiment except for this difference is the same as the configuration of the semiconductor laser apparatus 100 of the aforementioned first embodiment and thus is omitted from the description herein.

FIG. 14 is a perspective view showing a configuration of the second collimator lens 8 applied to the semiconductor laser apparatus 120 of the third embodiment. The front and back lens surfaces of the second collimator lens 8 are cylindrical surfaces with a generatrix along the y-axis direction. The second collimator lens 8 has no refracting action in the plane including the generatrix direction, but has the refracting action in the plane normal to the generatrix. As shown in FIG. 14, the length in the generatrix direction, i.e., in the y-axis direction is 12 mm, the length in the x-axis direction 0.5-3 mm, and the length in the z-axis direction 1.5-10 mm. The beams emerging from the path rotator 7 are incident all to the second collimator lens 8. The second collimator lens 8 is installed so that the generatrix thereof is perpendicular to the z-axis direction. Since the second collimator lens 8 is installed in this manner, it is able to refract the beams emerging from the path rotator 7, in the plane perpendicular to the generatrix of the second collimator lens 8, so as to make them closer to parallel light.

In the semiconductor laser apparatus 120 of the third embodiment, the second collimator lens 8 is able to refract the laser light transmitted by the path rotator 7 so that the laser light becomes closer to parallel light in the plane perpendicular to the longitudinal direction. This also makes it feasible to increase the distance between the path rotator 7 and the reflecting mirror 9 and thus to offer greater degree of freedom of design for the semiconductor laser apparatus 120.

In the semiconductor laser apparatus 120 of the third embodiment, the reflecting mirror 9 may also be installed so that the reflecting surface 9a is inclined relative to the plane normal to the optical axis A. By properly setting this inclination angle, it is feasible to select and resonate the beam at the peak light intensity to effect amplification thereof and it is thus feasible to output the beam with greater light intensity.

Fourth Embodiment

Figure 15A:
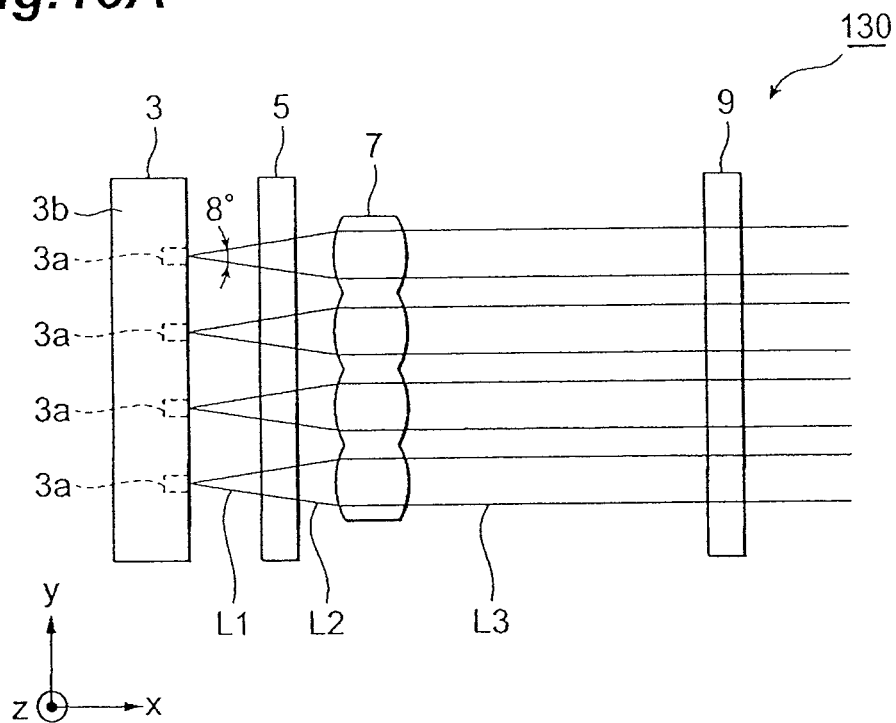
FIG. 15A is a plan view showing a configuration of the fourth embodiment of the semiconductor laser apparatus according to the present invention, and FIG. 15B a side view thereof.
Figure 15B:
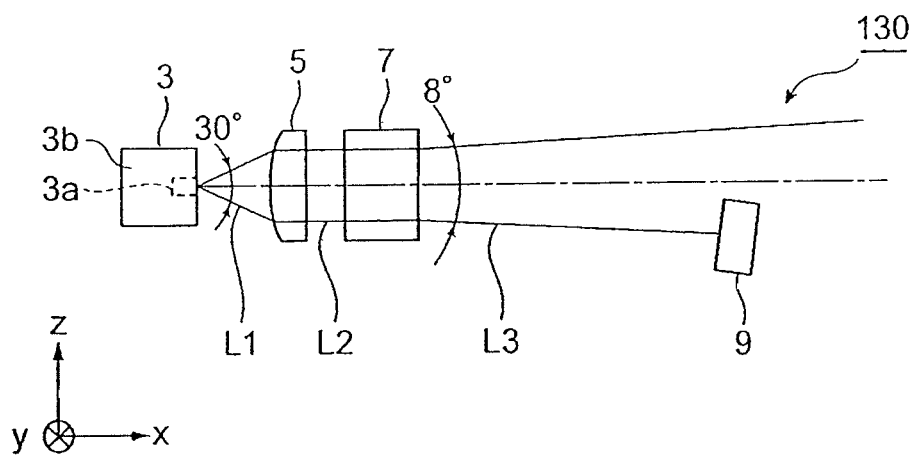

FIG. 15A is a plan view (a view from the z-axis direction) showing a configuration of the fourth embodiment of the semiconductor laser apparatus according to the present invention, and FIG. 15B a side view thereof (a view from the y-axis direction).

In the semiconductor laser apparatus 130 of the fourth embodiment, different from the semiconductor laser apparatus 100 of the first embodiment, the reflecting mirror 9 as an optical element is located at a position deviating from the optical axes of the beams emitted from the active layers 3a of the semiconductor laser array 3 and is arranged so that the beams are incident perpendicularly to the reflecting surface of the reflecting mirror 9. The configuration of the semiconductor laser apparatus 130 except for this difference is the same as the configuration of the semiconductor laser apparatus 100 and is omitted from the description herein.

Fifth Embodiment

FIG. 16A is a plan view (a view from the z-axis direction) showing a configuration of the fifth embodiment of the semiconductor laser apparatus according to the present invention, and FIG. 16B a side view thereof (a view from the y-axis direction).

The semiconductor laser apparatus 140 of the fifth embodiment has a semiconductor laser array stack 4, first collimator lenses 5, path rotators 7, and a reflecting mirror 9 as an optical element.

Figure 17:
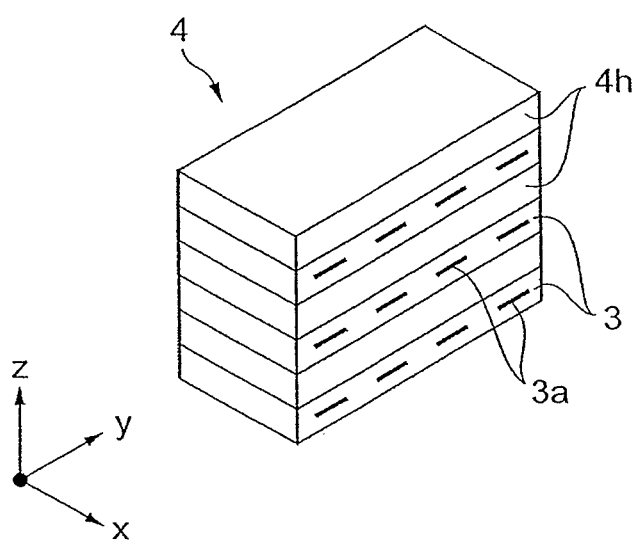
FIG. 17 is a perspective view showing a structure of a semiconductor laser array stack.

FIG. 17 is a perspective view showing a configuration of the semiconductor laser array stack 4 applied to the semiconductor laser apparatus 140 of the fifth embodiment. The semiconductor laser array stack 4, as shown in FIG. 17, has a structure in which a plurality of semiconductor laser arrays 3 and a plurality of heat sinks 4h are alternately arranged along the z-axis direction.

The heat sinks 4h cool the semiconductor laser arrays 3. The heat sinks 4h have a cooling water path formed by combining copper members of flat plate shape. Cooling water circulates in this cooling water path.

In this fifth embodiment, each first collimator lens 5 has the same configuration as the first collimator lens 5 in the semiconductor laser apparatus 100 of the aforementioned first embodiment (FIG. 6). The first collimator lens 5 is installed so that the generatrix of the first collimator lens 5 is perpendicular to the vertical direction of the semiconductor laser array 3 (z-axis direction). When the first collimator lens 5 is installed in this manner, it is able to refract the beams emitted from the active layers 3a, in the plane perpendicular to the generatrix of the first collimator lens 5 to collimate them. Namely, the first collimator lens 5 refracts the vertical component (in the z-axis direction) of the beam emitted from each active layer 3a to collimate it. For achieving efficient collimation, each first collimator lens 5 is located in the vicinity of the active layers 3a. For this reason, the first collimator lenses 5 are in one-to-one correspondence to the semiconductor laser arrays 3. Namely, the number of first collimator lenses 5 installed is equal to the number of semiconductor laser arrays 3. Each first collimator lens 5 is arranged so as to face one semiconductor laser array 3. Therefore, the beams emitted from the active layers 3a of one semiconductor laser array 3 are incident all to one first collimator lens 5.

Similarly, each path rotator 7 has the same configuration as the path rotator 7 of the semiconductor laser apparatus 100 of the aforementioned first embodiment (FIG. 7). The path rotator 7 rotates the transverse sections of the beams collimated by the first collimator lens 5, by about 90°. For this reason, the path rotators 7 are arranged in one-to-one correspondence to the first collimator lenses 5. Namely, each path rotator 7 is arranged to face one first collimator lens 5. Therefore, all the beams emitted from one first collimator lens 5 are incident to one corresponding path rotator 7. The cylindrical surfaces of each path rotator 7 are in one-to-one correspondence to the active layers 3a. Therefore, the beams emitted from the respective active layers 3a of one semiconductor laser array 3 are incident all to one corresponding path rotator 7.

The reflecting mirror 9 also has the same configuration as the reflecting mirror 9 of the semiconductor laser apparatus 100 of the aforementioned first embodiment (FIG. 8). The reflecting mirror 9 is installed so that its reflecting surface 9a is perpendicular to the x-axis direction. The dimensions of the reflecting mirror 9 are the length of 1-2 mm in the x-axis direction, the length of 12-15 mm in the y-axis direction, and the length in the z-axis direction 1-5 mm longer than the length in the z-axis direction of the semiconductor laser array stack 4. The reflecting mirror 9 is arranged so that all the beams emitted from the respective semiconductor laser arrays 3 are incident to the reflecting mirror 9.

In the semiconductor laser apparatus 140 of the fifth embodiment, the beam whose light intensity is to be amplified in the beam emitted from each active layer 3a is only the beam L31 incident at angles nearly perpendicular to the reflecting surface 9a in the beam L3 incident to the reflecting surface 9a, and the other beam part is not subjected to the amplification as described above. Namely, only the beam with the small angles to the optical axis A like the beam L31 satisfies the amplification condition to be selectively amplified by the external resonator. Therefore, the emitted beams L4 are beams resulting from the selective amplification of the components with small angles to the optical axis A.

For this reason, each beam L4 (i.e., the laser light finally emitted from the semiconductor laser apparatus 140) includes an increased amount of beam components with an extremely small divergence angle, and the light intensity distribution of the beam L4 is one similar to FIG. 10. When compared with the light intensity distribution of the beam emitted from the active layer 3a (cf. FIG. 5), the light intensity distribution of the beam L4 has only one peak and the peak is sharper. In other words, the laser light emitted from the semiconductor laser apparatus 140 has the smaller divergence angle. The divergence angle differs depending upon various conditions such as the size of the active layers, but, in the case of the semiconductor laser apparatus 140, the divergence angle is approximately 2°, which is smaller than the divergence angle of 8° of the beams emitted from the active layers 3a.

Figure 18A:
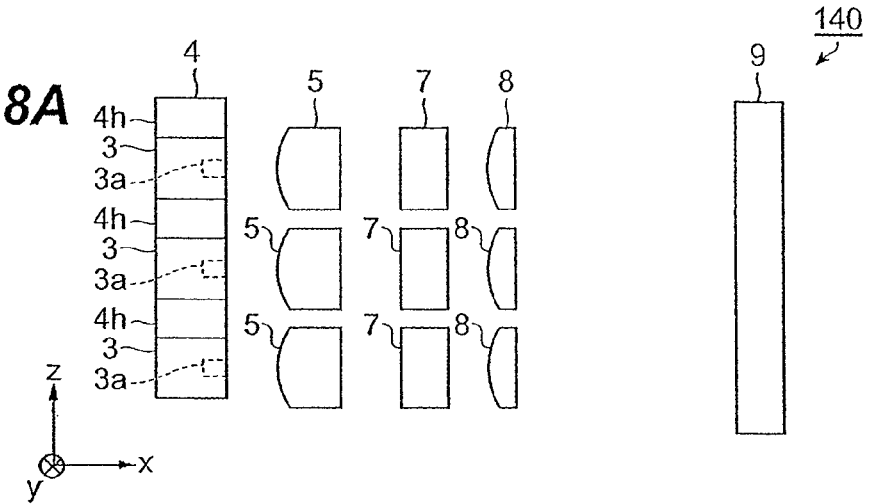
FIGS. 18A to 18C are side views showing modifications of the semiconductor laser apparatus according to the fourth embodiment.
Figure 18B:
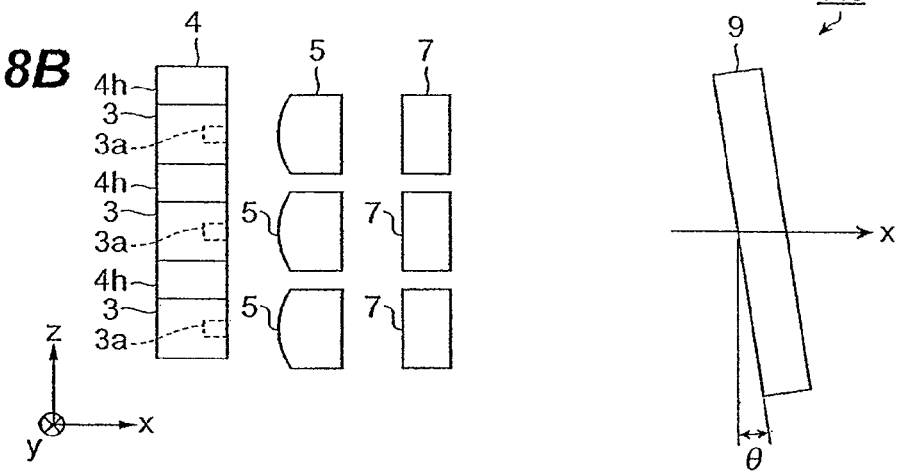
Figure 18C:
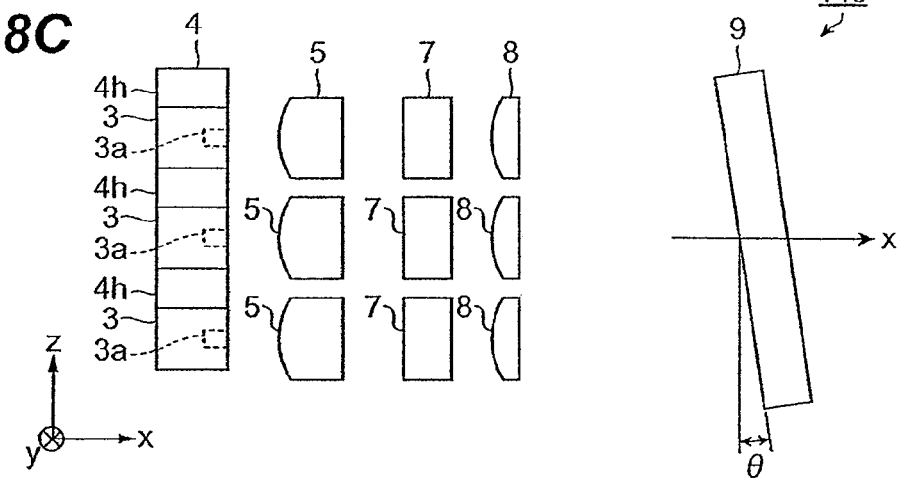

The present invention can be modified in various ways without being limited to the above-described embodiments. For example, FIGS. 18A to 18C are side views showing configurations of modifications of the semiconductor laser apparatus 140 according to the fifth embodiment. The semiconductor laser apparatus 140 may be arranged so that a second collimator lens 8 is installed between each path rotator 7 and the reflecting mirror 9, as shown in FIG. 18A. This second collimator lens 8 has the same configuration as the second collimator lens 8 of the semiconductor laser apparatus 120 of the aforementioned third embodiment (FIG. 14). When the second collimator lenses 8 are arranged in this manner, the laser light transmitted by the path rotators 7 can be refracted by the second collimator lenses 8 so as to become closer to parallel light in the plane normal to the longitudinal direction. Then this also makes it feasible to increase the distance between the path rotators 7 and the reflecting mirror 9, and thus to offer greater degree of freedom of design for the semiconductor laser apparatus 140.

The semiconductor laser apparatus 140 may have the reflecting mirror 9 arranged so that the reflecting surface 9a is inclined relative to the plane normal to the x-axis, as shown in FIG. 18B. By properly setting this inclination angle, it is feasible to select and resonate the beams at the peak light intensity to amplify it, and to emit the beams with greater light intensity.

Furthermore, the semiconductor laser apparatus 140 may have a second collimator lens 8 between each path rotator 7 and the reflecting mirror 9 and have the reflecting mirror 9 arranged so that the reflecting surface 9a is inclined to the plane normal to the x-axis, as shown in FIG. 18C. This configuration makes it feasible to offer greater degree of freedom of design for the semiconductor laser apparatus 140 and to emit the beams with greater light intensity.

Sixth Embodiment

FIG. 19A is a plan view showing a configuration of the sixth embodiment of the semiconductor laser apparatus according to the present invention, and FIG. 19B a side view thereof. The semiconductor laser apparatus 150 of the sixth embodiment has a semiconductor laser array 3, a first collimator lens 5, a path rotator 7, and a reflecting mirror (optical element) 9.

The semiconductor laser array 3 has a structure similar to that in the first embodiment (FIG. 3). The semiconductor laser array 3 has a plurality of active layers 3a arrayed in parallel along the y-axis direction (longitudinal direction). The active layers 3a emit their respective beams of laser light along the optical axis A. Here the optical axis A is an axis being parallel to the x-axis and passing the center of each active layer 3a. The front end face (light output surface) of the semiconductor laser array 3 has a structure similar to that in FIG. 4A and the front end face of each active layer 3a has a structure similar to that in FIG. 4B. The semiconductor laser array 3 has the structure in which the active layers 3a are aligned at intervals of 500 µm in the y-axis direction in the width of 1 cm. A cross section of each active layer 3a has the width of 100 µm and the thickness of 1 µm. The front end face of the semiconductor laser array 3 is coated with a reflecting film having the reflectance of not more than several %.

Figure 20:
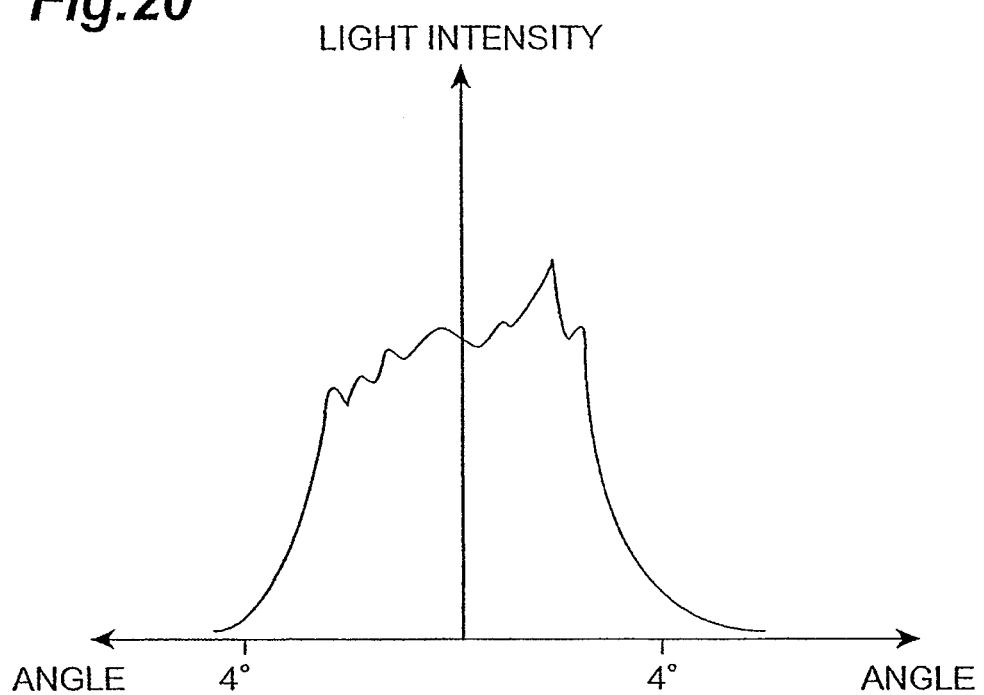
FIG. 20 is a light intensity distribution in the horizontal direction (y-axis direction) of output light from a semiconductor laser array applied to the semiconductor laser apparatus of the sixth embodiment.

A beam L1 of laser light emitted from one active layer region 3a has the divergence angle of about 30° in the z-axis direction and the divergence angle of about 8° in the y-axis direction with the center on the optical axis A. FIG. 20 is a light intensity distribution in the y-axis direction of the beam L1 emitted from the active layer 3a. The horizontal axis of the graph indicates the angle from the optical axis A and the vertical axis the light intensity of the laser beam. As shown in this FIG. 20, the intensity distribution is not a Gaussian distribution but an irregular distribution.

The structure of the first collimator lens 5 is similar to that in the first embodiment (FIG. 6). The dimensions of the first collimator lens 5 are the length of 0.4 mm in the x-axis direction, the length of 12 mm in the y-axis direction, and the length of 0.6 mm in the z-axis direction. The first collimator lens 5 is of an elongated shape along the y-axis direction. The front and back lens surfaces of the first collimator lens 5 are cylindrical surfaces with a generatrix along the y-axis direction.

The first collimator lens 5 has no refracting action in the plane including the generatrix direction (y-axis direction) but has the refracting action in the plane normal to the generatrix. Since the beams emitted from the active layers 3a have the large divergence angle in the vertical direction, it is necessary to suppress the divergence of the beams by use of the refracting action, in order to increase the efficiency of collection of the beams. The first collimator lens 5 and the semiconductor laser array 3 are set in such a positional relation that the generatrix of the first collimator lens 5 is perpendicular to the vertical direction (z-axis direction) of the semiconductor laser array 3. By this setup, it is feasible to refract the beams emitted from the active layers 3a, in the plane normal to the generatrix of the first collimator lens 5 to collimate the beams. Namely, the first collimator lens 5 refracts and collimates the component in the vertical direction (z-axis direction) of the beam emitted from each active layer 3a. For efficient collimation, the first collimator lens 5 is placed in the vicinity of the active layers 3a. The beams emitted from the active layers 3a in the semiconductor laser array 3 are incident all to one first collimator lens 5.

The path rotator 7 has a structure similar to that in the first embodiment (FIG. 7). The path rotator 7 is made of an optically transparent material such as glass or quartz. The length in the x-axis direction is 1.5 mm, the length in the y-axis direction 12 mm, and the length in the z-axis direction 1.5 mm. As described, the path rotator 7 is of an elongated shape along the y-axis direction.

The path rotator 7 rotates the transverse sections of the beams collimated by the first collimator lens 5, by about 90°. All the beams emitted from the first collimator lens 5 are incident to the path rotator 7. The path rotator 7 has an input surface 7a and an output surface 7b facing each other. This input surface 7a has a plurality of cylindrical surfaces with the width of 0.5 mm arranged in parallel. These cylindrical surfaces extend at the angle of 45° relative to the y-axis direction. The number of these cylindrical surfaces is equal to the number of active layers 3a in the semiconductor laser array 3. Namely, these cylindrical surfaces are in one-to-one correspondence to the active layers 3a. Similarly, the output surface 7b also has a plurality of cylindrical surfaces with the width of 0.5 mm arranged in parallel. These cylindrical surfaces also extend at the angle of 45° relative to the y-axis direction. These cylindrical surfaces are also in one-to-one correspondence to the active layers 3a. Accordingly, the beams emitted from the respective active layers 3a in the semiconductor laser array 3 are incident all to one corresponding path rotator 7.

Other examples of the path rotator are described in aforementioned Document 1.

Figure 21:
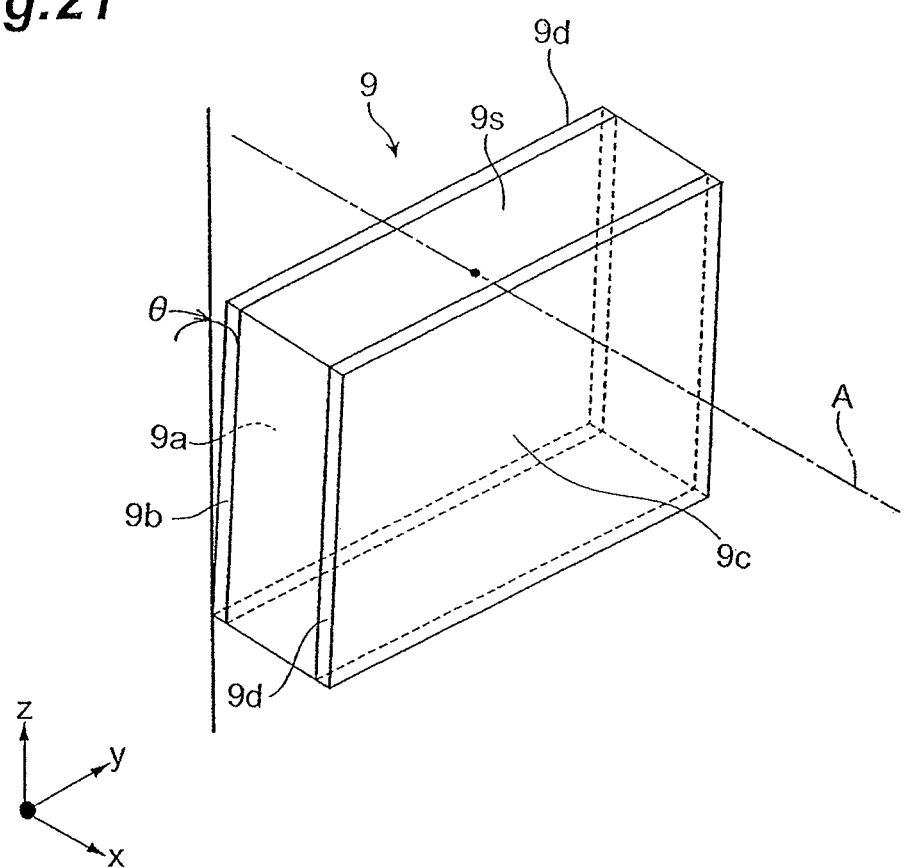
FIG. 21 is a perspective view showing a configuration of a reflecting mirror applied to the semiconductor laser apparatus of the sixth embodiment.

FIG. 21 is a perspective view showing the structure of the reflecting mirror 9 as an optical element applied to the semiconductor laser apparatus 150 of the sixth embodiment. The reflecting mirror 9 has a substrate 9s of rectangular parallelepiped shape made of an optically transparent material such as glass or quartz, and has a reflecting surface 9a. The reflecting surface 9a is provided with a reflecting film 9b and the reflecting surface 9a totally reflects the beams from the path rotator 7. The reflecting film 9b has the reflectance of not less than 99.5%. The reflecting mirror 9 crosses a portion of the optical path of each beam emitted from the path rotator 7. The reflecting mirror 9 is provided so that the edge 9d of the reflecting film 9a is parallel to the y-axis; therefore, the beams on the −z side (the lower side in FIG. 19B) with respect to the edge 9d are incident to the reflecting surface 9a, while the beams on the +z side (the upper side in FIG. 19B) with respect to the edge 9d are not incident to the reflecting surface 9a to be outputted to the outside. Since the reflecting surface 9a is located so as to cross the optical axis A of each beam emitted from the path rotator 7, the cross section of each incident beam is larger than that of the beam not incident to the reflecting surface 9a.

The reflecting mirror 9 is so inclined that the normal to the reflecting surface 9a is on the xz plane and that the angle between the reflecting surface 9a and the yz plane is angle θ. The inclination of the reflecting surface 9a is so set that the normal to the reflecting surface 9a extending toward the path rotator 7 is directed to the +z side, i.e., that the normal to the reflecting surface 9a extending toward the path rotator 7 is directed so as to become closer to the optical axis A on the path rotator 7 side. The angle θ is set to an angle smaller than a half of the divergence angle α (α/2) in the z-axis direction of the beams emitted from the path rotator 7, so that at least a part of each beam emitted from the path rotator 7 can be incident perpendicularly to the reflecting surface 9a. Each beam incident perpendicularly to the reflecting surface 9a is reflected on the reflecting surface 9a and returns in the opposite direction to the input path to come back to the active layer 3a. The dimensions of the reflecting mirror 9 are the length of 1-2 mm in the x-axis direction, the length of 12-15 mm in the y-axis direction, and the length of 0.8-1.4 mm in the z-axis direction.

Subsequently, the operation of the semiconductor laser apparatus 150 will be described with reference to FIGS. 19A-19B and FIGS. 9A-9C described in the first embodiment.

First, each beam L1 is emitted into the x-axis direction from the associated active layer 3a of the semiconductor laser array 3. The beam L1 has the divergence angle of 8° in the y-axis direction and the divergence angle of 30° in the z-axis direction with the center on the optical axis A (FIG. 9A). The vertical length of the transverse section of each active layer 3a is one hundredth of the horizontal length (FIG. 4A). Therefore, the transverse section of the beam is horizontally elongated upon emission from the active layer 3a. Even if the beam emitted from the active layer 3a is somewhat diffused before arrival at the first collimator lens 5, the vertical length of the transverse section of the beam can be controlled to double or less of the horizontal length. Namely, the transverse section of each beam incident to the first collimator lens 5 also has a horizontally elongated shape.

Next, each beam L1 is incident to the first collimator lens 5. The first collimator lens 5 refracts the beam L1 in the plane normal to the y-axis (the plane parallel to the xz plane) to output a beam L2 into the x-axis direction. The beam L2 has the divergence angle of about 0° in the z-axis direction and is not subjected to refraction in the y-axis direction (FIG. 9B). Since the first collimator lens 5 has no refracting action in the plane including the y-axis, the divergence angle in the y-axis direction is an angle similar to that of the beam L1.

Next, each beam L2 is incident to the path rotator 7 before adjacent beams intersect with each other. The path rotator 7 rotates the transverse section of each beam L2 by about 90° and outputs a beam L3 into the x-axis direction. Each beam collimated in the z-axis direction is converted here into a beam collimated in the y-axis direction. This changes the transverse section of each beam into a shape long in the z-axis direction and short in the horizontal direction (FIG. 9C). Since the beam L3 results from the rotation of the transverse section of the beam L2 by about 90°, the direction of the divergence angle of the beam L2 is also rotated by about 90°. Namely, each beam L3 is nearly parallel light in the y-axis direction and has the divergence angle in the z-axis direction. Since the beams L3 are nearly parallel light in the y-axis direction, it is feasible to prevent the adjacent beams L3 from intersecting with each other.

The reflecting mirror 9 is disposed ahead of the path rotator 7 in the traveling direction of each beam L3, and the reflecting mirror 9 is so located that the reflecting surface 9a crosses only a part of the optical path of the beam L3; therefore, each beam L3 emitted from the path rotator 7 is incident in part to the reflecting surface 9a and the rest part is not incident to the reflecting surface 9a. Let us divide the beam L3 into two beam components in the z-axis direction, and description hereinafter will be given using a beam L3r for the component incident to the reflecting surface 9a in the beam L3 and a beam L3t for the component not incident to the reflecting surface 9a.

The beam L3r emerges from the path rotator 7 to enter the reflecting surface 9a of the reflecting mirror 9. Since the light incident to the reflecting surface 9a is totally reflected, the beam L3r is reflected as a beam L5 at the reflectance of 99.5% or more (almost 100%) on the reflecting surface 9a. As described previously, the reflecting surface 9a is not vertical with respect to the optical axis A but inclined at the angle θ and the angle θ is set to a value smaller than a half of the divergence angle α (α/2) of the beam L3 outputted from the path rotator 7. For this reason, the beam L3r includes a beam incident nearly perpendicularly to the reflecting surface 9a, and the perpendicularly incident beam is reflected approximately into the right opposite direction. The reflected beam travels in the opposite direction through the optical path from the active layer 3a to the reflecting surface 9a to return to the active layer. The beam returning to the active layer 3a once comes back to the rear end face 3b of the semiconductor laser array 3 and further travels up to the output end face (front end face) from which the laser light is emitted from the semiconductor laser array 3. A part of the beam arriving at the output end face is reflected toward the rear end face 3b and travels again via the rear end face 3b to be outputted into the x-axis direction from the active layer 3a. A part of the emitted beam travels again through the aforementioned optical path to the reflecting surface 9a, and only a part incident nearly perpendicularly to the reflecting surface 9a in the beam arriving at the reflecting surface 9a again returns in the opposite direction through the optical path. As the part of the beam travels back and forth through the resonance path between the reflecting surface 9a and the output end face via the rear end face 3b (i.e., the resonance path consists of the path in which the light reflected on the reflecting surface 9a travels via the rear end face 3b to the output end face, and the path in which the light reflected from the output end face toward the interior of the active layer 3a travels via the rear end face 3b toward the reflecting surface 9a), the spatial transverse mode of laser light becomes closer to the single mode. On the other hand, the beam L3t is outputted from the path rotator 7, and is then outputted to the outside of the semiconductor laser apparatus 150, without entering the reflecting surface 9a of the reflecting mirror 9; therefore, the beam L3t is the final output light from the semiconductor laser apparatus 150.

As described above, the semiconductor laser apparatus 150 of this sixth embodiment has the resonance path including the optical path of the beam L3r and the output path including the optical path of the beam L3t. In the semiconductor laser apparatus 150, therefore, the spatial transverse mode becomes closer to the single mode through the resonance of the laser light generated in the semiconductor laser array 3, in the resonance path, whereby the laser light with the divergence angle reduced by virtue of the configuration to make the spatial transverse mode closer to the single mode can be outputted from the output path to the outside. Therefore, the semiconductor laser apparatus 150 is able to reduce the divergence angle of the final output light. Since the resonance path and the output path are separated by the position of the reflecting surface 9a, there is no need for use of a half mirror or the like for separation of the paths, and the reflecting surface 9a of total reflection is used. Therefore, the resultant light is stronger resonance light than in the case where the half mirror or the like is used to form the optical path of resonance light and the optical path of output light, and the output light is thus stronger.

Figure 22:
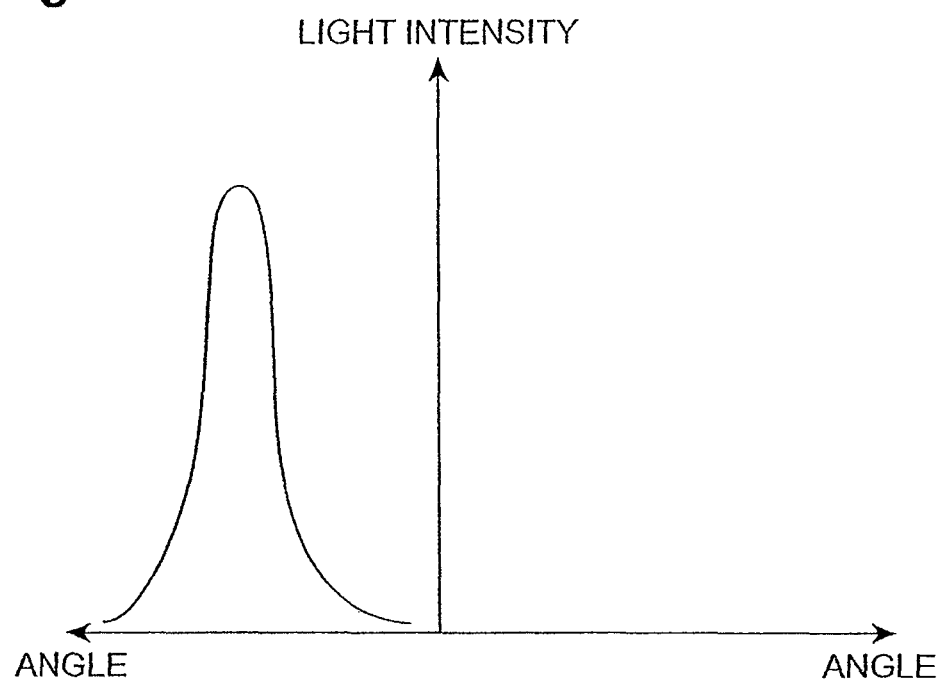
FIG. 22 is a light intensity distribution graph in the vertical direction (z-axis direction) of output light from the semiconductor laser apparatus of the sixth embodiment.

A light intensity distribution in the z-axis direction of the beam L3t is a distribution as shown in FIG. 22. When compared with the light intensity distribution of the beam emitted from the active layer 3a (cf. FIG. 20), the light intensity distribution of the beam L3t has only one peak and the peak is sharper. In other words, the laser light emitted from the semiconductor laser apparatus 150 has the reduced divergence angle. This divergence angle differs depending upon various conditions such as the size of the active layers, but, in the case of the semiconductor laser apparatus 150, the divergence angle is about 1°, which is smaller than the divergence angle of 8° of the beam emitted from the active layer 3a.

With change in the inclination angle θ of the reflecting mirror 9, the peak position and peak intensity of the intensity distribution will vary. In order to obtain the output light with higher intensity, the semiconductor laser apparatus 150 may be arranged in such a manner that the inclination angle of the reflecting mirror 9 to maximize the peak intensity is preliminarily determined and that the angle thus determined is set as the angle θ.

The semiconductor laser apparatus 150 of the sixth embodiment is configured to return a part of the beam emitted from the path rotator 7, to the active layer 3a by use of the planar reflecting surface as the reflecting surface 9a, but it is also possible to adopt a configuration wherein a concave reflecting surface to vertically totally reflect the entire beam incident from the path rotator 7 is used to return the entire reflected beam to the active layer 3a.

Seventh Embodiment

Figure 23A:
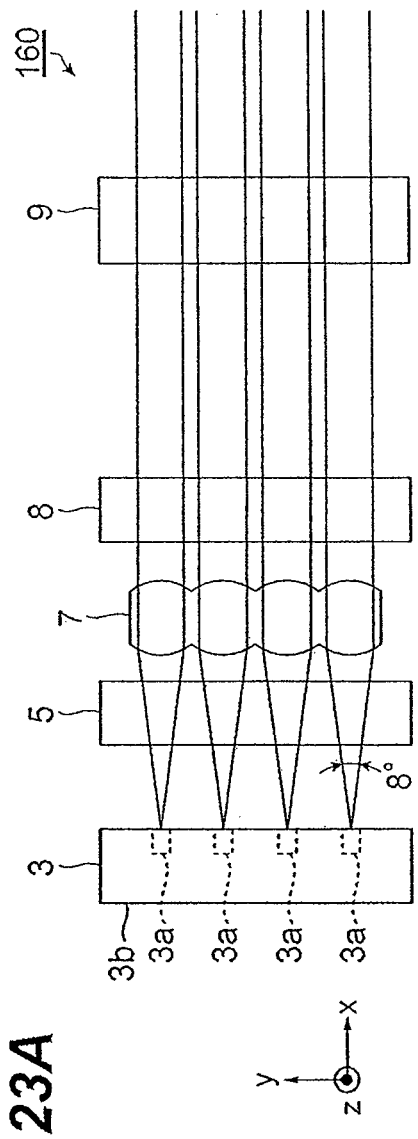
FIG. 23A is a plan view showing a configuration of the seventh embodiment of the semiconductor laser apparatus according to the present invention, and FIG. 23B a side view thereof.
Figure 23B:
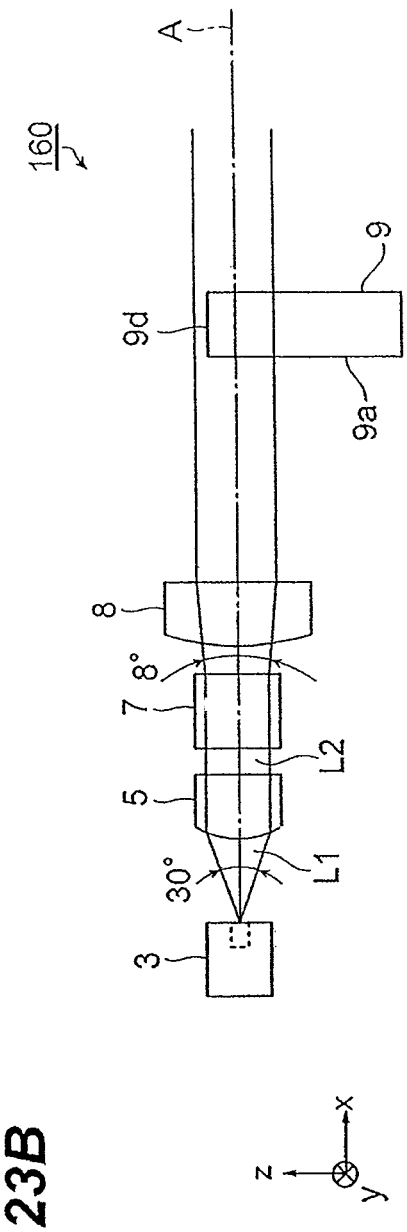

FIG. 23A is a plan view (a view from the z-axis direction) showing a configuration of the seventh embodiment of the semiconductor laser apparatus according to the present invention, and FIG. 23B a side view thereof (a view from the y-axis direction).

In the semiconductor laser apparatus 160 of this seventh embodiment, a second collimator lens 8 is disposed between the path rotator 7 and the reflecting mirror 9. The configuration of the semiconductor laser apparatus 160 except for this difference is the same as the configuration of the semiconductor laser apparatus 100, 150 of the first and sixth embodiments described above, and the description thereof is thus omitted herein.

The second collimator lens 8 thus installed has a configuration similar to that in the third embodiment (FIG. 14). The front and back lens surfaces of the second collimator lens 8 are cylindrical surfaces with a generatrix along the y-axis direction. The second collimator lens 8 has no refracting action in the plane including the generatrix direction, but has the refracting action in the plane perpendicular to the generatrix. As shown in FIG. 14, the length in the generatrix direction, i.e., the y-axis direction is 12 mm, the length in the x-axis direction 0.5-3 mm, and the length in the z-axis direction 1.5-10 mm. The beams outputted from the path rotator 7 are incident all to the second collimator lens 8. The second collimator lens 8 is so set that the generatrix thereof is perpendicular to the z-axis direction. By this setup, it is feasible to refract each beam emitted from the path rotator 7, in the plane perpendicular to the generatrix of the second collimator lens 8 and to make the beam closer to parallel light.

In the semiconductor laser apparatus 160 of the seventh embodiment, the second collimator lens 8 is able to refract the laser light transmitted by the path rotator 7, so as to make it closer to parallel light in the plane perpendicular to the y-axis direction. This also makes it feasible to increase the distance between the path rotator 7 and the reflecting mirror 9 and to offer greater degree of freedom of design for the semiconductor laser apparatus 160.

Eighth Embodiment

FIG. 24A is a plan view (a view from the z-axis direction) showing a configuration of the eighth embodiment of the semiconductor laser apparatus according to the present invention, and FIG. 24B a side view thereof (a view from the y-axis direction). The semiconductor laser apparatus 170 of this eighth embodiment has a semiconductor laser array stack 4, first collimator lenses 5, path rotators 7, and reflecting mirrors (optical elements) 9.

The semiconductor laser array stack 4 has a configuration similar to that in the fifth embodiment (FIG. 17). The semiconductor laser array stack 4 has the structure in which a plurality of semiconductor laser arrays 3 and a plurality of heat sinks 4h are alternately arranged along the z-axis direction, as shown in FIG. 17.

The heat sinks 4h cool the semiconductor laser arrays 3. The heat sinks 4h have a cooling water path formed by combining copper members of flat plate shape. Cooling water circulates in this cooling water path.

Each first collimator lens 5 has a configuration similar to that in the first embodiment and the sixth embodiment (FIG. 6). The first collimator lens 5 is so set that the generatrix of the first collimator lens 5 is perpendicular to the vertical direction (z-axis direction) of the opposed semiconductor laser array 3. By this setup, it is feasible to refract the beam emitted from each active layer 3a, in the plane perpendicular to the generatrix of the first collimator lens 5 and to collimate it. Namely, the first collimator lens 5 refracts the component in the vertical direction (z-axis direction) of the beam emitted from each active layer 3a, to collimate it. For efficient collimation, each first collimator lens 5 is arranged in the vicinity of the active layers 3a. For this reason, the first collimator lenses 5 are in one-to-one correspondence to the semiconductor laser arrays 3. Namely, the number of first collimator lenses 5 installed is equal to the number of semiconductor laser ways 3. Each first collimator lens 5 is arranged so as to face one corresponding semiconductor laser array 3. Therefore, the beams emitted from the active layers 3a of one semiconductor laser array 3 are incident all to one first collimator lens 5.

Each path rotator 7 has a configuration similar to that in the first embodiment and the sixth embodiment (FIG. 7). The path rotator 7 rotates the transverse section of each beam collimated by the first collimator lens 5, by about 90°. For this reason, the path rotators 7 are arranged in one-to-one correspondence to the first collimator lenses 5. Namely, each path rotator 7 is arranged so as to face one corresponding first collimator lens 5. Therefore, all the beams emitted from one first collimator lens 5 are incident to one corresponding path rotator 7. The cylindrical surfaces of the respective path rotators 7 are in one-to-one correspondence to the active layers 3a. Therefore, the beams emitted from the respective active layers 3a of one semiconductor laser array 3 are incident all to one corresponding path rotator 7.

Each reflecting mirror 9 as an optical element has a configuration similar to that in the sixth embodiment (FIG. 21). Each reflecting mirror 9 reflects a part of each beam emitted from each path rotator 7 and the reflected part of each beam returns to the active layer 3. For this reason, the reflecting mirrors 9 are arranged in one-to-one correspondence to the path rotators 7. Namely, each reflecting mirror 9 is arranged so as to face one corresponding path rotator 7.

In the semiconductor laser apparatus 170 of the eighth embodiment, the laser light generated in the semiconductor laser arrays 3 resonates in the external resonator paths to make the spatial transverse mode closer to the single mode, and the laser light with the divergence angle reduced by the configuration to make the spatial transverse mode closer to the single mode can be outputted to the outside. Therefore, the semiconductor laser apparatus 170 is able to reduce the divergence angle of the final output light.

Figure 25:
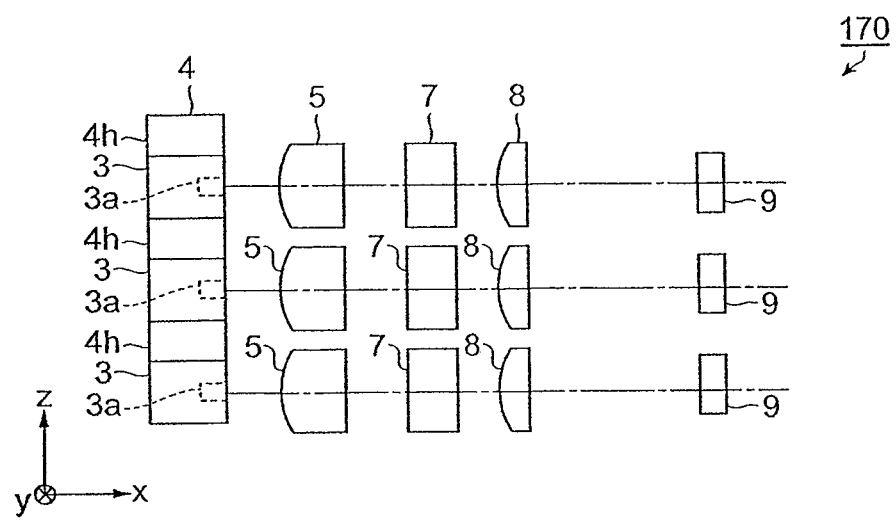
FIG. 25 is a side view showing a modification of the semiconductor laser apparatus according to the eighth embodiment.

The present invention can be modified in various ways without being limited to the above-described embodiments. FIG. 25 is a side view showing a configuration of a modification of the semiconductor laser apparatus 170 according to the eighth embodiment. As shown in this FIG. 25, the semiconductor laser apparatus 170 is provided with second collimator lenses 8 each of which is located between a path rotator 7 and a reflecting mirror 9. The second collimator lenses 8 have a configuration similar to that in the third embodiment (FIG. 14). When each second collimator lens 8 is thus set, the second collimator lens 8 is able to refract the laser light transmitted by the path rotator 7, so as to make it closer to parallel light in the plane perpendicular to the y-axis direction. This also makes it feasible to increase the distance between the path rotators 7 and the reflecting mirrors 9 and to offer greater degree of freedom of design for the semiconductor laser apparatus 170.

Ninth Embodiment

FIG. 26A is a plan view showing a configuration of the ninth embodiment of the semiconductor laser apparatus according to the present invention, and FIG. 26B a side view thereof. The semiconductor laser apparatus 180 of the ninth embodiment has a semiconductor laser array stack 4, first collimator lenses 5, path rotators 7, and an optical element 9.

The semiconductor laser array stack 4 has a configuration similar to that in the fifth embodiment (FIG. 17). The semiconductor laser array stack 4 has the structure in which a plurality of semiconductor laser arrays 3 and a plurality of heat sinks 4h are alternately arranged along the z-axis direction, as shown in FIG. 17. The heat sinks 4h cool the semiconductor laser arrays 3. The heat sinks 4h have a cooling water path formed by combining copper members of flat plate shape. Cooling water circulates in this cooling water path.

The semiconductor laser arrays 3 in the semiconductor laser array stack 4 have the configuration shown in FIG. 3. Each semiconductor laser array 3 has a plurality of active layers 3a arrayed in parallel along the y-axis direction (longitudinal direction). Each active layer 3a emits a beam of laser light along the optical axis A. Here the optical axis A is an axis being parallel to the x-axis while passing the center of the active layer 3a. The front end face (light output surface) of each semiconductor laser array 3 has a configuration similar to FIG. 4A, and the front end face of each active layer 3a has a configuration similar to FIG. 4B. Each semiconductor laser array 3 has the structure in which the active layers 3a are aligned at intervals of 500 μm in the y-axis direction in the width of 1 cm. The cross section of each active layer 3a has the width of 100 μm and the thickness of 1 μm. The front end face of each semiconductor laser array 3 is coated with a reflecting film having the reflectance of not more than ten and several %.

Figure 27:
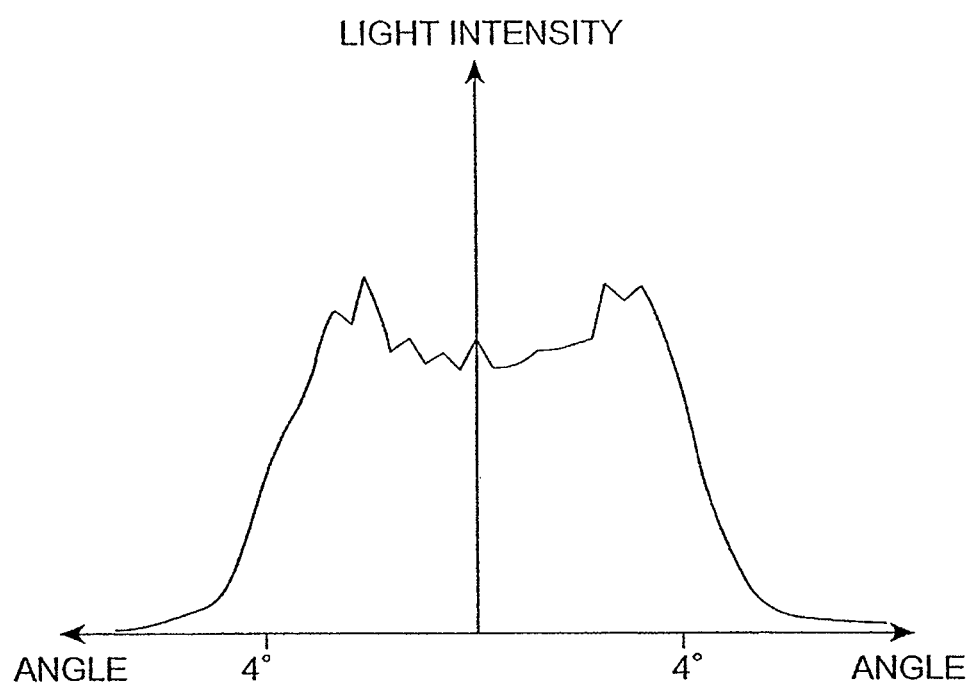
FIG. 27 is a light intensity distribution in the horizontal direction (y-axis direction) of output light from a semiconductor laser array applied to the semiconductor laser apparatus of the ninth embodiment.

A beam L1 of laser light emitted from one active layer 3a has the divergence angle of 30°-40° in the z-axis direction and the divergence angle of 8°-10° in the y-axis direction with the center on the optical axis A. FIG. 27 shows a light intensity distribution in the y-axis direction of the beam L1 emitted from the active layer 3a. The horizontal axis of the graph represents the angle from the optical axis A, and the vertical axis the light intensity of the laser beam. As shown in this FIG. 27, the intensity distribution is not a Gaussian distribution, but an irregular distribution.

The first collimator lenses 5 have a configuration similar to that in the first embodiment (FIG. 6). The front and back lens surfaces of each first collimator lens 5 are cylindrical surfaces with a generatrix along the y-axis direction. The dimensions of each first collimator lens are the length of 0.4 mm in the x-axis direction, the length of 12 mm in the y-axis direction, and the length of 0.6 min in the z-axis direction. The first collimator lenses 5 are of an elongated shape along the y-axis direction The first collimator lenses 5 have no refracting action in the plane including the generatrix direction (y-axis direction) but have the refracting action in the plane perpendicular to the generatrix. Since the vertical divergence angle of the beam emitted from each active layer 3a is large as described above, it is necessary to suppress the divergence of the beam by use of the refracting action, in order to increase the efficiency of collection of the beam. The first collimator lens 5 and the semiconductor laser array 3 are arranged in such a positional relation that the generatrix of the first collimator lens 5 is perpendicular to the vertical direction (z-axis direction) of the semiconductor laser array 3. By this setup, it is feasible to refract the beam emitted from each active layer 3a, in the plane perpendicular to the generatrix of the first collimator lens 5 and to collimate it. Namely, the first collimator lens 5 refracts and collimates the component in the vertical direction (z-axis direction) of the beam emitted from each active layer 3a. For efficient collimation, each first collimator lens 5 is arranged in the vicinity of the active layers 3a. The beams emitted from the active layers 3a of each semiconductor laser array 3 are incident all to one first collimator lens 5.

The path rotators 7 also have a configuration similar to that in the first embodiment (FIG. 7). The path rotators 7 are made of an optically transparent material such as glass or quartz. The length in the x-axis direction is 1.5 mm, the length in the y-axis direction 12 mm, and the length in the z-axis direction 1.5 mm. As described, the path rotators 7 are of an elongated shape along the y-axis direction.

Each path rotator 7 rotates the transverse sections of the beams collimated in the z-axis direction by the first collimator lens 5, by about 90°. All the beams emitted from the first collimator lens 5 are incident to the corresponding path rotator 7. Each path rotator 7 has an input surface 7a and an output surface 7b facing each other. This input surface 7a has a plurality of cylindrical surfaces with the width of 0.5 mm arranged in parallel. These cylindrical surfaces extend at the angle of 45° relative to the y-axis direction. The number of these cylindrical surfaces is equal to the number of active layers 3a in each semiconductor laser array 3. Namely, these cylindrical surfaces are in one-to-one correspondence to the active layers 3a. Similarly, the output surface 7b also has a plurality of cylindrical surfaces with the width of 0.5 mm arranged in parallel. These cylindrical surfaces also extend at the angle of 45° relative to the y-axis direction. These cylindrical surfaces are also in one-to-one correspondence to the active layers 3a. Therefore, all the beams emitted from the respective active layers 3a in each semiconductor laser array 3 are incident to one corresponding path rotator 7.

Other examples of the path rotator are described in aforementioned Document 1.

Figure 28:
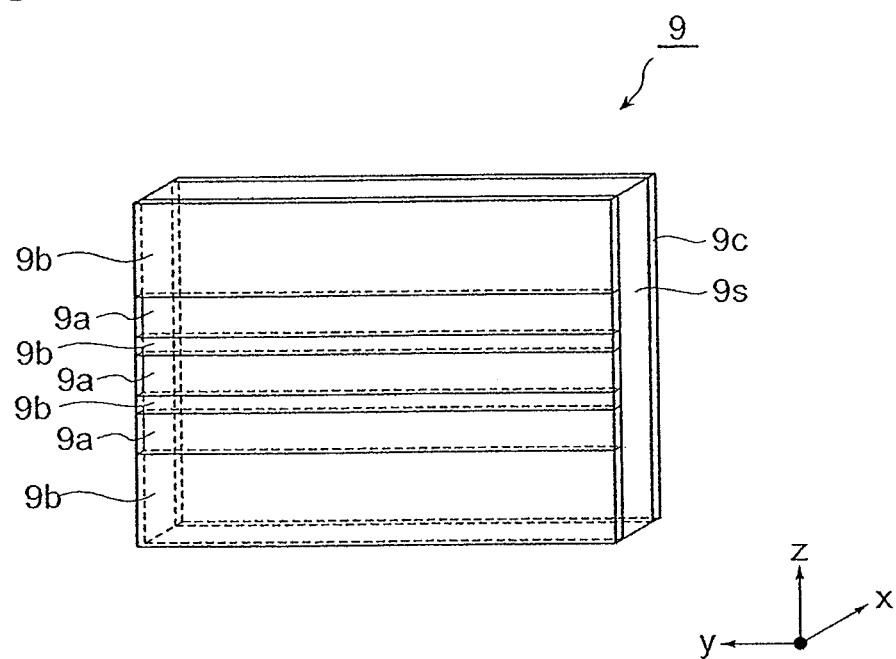
FIG. 28 is a perspective view showing a configuration of an optical element applied to the semiconductor laser apparatus of the ninth embodiment.

FIG. 28 is a perspective view showing a configuration of the optical element 9 applied to the semiconductor laser apparatus 180 of the ninth embodiment. This figure is a perspective view of the optical element 9 as viewed from the path rotators 7 side. The optical element 9 receives each beam with the transverse section rotated by the path rotator 7, and has a configuration in which reflecting portions 9a and transmitting portions 9b for each received beam are alternately arranged along a predetermined direction perpendicular to the y-axis direction. The optical element 9 returns at least part of light reflected on each reflecting portion 9a, to the active layer 3a having emitted the light. The optical element 9 outputs light transmitted by each transmitting portion 9b, to the outside.

The optical element 9 has the structure in which the reflecting portions 9a and transmitting portions 9b are alternately formed along the predetermined direction perpendicular to the y-axis direction, on one surface (a surface on the path rotators 7 side) of a substrate 9s of flat plate shape made of an optically transparent material such as glass or quartz. Each of the reflecting portions 9a and the transmitting portions 9b extends in a constant width in the foregoing predetermined direction and along the y-axis direction. Namely, the optical element 9 has the plurality of reflecting portions 9a in a stripe pattern.

The reflecting portions 9a preferably reflect the light incident from the path rotators 7, at a high reflectance (e.g., a reflectance of not less than 99.5%) and are constructed, for example, of a totally reflecting film, a diffraction grating, or an etalon. The transmitting portions 9b preferably transmit the light incident from the path rotators 7, at a high transmittance (e.g., a transmittance of not less than 99.5%) and are constructed, for example, of a reflection reducing film. The other surface (the surface on the other side than the path rotators 7 side) of the substrate 9s is preferably provided with a reflection reducing film.

A pair of reflecting portion 9a and transmitting portion 9b adjacent to each other correspond to one semiconductor laser array 3, and a boundary between those reflecting portion 9a and transmitting portion 9b is parallel to the y-axis direction and is within a transverse section of each beam arriving at the optical element 9 from the path rotator 7. Therefore, the reflecting portion 9a reflects a partial sectional portion of each beam arriving at the optical element 9 from the path rotator 7, toward the path rotator 7. On the other hand, the transmitting portion 9b transmits the rest sectional portion of each beam arriving at the optical element 9 from the path rotator 7.

The optical element 9 may be configured so that the substrate 9s is perpendicular to the optical axis of each beam emitted from the path rotator 7, but a preferred configuration is such that the substrate 9s is inclined at an angle α relative to the plane perpendicular to the optical axis of each beam emitted from the path rotator 7 and the inclination angle α is smaller than a half of the divergence angle in the z-axis direction of each beam emitted from the path rotator 7. By this configuration, it is feasible to make at least part of incident light to each reflecting portion 9a, incident perpendicularly to the reflecting portion 9a and to return the reflected light through the path opposite to the input path to the active layer 3a.

An example of the dimensions of the optical element 9 is the length of 12 mm the y-axis direction and the thickness of 1 mm-3 mm in the x-axis direction. A ratio ($W_R/W_T$) of the width $W_R$ in the z-axis direction of the reflecting portion 9a to the width $W_T$ in the z-axis direction of the transmitting portion 9b is 1-7, and the lamination period $W_L$, which is the sum ($W_R+W_T$) of the width $W_R$ and the width $W_T$, is approximately 1.5 mm-2.0 mm. Supposing the lamination period in the z-axis direction of the semiconductor laser arrays 3 is $W_L$, the sum ($W_R+W_T$) of the width $W_R$ and the width $W_T$ is equal to $W_L/\cos \alpha$.

Figure 29:
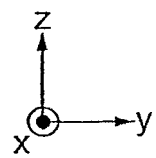
FIG. 29A shows transverse sections (output patterns) before incidence of beams generated in active layers to the first collimator lens, FIG. 29B transverse sections of the beams after passage through the first collimator lens.
FIG. 29C is an illustration showing transverse sections of the beams after passage through the path rotator 7.

Subsequently, the operation of the semiconductor laser apparatus 180 of the ninth embodiment will be described with reference to FIGS. 26A-26B and FIGS. 29A-29C. FIG. 29A shows the transverse sections (output patterns) of the beams generated in the active layers 3a, before incidence thereof to the first collimator lens 5, FIG. 29B the transverse sections of the beams after passage of the beams emitted from the active layers 3a, through the first collimator lens 5, and FIG. 29C is an illustration showing the transverse sections of the beams after passage of the beams transmitted by the first collimator lens 5, through the path rotator 7.

Each active layer 3a of each semiconductor laser array 3 in the semiconductor laser array stack 4 emits a beam L1 into the x-axis direction. This beam L1 has the divergence angle of 8° in the y-axis direction and the divergence angle of 30° in the z-axis direction with the center on the optical axis (chain line in FIG. 26B). The length in the vertical direction (z-axis direction) of the transverse section of each active layer 3a is one hundredth of the length in the horizontal direction (y-axis direction). Therefore, the transverse section of each beam L1 is horizontally elongated upon emission from the active layer 3a. The beam emitted from each active layer 3a diverges before arrival at the first collimator lens 5 (FIG. 29A). The vertical length of the transverse section of each beam incident to the first collimator lens 5 is determined by the focal length of the first collimator lens 5.

The beam L1 emitted from each active layer 3a is incident to the first collimator lens 5. The first collimator lens 5 refracts the beam L1 in the plane perpendicular to the y-axis (i.e., a plane parallel to the xz plane) and outputs the refracted beam as a beam L2 into the x-axis direction. The beam L2 has the divergence angle of about 0° in the z-axis direction and is not subjected to refraction in the y-axis direction (FIG. 29B). Since the first collimator lens 5 has no refracting action in the plane including the y-axis, the divergence angle in the y-axis direction is an angle similar to that of the beam L1.

The beams L2 refracted and outputted by the first collimator lens 5 are incident to the path rotator 7 before adjacent beams intersect with each other. The path rotator 7 rotates the transverse sections of the beams L2 by about 90° and outputs the rotated beams as beams L3 into the x-axis direction. Each beam L2 collimated in the z-axis direction is converted here into a beam L3 collimated in the y-axis direction. Through this conversion, the transverse section of each beam comes to have the shape long in the z-axis direction and short in the horizontal direction (FIG. 29C). The beam L3 results from the rotation of the transverse section of each beam L2 by about 90°, whereby the direction of the divergence angle of each beam L2 is also rotated by about 90°. Namely, the beam L3 is nearly parallel light in the y-axis direction and has the divergence angle in the z-axis direction. Since the beam is nearly parallel light in the y-axis direction, it is feasible to prevent adjacent beams L3 from intersecting with each other.

The optical element 9 is provided ahead of the path rotators 7 in the traveling direction of the beams L3. In this optical element 9, a boundary extending in the y-axis direction between a reflecting portion 9a and a transmitting portion 9b adjacent to each other is within a transverse section of an optical path of each beam L3; therefore, a part of each beam L3 emitted from the path rotator 7 is incident to the reflecting portion 9a, and the rest is incident to the transmitting portion 9b. At least part of the light incident to the reflecting portion 9a is incident perpendicularly to the reflecting portion 9a.

The light resulting from the reflection of the beam L3 on the reflecting portion 9a travels in the opposite direction to the optical path from the active layer 3a to the reflecting portion 9a to return to the active layer 3a. The return beam travels back to the active layer 3a of the semiconductor laser array 3 to be amplified in the active layer 3a, and further travels via the back end face (reflecting surface) of the semiconductor laser array 3 to the end face (output surface) from which the laser light is emitted. The light reflected toward the back end face from the light reaching this output surface travels via the rear end face to be outputted again from the active layer 3a into the x-axis direction. Part of the emitted light travels again through the optical axis to the optical element 9 and only part of the light reflected on the reflecting portion 9a travels backward again through the optical path to return to the active layer 3a.

As described above, an external resonator is formed between each reflecting portion 9a and the reflecting surface of each active layer 3a, and part of light resonates in the external resonator to effect induced emission in the active layer 3a. This makes the spatial transverse mode of laser light from the induced emission closer to the single mode. On the other hand, light incident from the path rotator 7 to the transmitting portion 9b of the optical element 9 travels through the transmitting portion 9b to be outputted to the outside of the semiconductor laser apparatus 180. This is final output light from the semiconductor laser apparatus 180.

As described above, the semiconductor laser apparatus 180 of the ninth embodiment has the resonance path including the path of the beam reflected by each reflecting portion 9a, and the output path including the path of the beam transmitted by each transmitting portion 9b. In the semiconductor laser apparatus 180, therefore, the light generated in the active layers 3a of the semiconductor laser array 3 resonates to make the spatial transverse mode closer to the single mode, and the laser light with the divergence angle reduced by the configuration to make the spatial transverse mode closer to the single mode can be outputted from the output path to the outside. Therefore, the semiconductor laser apparatus 180 is able to reduce the divergence angle of the final output light. Since the resonance path and the output path are separated by the arrangement of the reflecting portion 9a and the transmitting portion 9b, the optical element is provided with the reflecting portions 9a of total reflection, without use of a half mirror or the like for separation between the paths. Therefore, the semiconductor laser apparatus 180 obtains stronger resonance light and stronger output light than in the case where the half mirror or the like is used to form the path of resonance light and the path of output light.

Figure 30:
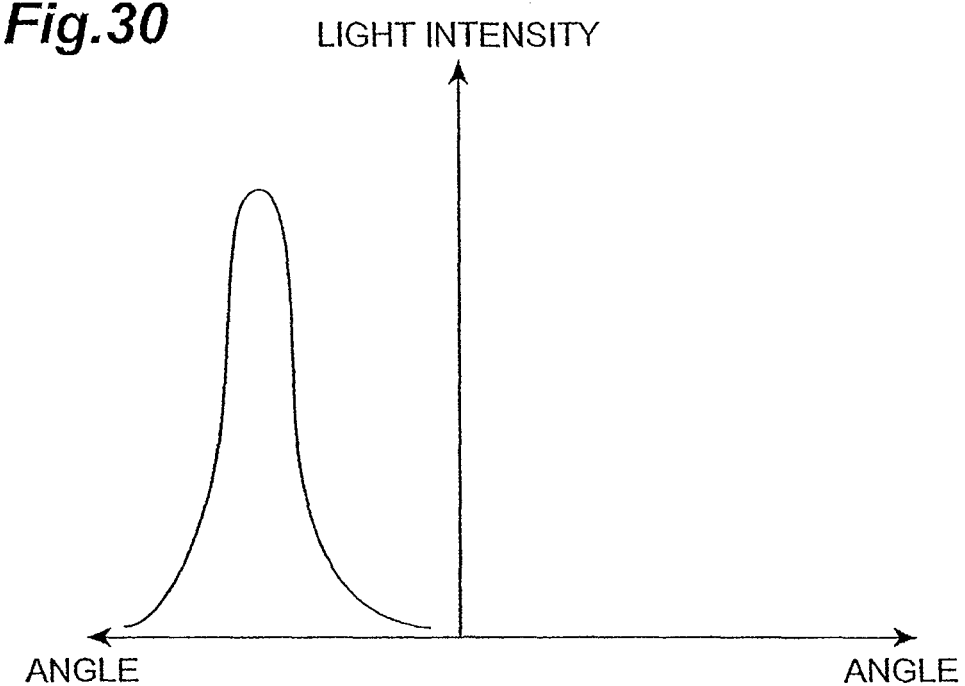
FIG. 30 is a light intensity distribution in the vertical direction (z-axis direction) of output light from the semiconductor laser apparatus of the ninth embodiment.

The light intensity distribution in the z-axis direction of the light obtained through the transmitting portion 9b (the final output light from the semiconductor laser apparatus 180) is a distribution as shown in FIG. 30. When compared with the light intensity distribution of the beam emitted from the active layer 3a (cf. FIG. 27), the light intensity distribution of the final output light from the semiconductor laser apparatus 180 of the ninth embodiment has only one peak and the peak is sharper. In other words, the divergence angle of the laser light emitted from the semiconductor laser apparatus 180 is smaller. This divergence angle differs depending upon various conditions such as the size of the active layer 3a but, in the case of the semiconductor laser apparatus 180, it is about 1°, which is smaller than the divergence angle of 8° of the beam emitted from the active layer 3a.

With change in the inclination angle α of the optical element 9, the peak position and peak intensity of the intensity distribution will vary. In order to obtain the output light with higher intensity, the semiconductor laser apparatus 180 may be arranged so that the inclination angle of the optical element 9 is preliminarily determined so as to maximize the peak intensity and the angle thus determined is set as the angle α. A potential configuration is such that the inclination angle of the optical element 9 is set at +α and the lower part (−z side part) of each beam arriving at the optical element 9 is reflected by the reflecting portion 9a, as shown in FIG. 26B. Conversely, it is also possible to adopt a configuration wherein the inclination angle of the optical element 9 is −α and the upper part (+z side part) of each beam arriving at the optical element 9 is reflected by the reflecting portion 9a.

The semiconductor laser apparatus 180 of the ninth embodiment is arranged to use the planar reflecting surface as each reflecting portion 9a and to return a part of each beam emitted from the path rotator 7, to the active layer 3a, but it is also possible to use a concave reflecting surface to perpendicularly totally reflect the entire beam incident from the path rotator 7 and to return the entire reflected beam to the active layer 3a.

In a case where a diffraction grating or an etalon formed on the substrate 9s is used as the reflecting portion 9a in the optical element 9, the laser light outputted from the semiconductor laser light source 180 comes to have a small divergence angle and a narrow wavelength bandwidth by virtue of the reflected wavelength selecting function of the diffraction grating or etalon.

Tenth Embodiment

Figure 31:
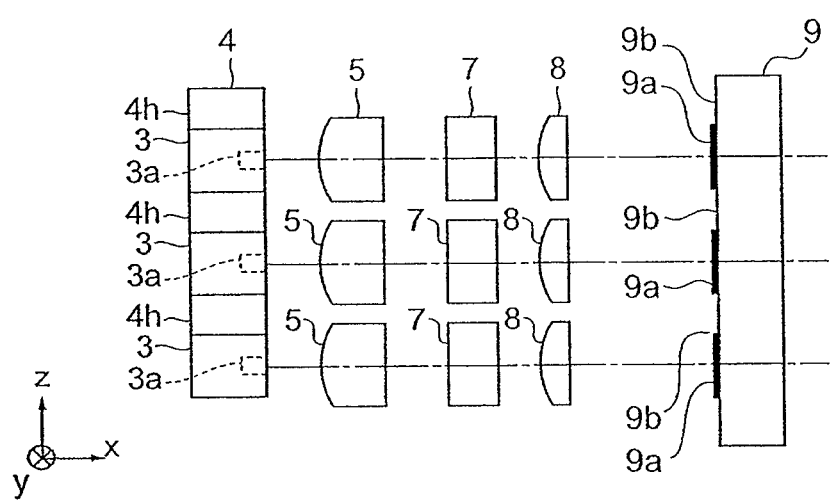
FIG. 31 is a side view showing a configuration of the tenth embodiment of the semiconductor laser apparatus according to the present invention.

Next, FIG. 31 is a side view (a view from the y-axis direction) showing a configuration of the tenth embodiment of the semiconductor laser apparatus according to the present invention. In the semiconductor laser apparatus 190 of the tenth embodiment, second collimator lenses 8 are disposed between the path rotators 7 and the reflecting mirror 9. The configuration of the semiconductor laser apparatus 190 of the tenth embodiment except for this difference is the same as the configuration of the semiconductor laser apparatus 100, 180 of the first embodiment and the ninth embodiment, and thus the description thereof is omitted herein.

The second collimator lenses 8 have a shape approximately similar to that of the first collimator lens 5 shown in FIG. 6. The front and back lens surfaces of the second collimator lenses 8 are cylindrical surfaces with a generatrix along the y-axis direction. The second collimator lenses 8 have no refracting action in the plane including the generatrix direction, but have the refracting action in the plane perpendicular to the generatrix. The length in the y-axis direction is 12 mm, the length in the x-axis direction 0.5-3 mm, and the length in the z-axis direction 1.5-10 mm. The beams outputted from the path rotator 7 are incident all to one corresponding second collimator lens 8. Each second collimator lens 8 is so set that the generatrix thereof is perpendicular to the z-axis direction. By this setup, it is feasible to refract the beams outputted from the path rotator 7, in the plane perpendicular to the generatrix of the second collimator lens 8 and to make the beams closer to parallel light.

In the semiconductor laser apparatus 190 of the tenth embodiment, the second collimator lenses 8 are able to refract the beams transmitted by the path rotators 7 and to make them closer to parallel light in the plane perpendicular to the longitudinal direction. This also makes it feasible to increase the distance between the path rotators 7 and the reflecting mirror 9 and to offer greater degree of freedom of design for the semiconductor laser apparatus 190.

Eleventh Embodiment

Figure 32A:
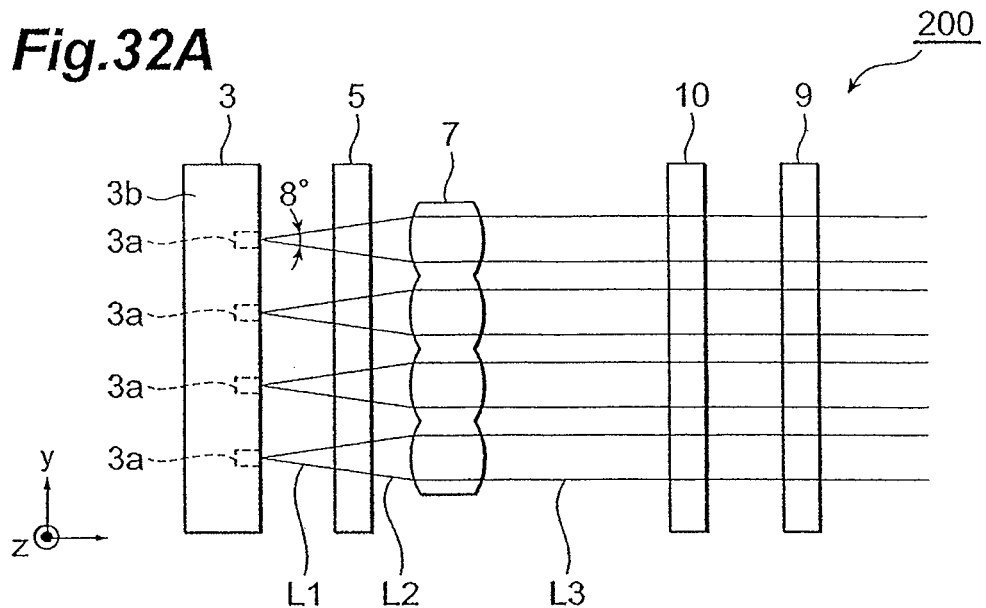
FIG. 32A is a plan view showing a configuration of the eleventh embodiment of the semiconductor laser apparatus according to the present invention, and FIG. 32B a side view thereof.
Figure 32B:
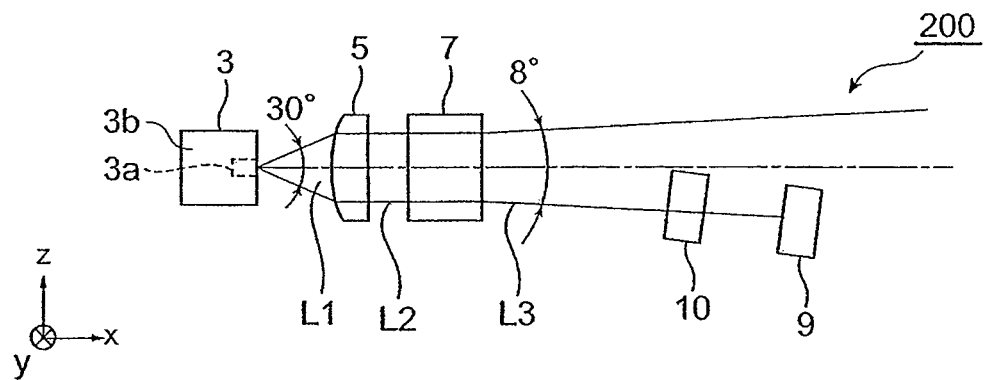

FIG. 32A is a plan view showing a configuration of the eleventh embodiment of the semiconductor laser apparatus according to the present invention, and FIG. 32B a side view thereof. The semiconductor laser apparatus 200 of the eleventh embodiment has a semiconductor laser array 3, a first collimator lens 5, a path rotator 7, a wavelength selector 10, and an optical element 9.

The semiconductor laser array 3 has a configuration similar to that in the first embodiment (FIG. 3). The semiconductor laser array 3 has a plurality of active layers 3a arrayed in parallel along the y-axis direction. Each active layer 3a emits a beam of laser light along the optical axis A. Here the optical axis A is an axis being parallel to the x-axis and passing the center of active layer 3a. The front end face (light output surface) of the semiconductor laser array 3 is shown in FIG. 4A and the front end face of active layer 3a is shown in FIG. 4B. The semiconductor laser array 3 has the structure in which the active layers 3a are aligned at intervals of 300

μm-500 μm in the y-axis direction in the width of 1 cm. The cross section of each active layer 3a has the width of 100 μm-200 μm and the thickness of 1 μm. The front end face of the semiconductor laser array 3 is coated with a reflection reducing film having the reflectance of not more than ten and several %.

Figure 33:
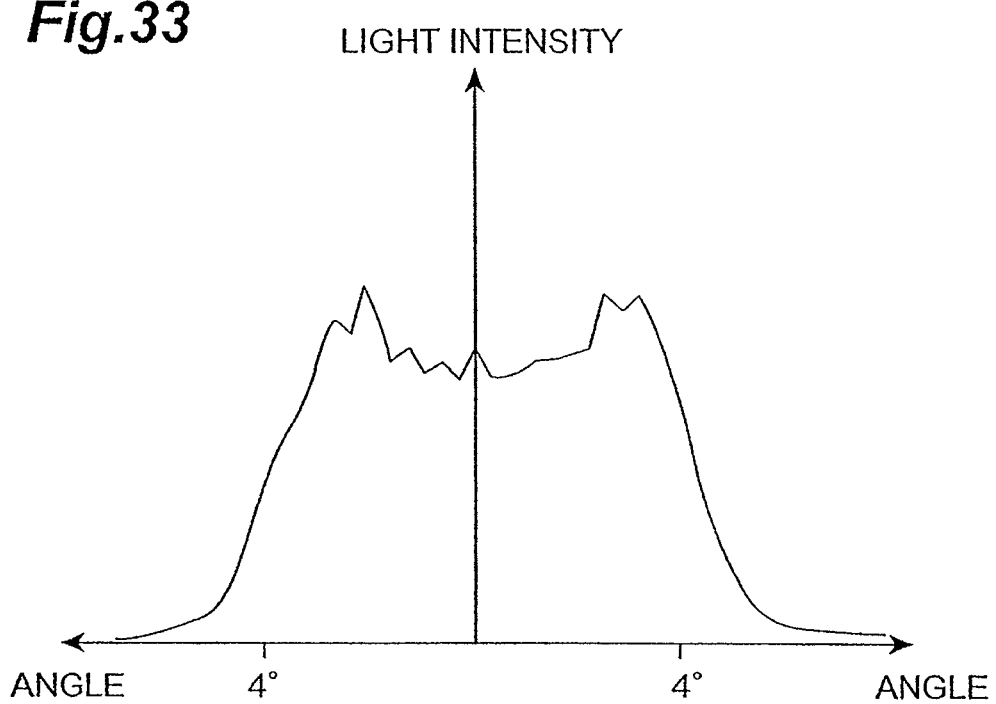
FIG. 33 is a light intensity distribution in the horizontal direction (y-axis direction) of output light from a semiconductor laser array applied to the semiconductor laser apparatus of the eleventh embodiment.
Figure 34:
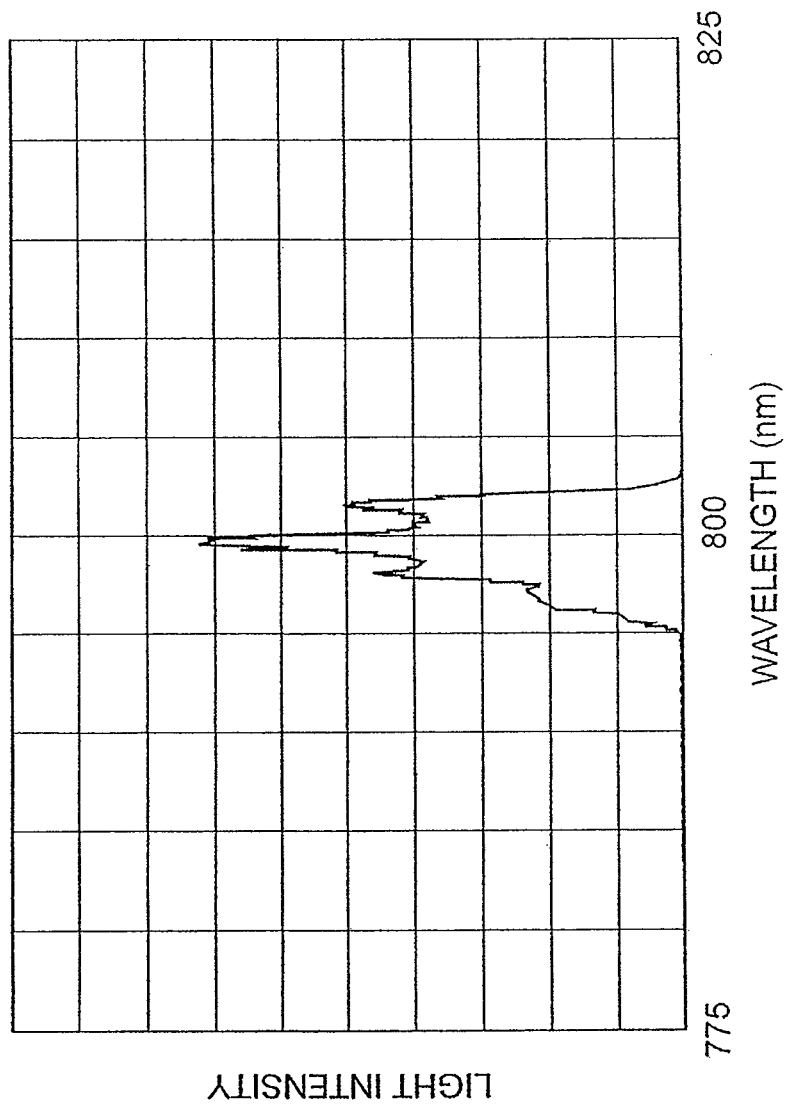
FIG. 34 is, a spectrum of output light from a semiconductor laser array applied to the semiconductor laser apparatus of the eleventh embodiment.

A beam L1 of laser light emitted from one active layer 3a has the divergence angle of about 30°-40° in the z-axis direction and the divergence angle of about 8°-10° in the y-axis direction with the center on the optical axis A. FIG. 33 shows a light intensity distribution in the y-axis direction of the beam L1 emitted from the active layer 3a. The horizontal axis of the graph represents the angle from the optical axis A, and the vertical axis the light intensity of the laser beam. As shown in this FIG. 33, the intensity distribution is not a Gaussian distribution but an irregular distribution. FIG. 34 is a spectrum of the beam L1 emitted from the active layer 3a. As seen from this FIG. 34, the beam L1 emitted from the active layer 3a has a wide spectral width.

The first collimator lens 5 has a configuration similar to that in the first embodiment (FIG. 6). The front and back lens surfaces of the first collimator lens 5 are cylindrical surfaces with a generatrix along the y-axis direction. The dimensions of the first collimator lens 5 are the length of 0.4 mm-1 mm in the x-axis direction, the length of 12 mm in the y-axis direction, and the length of 0.6 mm-1 mm in the z-axis direction. The first collimator lens 5 is of an elongated shape along the y-axis direction The first collimator lens 5 has no refracting action in the plane including the generatrix direction (y-axis direction) but has the refracting action in the plane perpendicular to the generatrix. Since the beam emitted from each active layer 3a has the large divergence angle in the vertical direction, as described above, it is necessary to suppress the divergence of the beam by use of the refracting action, in order to increase the efficiency of collection of the beam. The first collimator lens 5 and the semiconductor laser array 3 are set in such a positional relation that the generatrix of the first collimator lens 5 is perpendicular to the vertical direction (z-axis direction) of the semiconductor laser array 3. By this setup, it is feasible to refract the beam emitted from each active layer 3a, in the plane perpendicular to the generatrix of the first collimator lens 5 and to collimate it. Namely, the first collimator lens 5 refracts and collimates the component in the vertical direction (z-axis direction) of the beam emitted from each active layer 3a. For efficient collimation, the first collimator lens 5 with a large NA (e.g., NA≧0.5) and a short focal point (e.g., f≦1.5 mm) is arranged so that the principal point thereof is at the focal length thereof from the active layer 3a. The beams emitted from the active layers 3a of the semiconductor laser array 3 are incident all to one first collimator lens 5.

The path rotator 7 has a configuration similar to that in the first embodiment (FIG. 7). The path rotator 7 is made of an optically transparent material such as glass or quartz. The length in the x-axis direction is 1.5 mm, the length in the y-axis direction 12 mm, and the length in the z-axis direction 1.5 mm. As described, the path rotator 7 is of an elongated shape along the y-axis direction.

The path rotator 7 rotates the transverse section of each beam collimated in the z-axis direction by the first collimator lens 5, by about 90°. All the beams emitted from the first collimator lens 5 are incident to the path rotator 7. The path rotator 7 has an input surface 7a and an output surface 7b facing each other. This input surface 7a has a plurality of cylindrical surfaces with the width of 0.5 mm arranged in parallel. These cylindrical surfaces extend at the angle of 45° relative to the y-axis direction. The number of these cylindrical surfaces is equal to the number of active layers 3a in the semiconductor laser array 3. Namely, these cylindrical surfaces are in one-to-one correspondence to the active layers 3a. Similarly, the output surface 7b also has a plurality of cylindrical surfaces with the width of 0.5 mm arranged in parallel. These cylindrical surfaces also extend at the angle of 45° relative to the y-axis direction. These cylindrical surfaces are also in one-to-one correspondence to the active layers 3a. Therefore, the beams emitted from the respective active layers 3a in the semiconductor laser array 3 are incident all to one corresponding path rotator 7.

Other examples of the path rotator are described in aforementioned Document 1.

The optical element 9 in FIG. 32B receives each beam with the transverse section rotated by the path rotator 7, has a reflecting portion and a transmitting portion for each received beam, returns at least part of the light reflected by the reflecting portion, to the active layer 3a having emitted the light, and outputs the light transmitted by the transmitting portion, to the outside. In this configuration, as shown in FIG. 32B, no medium has to be provided as the transmitting portion, and the reflecting mirror as the optical element 9 may be arranged to reflect the lower half (or upper half) in the z-axis direction in the transverse section of each beam incident from the path rotator 7. The reflecting mirror as optical element 9 in this case is, for example, of a rectangular parallelepiped shape, which has the thickness of 2 mm-3 mm in the x-axis direction, the width of 12 mm in the y-axis direction, and the height of 0.5 mm-0.8 mm in the z-axis direction, and has a high reflecting film formed on the surface facing the path rotator 7.

The optical element 9 is preferably constructed of a substrate of flat plate shape made of an optically transparent material and having a surface on which the reflecting portion and transmitting portion are formed. In this case, a reflecting film is formed as the reflecting portion on the substrate, and a reflection reducing film is formed as the transmitting portion on the substrate. The optical element 9 may have a structure in which reflecting portions and transmitting portions are alternately provided along the z-axis direction on a substrate of flat plate shape made of an optically transparent material, and may be arranged to reflect a half in the z-axis direction in the transverse section of each beam incident from the path rotator 7.

The optical element 9 may be arranged so that the surface of the reflecting portion is perpendicular to the optical axis of each beam emitted from the path rotator 7, but it is preferable to incline the surface of the reflecting portion relative to the plane perpendicular to the optical axis of each beam emitted from the path rotator 7 and to reflect at least part of light incident to the reflecting portion, into the same output direction as the input direction. The inclination angle of the surface of the reflecting portion in the optical element 9 is preferably smaller than a half of the divergence angle in the z-axis direction of the beam emitted from the path rotator 7. This permits at least part of the light incident to the reflecting portion to be made incident perpendicularly to the reflecting portion, and makes it feasible to return the reflected light through the path opposite to the input path to the active layer 3a.

The wavelength selector 10 is provided on the resonance path between the reflecting portion of the optical element 9 and the active layers 3a, and selectively outputs light of a specific wavelength in the light incident through the optical path, onto the optical path. This wavelength selector 10 is a transmitting element provided separately from the reflecting portion of the optical element 9 and is preferably a diffraction grating element, an etalon filter, or a dielectric multilayer filter. When such wavelength selector 10 is provided, the light resonating in the resonance path between the reflecting portion of optical element 9 and the active layer 3a comes to have a narrow spectrum. An etalon filter as the wavelength selector 10 is, for example, of a rectangular parallelepiped shape, and has the thickness of several mm in the x-axis direction, the width of 12 mm in the y-axis direction, and the height of 0.5 mm-0.8 mm in the z-axis direction.

Figure 35:
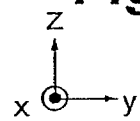
FIG. 35A shows transverse sections (output patterns) before incidence of beams generated in active layers to the first collimator lens, FIG. 35B transverse sections of the beams after passage through the first collimator lens.
FIG. 35C is an illustration showing transverse sections of the beams after passage through the path rotator 7.

Subsequently, the operation of the semiconductor laser apparatus 200 of the eleventh embodiment will be described using FIGS. 32A-32B and FIGS. 35A-35C. FIG. 35A shows the transverse sections (output patterns) of the beams generated in the active layers 3a, before incidence thereof to the first collimator lens 5, FIG. 35B the transverse sections of the beams after passage of the beams emitted from the active layers 3a, through the first collimator lens 5, and FIG. 35C is an illustration showing the transverse sections of the beams after passage of the beams transmitted by the first collimator lens 5, through the path rotator 7.

Each active layer 3a of the semiconductor laser array 3 emits a beam L1 into the x-axis direction. This beam L1 has the divergence angle of 8° in the y-axis direction and the divergence angle of 30° in the z-axis direction with the center on the optical axis (a chain line in FIG. 32B). The length in the vertical direction (z-axis direction) of the transverse section of each active layer 3a is one hundredth to one two hundredth of the length in the horizontal direction (y-axis direction). Therefore, the transverse section of each beam L1 is horizontally elongated upon emission from the active layer 3a. The beam emitted from each active layer 3a diverges before arrival at the first collimator lens 5 (FIG. 35A). The vertical length of the transverse section of the beam incident to the first collimator lens 5 is determined by the focal length of the first collimator lens 5.

The beam L1 emitted from each active layer 3a is incident to the first collimator lens 5. The first collimator lens 5 refracts the beam L1 in the plane perpendicular to the y-axis (i.e., a plane parallel to the xz plane) and outputs the refracted beam as a beam L2 in the x-axis direction. The beam L2 comes to have the divergence angle of about 0.2° in the z-axis direction and is not subjected to refraction in the y-axis direction. Namely, after emission from the first collimator lens 5, the horizontal divergence angle is larger than the vertical divergence angle, and thus the transverse section of each beam at a position distant from the first collimator lens 5 has a horizontally elongated shape (FIG. 35B). Since the first collimator lens 5 has no refracting action in the plane including the y-axis, the divergence angle in the y-axis direction is an angle similar to that of the beam L1.

The beam L2 refracted and outputted by the first collimator lens 5 is incident to the path rotator 7 before adjacent beams intersect with each other. The path rotator 7 rotates the transverse section of the beam L2 by about 90° and outputs the rotated beam as a beam L3 in the x-axis direction. The beam L2 collimated in the z-axis direction is converted here into a beam L3 collimated in the y-axis direction. This results in converting the transverse section of each beam into a shape long in the z-axis direction and short in the horizontal direction (FIG. 35C). Since the beam L3 is one resulting from the rotation of the transverse section of the beam L2 by about 90°, the direction of the divergence angle of the beam L2 is also rotated by about 90°. Namely, the beam L3 is nearly parallel light in the y-axis direction and has the divergence angle in the z-axis direction. Since the beam L3 is nearly parallel light in the y-axis direction, it is feasible to prevent adjacent beams L3 from intersecting with each other.

The wavelength selector 10 and optical element 9 are provided ahead of the path rotator 7 in the traveling direction of the beam L3. A part of the beam L3 emitted from the path rotator 7 travels through the wavelength selector 10 to be reflected by the reflecting portion of the optical element 9, and the rest becomes output light of the semiconductor laser apparatus 200.

The light reflected from the beam L3 by the optical element 9 travels in the opposite direction to the optical path from the active layer 3a to the reflecting portion of the optical element 9 to return to the active layer 3a. The return beam travels back to the active layer 3a of the semiconductor laser array 3 to be amplified in the active layer 3a, and further travels via the back end face (reflecting surface) of the semiconductor laser array 3 to reach the end face (output surface) from which the laser light is emitted. The light reflected toward the reflecting surface from the light reaching the output surface travels again via the reflecting surface to be outputted from the active layer 3a into the x-axis direction. A part of the emitted beam travels again through the aforementioned optical path to the optical element 9 and only part of the light impinging on and reflected by the reflecting portion 9a travels backward again through the optical path to return to the active layer 3a.

As described above, an external resonator is formed between the reflecting portion of the optical element 9 and the reflecting surface of each active layer 3a, and the partial beam resonates in the external resonator to effect induced emission in the active layer 3a. This makes the spatial transverse mode of laser light from the induced emission closer to the single mode. On the other hand, the light incident to the transmitting portion of the optical element 9 from the path rotator 7 travels through the transmitting portion to be outputted to the outside of the semiconductor laser apparatus 200. This becomes final output light from the semiconductor laser apparatus 200.

As described above, the semiconductor laser apparatus 200 of the eleventh embodiment has the resonance path including the path of the beam reflected by the reflecting portion of the optical element 9, and the output path including the path of the beam transmitted by the transmitting portion. In the semiconductor laser apparatus 200, therefore, the light generated in the active layer 3a of the semiconductor laser array 3 resonates in the resonance path to make the spatial transverse mode closer to the single mode, and the laser light with the divergence angle reduced by the configuration to make the spatial transverse mode closer to the single mode can be outputted from the output path to the outside. Therefore, the semiconductor laser apparatus 200 is able to reduce the divergence angle of the final output light.

Since the resonance path and the output path are separated by the arrangement of the reflecting portion and transmitting portion in the optical element 9, the reflecting portion of total reflection is provided without use of a half mirror the like for separating the paths. Therefore, the semiconductor laser apparatus obtains stronger resonance light and stronger output light than in the case where the half mirror or the like is used to form the optical path of resonance light and the optical path of output light.

Furthermore, since the semiconductor laser apparatus 200 of the eleventh embodiment has the wavelength selector 10 in the resonance path, the light of the specific wavelength selected by the wavelength selector 10 selectively resonates in the external resonator and this light of the specific wavelength is outputted through the output path to the outside. Therefore, the semiconductor laser apparatus 200 is able to narrow the spectral width of the final output light.

Figure 36:
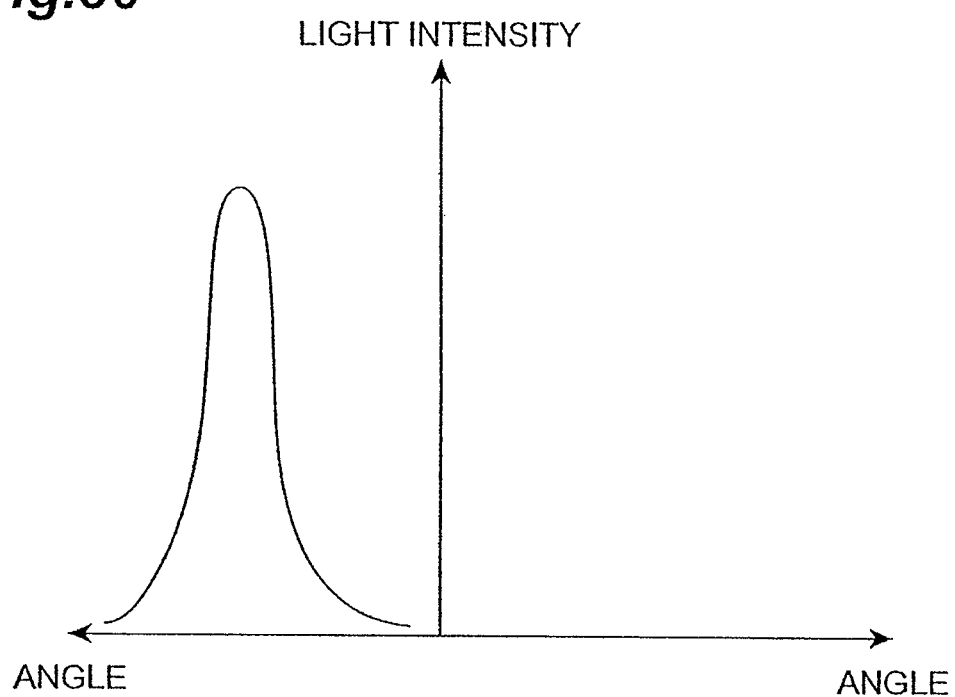
FIG. 36 is a light intensity distribution in the vertical direction (z-axis direction) of output light from the semiconductor laser apparatus of the eleventh embodiment.
Figure 37:
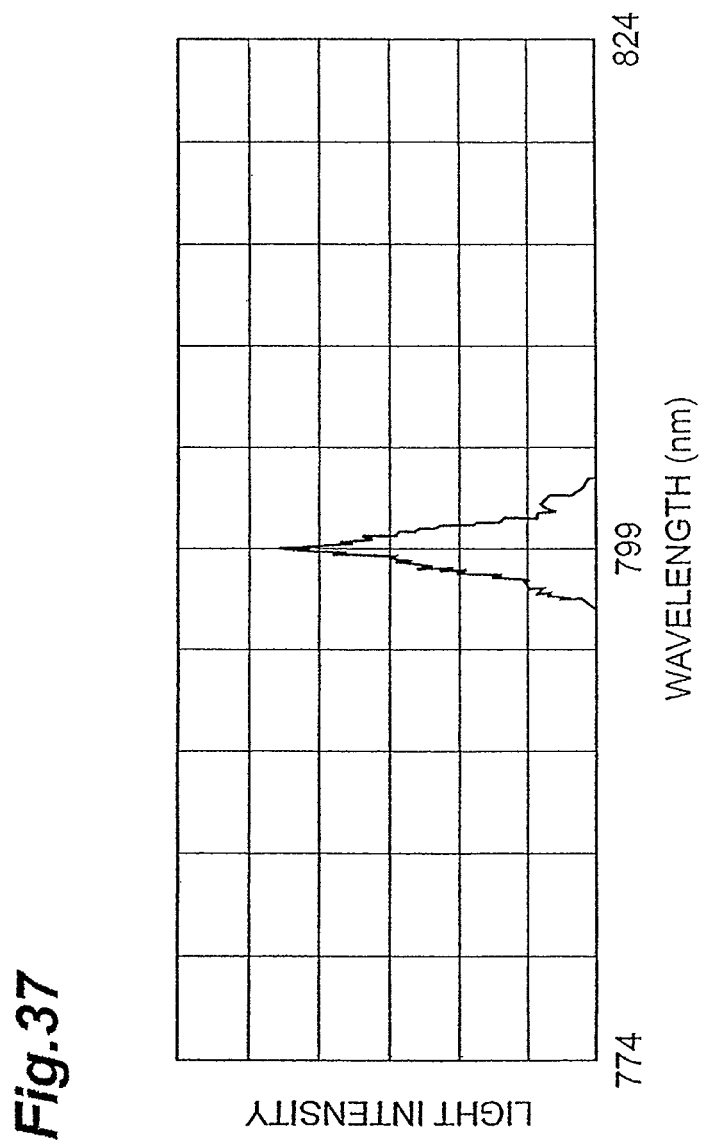
FIG. 37 is a spectrum of output light from the semiconductor laser apparatus 1 according to the eleventh embodiment.

FIG. 36 shows a light intensity distribution in the z-axis direction of the beam emitted from the semiconductor laser apparatus 200 of the eleventh embodiment. FIG. 37 shows a spectrum of the beam emitted from the semiconductor laser apparatus 200. As seen from a comparison between the light intensity distribution and spectrum shown in these FIGS. 36 and 37 and the light intensity distribution and spectrum shown in FIGS. 33 and 34, the final output light obtained from the semiconductor laser apparatus 200 of the eleventh embodiment has a narrow divergence angle and a narrow spectral width.

Twelfth Embodiment

Figure 38A:
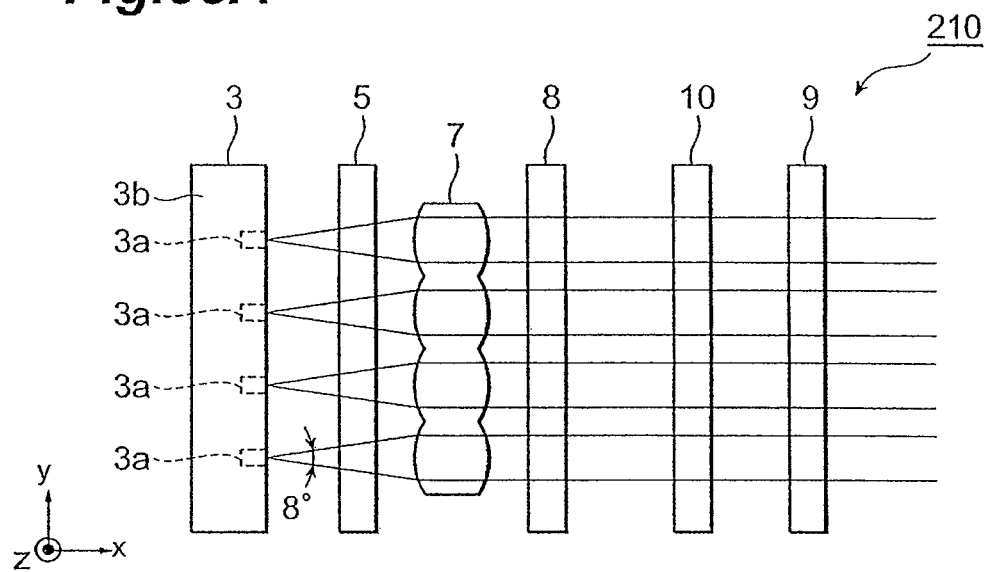
FIG. 38A is a plan view showing a configuration of the twelfth embodiment of the semiconductor laser apparatus according to the present invention, and FIG. 38B a side view thereof.
Figure 38B:
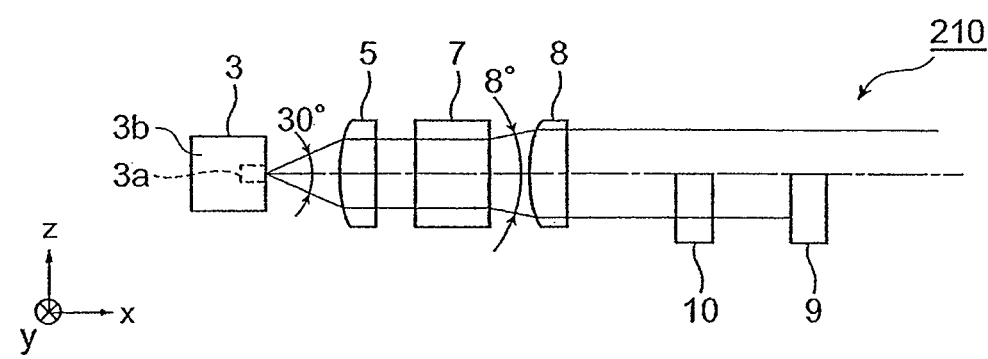

Next, FIG. 38A is a plan view showing a configuration of the twelfth embodiment of the semiconductor laser apparatus according to the present invention, and FIG. 38B a side view thereof. The semiconductor laser apparatus 210 of this twelfth embodiment has a semiconductor laser array 3, a first collimator lens 5, a path rotator 7, a second collimator lens 8, a wavelength selector 10, and an optical element 9.

The semiconductor laser apparatus 210 of the twelfth embodiment is different from the semiconductor laser apparatus 200 of the eleventh embodiment (FIGS. 32A and 32B) in that the second collimator lens 8 is disposed between the path rotator 7 and the wavelength selector 10. The configuration of the semiconductor laser apparatus 210 except for this difference is the same as the configuration of the semiconductor laser apparatus 200 of the eleventh embodiment and the description thereof is omitted herein.

The second collimator lens 8 has a configuration similar to that in the third embodiment (FIG. 14). The front and back lens surfaces of the second collimator lens 8 are cylindrical surfaces with a generatrix along the y-axis direction. The second collimator lens 8 has no refracting action in the plane including the generatrix direction, but has the refracting action in the plane perpendicular to the generatrix. The length in the y-axis direction is 12 mm, the length in the x-axis direction 0.5-3 mm, and the length in the z-axis direction 1.5-10 mm. The beams emitted from the path rotator 7 are incident all to the second collimator lens 8. The second collimator lens 8 is so set that the generatrix thereof is perpendicular to the z-axis direction. By this setup, it is feasible to refract each beam emitted from the path rotator 7, in the plane perpendicular to the generatrix of the second collimator lens 8 and to make the beam closer to parallel light.

In the semiconductor laser apparatus 210 of the twelfth embodiment, the second collimator lens 8 is able to refract each beam transmitted by the path rotator 7, so as to make it closer to parallel light in the plane perpendicular to the longitudinal direction. This makes it feasible to increase the distance between the path rotator 7 and the reflecting mirror 9 and to offer greater degree of freedom of design for the semiconductor laser apparatus 210.

Thirteenth Embodiment

Figure 39A:
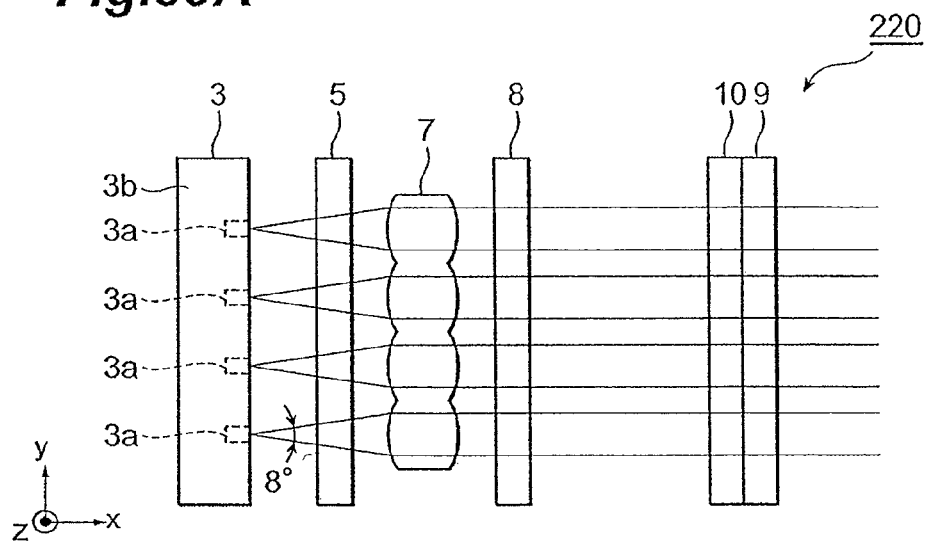
FIG. 39A is a plan view showing a configuration of the thirteenth embodiment of the semiconductor laser apparatus according to the present invention, and FIG. 39B a side view thereof.
Figure 39B:
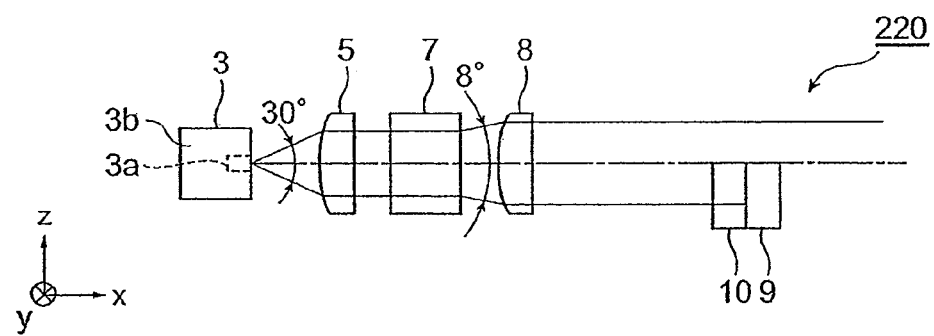

FIG. 39A is a plan view showing a configuration of the thirteenth embodiment of the semiconductor laser apparatus according to the present invention, and FIG. 39B a side view thereof. The semiconductor laser apparatus 220 of the thirteenth embodiment has a semiconductor laser array 3, a first collimator lens 5, a path rotator 7, a second collimator lens 8, a wavelength selector 10, and an optical element 9.

The semiconductor laser apparatus 220 of the thirteenth embodiment is different from the semiconductor laser apparatus 210 of the twelfth embodiment (FIGS. 38A and 38B) in that the wavelength selector 10 is a reflection type element provided on the reflecting portion of the optical element 9. The configuration of the semiconductor laser apparatus 220 except for this difference is the same as the configuration of the semiconductor laser apparatus 210 of the foregoing twelfth embodiment, and the description thereof is thus omitted herein.

In the semiconductor laser apparatus 220 of the thirteenth embodiment, the wavelength selector 10 is also preferably a diffraction grating element, an etalon filter, or a dielectric multilayer filter. The wavelength selector 10 may be integrated with the reflecting portion of the optical element 9. For example, the diffraction grating as the wavelength selector 10 is formed on a surface of the reflecting portion of the optical element 9. The etalon filter as the wavelength selector 10 is constructed as follows: a high reflecting film is formed on a surface opposite to a surface facing the path rotator 7, in a substrate of flat plate shape made of an optically transparent material, and an etalon is constructed of this substrate to be integrated with the reflecting portion of the optical element 9. The dielectric multilayer filter as the wavelength selector 10 is constructed as follows: a dielectric multilayer film is formed on the surface facing the path rotator 7, in a substrate of flat plate shape made of an optically transparent material, to be integrated with the reflecting portion of the optical element 9.

In the case where the diffraction grating as the wavelength selector 10 is formed on the surface of the reflecting portion of the optical element 9, the orientation of the optical element 9 is adjusted according to the wavelength of the light to be outputted as the final output light from the semiconductor laser apparatus 220. Namely, by adjusting the orientation of the optical element 9, it is feasible to select the wavelength of the light resonating in the external resonator. The adjustment of the orientation of the optical element 9 is performed according to the extending direction and grating spacing of each grating line in the diffraction grating.

Fourteenth Embodiment

Figure 40A:
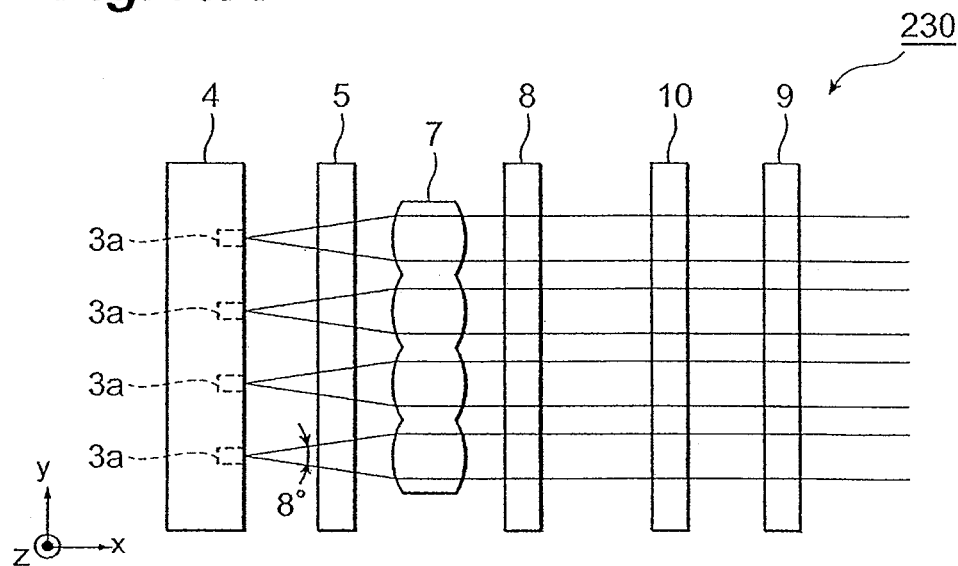
FIG. 40A is a plan view showing a configuration of the fourteenth embodiment of the semiconductor laser apparatus according to the present invention, and FIG. 40B a side view thereof.
Figure 40B:
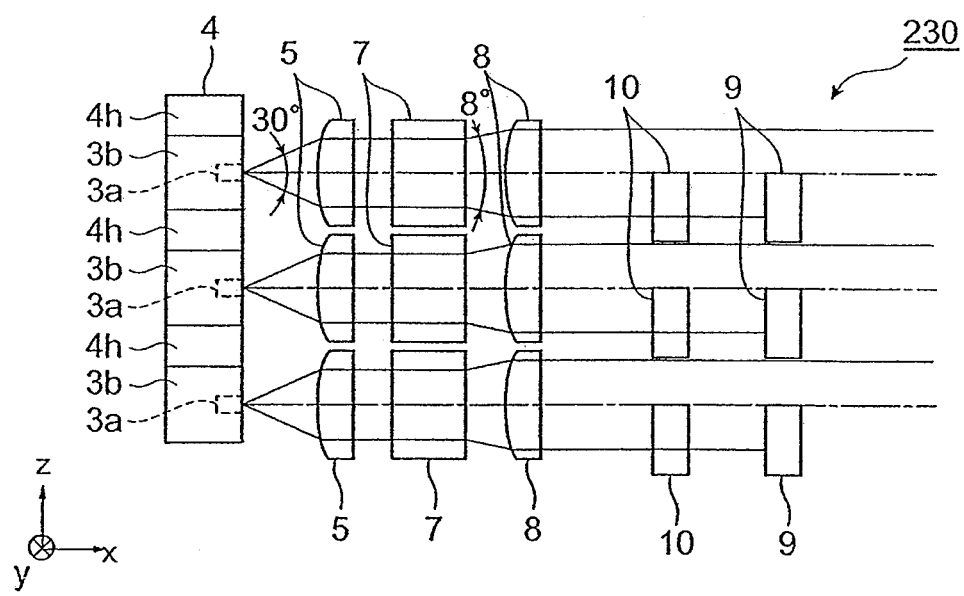

Next, FIG. 40A is a plan view showing a configuration of the fourteenth embodiment of the semiconductor laser apparatus according to the present invention, and FIG. 40B a side view thereof. The semiconductor laser apparatus 230 of the fourteenth embodiment has a semiconductor laser array stack 4, first collimator lenses 5, path rotators 7, second collimator lenses 8, wavelength selectors 10, and optical elements 9.

The semiconductor laser apparatus 230 of the fourteenth embodiment is different from the semiconductor laser apparatus 210 of the twelfth embodiment (FIGS. 38A and 38B) in that the semiconductor laser apparatus 230 has the semiconductor laser array stack 4 including a plurality of semiconductor laser arrays 3 and plural sets of the other components in connection with the inclusion of the plurality of semiconductor laser arrays 3. The configuration of the semiconductor laser apparatus 230 except for this difference is the same as the configuration of the semiconductor laser apparatus 210 of the aforementioned twelfth embodiment, and thus the description thereof is omitted herein.

The semiconductor laser array stack 4 has a configuration similar to that in the fifth embodiment (FIG. 17). The semiconductor laser array stack 4, as shown in this FIG. 17, has the structure in which a plurality of semiconductor laser arrays 3 and a plurality of heat sinks 4h are alternately arranged along the z-axis direction. The heat sinks 4h cool the semiconductor laser arrays 3. The heat sinks 4h have a cooling water path formed by combining copper members of flat plate shape. Cooling water circulates in this cooling water path.

Each semiconductor laser array 3 has a configuration similar to that in the first embodiment (FIGS. 3, 4A, and 4B). Each first collimator lens 5 also has a configuration similar to that in the first embodiment (FIG. 6). Each path rotator 7 has a configuration similar to that in the first embodiment (FIG. 7). Each second collimator lens 8 has a configuration similar to the configuration shown in FIG. 14. Each wavelength selector 10 has a configuration similar to that in the eleventh embodiment. Each optical element 9 also has a configuration similar to that in the eleventh embodiment.

There are the same number of semiconductor laser arrays 3, first collimator lenses 5, path rotators 7, second collimator lenses 8, wavelength selectors 10, and optical elements 9: the first collimator lenses 5 are provided in one-to-one correspondence to the semiconductor laser arrays 3; the path rotators 7 in one-to-one correspondence to the first collimator lenses 5; the second collimator lenses 8 in one-to-one correspondence to the path rotators 7; the wavelength selectors 10 in one-to-one correspondence to the second collimator lenses 8; the optical elements 9 in one-to-one correspondence to the wavelength selectors 10. Each set of semiconductor laser array 3, first collimator lens 5, path rotator 7, second collimator lens 8, wavelength selector 10, and optical element 9 are arranged in the same manner as in the twelfth embodiment.

In the semiconductor laser apparatus 230 of the fourteenth embodiment, light generated in each active layer 3a of the semiconductor laser array 3 resonates in the resonance path to make the spatial transverse mode closer to the single mode, and the laser light with the divergence angle reduced by the configuration to make the spatial transverse mode closer to the single mode can be outputted from the output path to the outside. Therefore, the semiconductor laser apparatus 230 is able to reduce the divergence angle of the final output light. Since the semiconductor laser apparatus 230 is provided with the wavelength selectors 10, it is able to reduce the spectral width of the final output light.

The present invention is not limited to the above-described embodiments, but can be modified in various ways. For example, in each of the eleventh to fourteenth embodiments, each wavelength selector 10 may be a transmitting element provided separately from the reflecting portion of the optical element 9, or a reflecting element provided on the reflecting portion of the optical element 9. In these embodiments, the second collimator lens 8 may or may not be provided. In the fourteenth embodiment, the optical elements 9 may be provided in one-to-one correspondence to the respective semiconductor laser arrays 3, but may be an optical element in which reflecting portions and transmitting portions of stripe shape are arranged along the z-axis direction on a common optically transparent substrate.

Fifteenth Embodiment

Figure 41A:
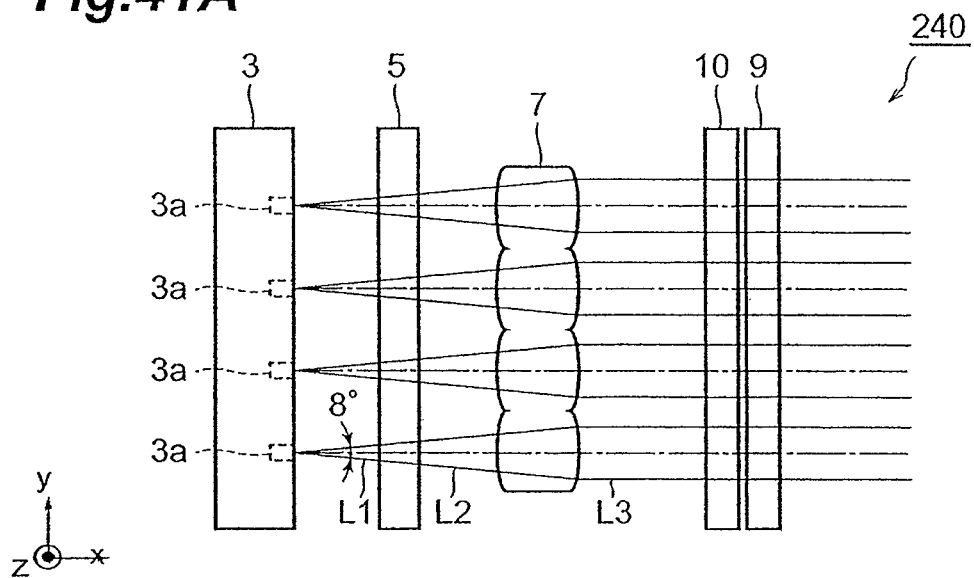
FIG. 41A is a plan view showing a configuration of the fifteenth embodiment of the semiconductor laser apparatus according to the present invention, and FIG. 41B a side view thereof.
Figure 41B:
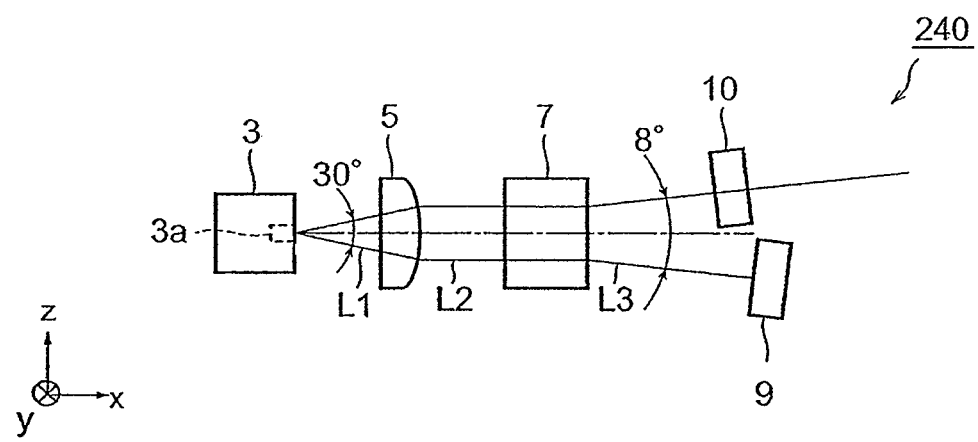

FIG. 41A is a plan view showing a configuration of the fifteenth embodiment of the semiconductor laser apparatus according to the present invention, and FIG. 41B a side view thereof. The semiconductor laser apparatus 240 of the fifteenth embodiment has a semiconductor laser array 3, a first collimator lens 5, a path rotator 7, a wavelength selector 10, and an optical element 9.

The semiconductor laser array 3 has a configuration similar to that in the first embodiment (FIG. 3). The semiconductor laser array 3 has a plurality of active layers 3a arrayed in parallel along the y-axis direction. Each active layer 3a emits a beam of laser light along the optical axis A. Here the optical axis A is an axis being parallel to the x-axis and passing the center of the active layer 3a. The front end face (light output surface) of the semiconductor laser array 3 is shown in FIG. 4A and the front end face of each active layer 3a in FIG. 4B. The semiconductor laser array 3 has the structure in which the active layers 3a are aligned at intervals of 300 μm-500 μm in the y-axis direction in the width of 1 cm. The cross section of each active layer 3a has the width of 100 μm-200 μm and the thickness of 1 μm. The front end face of semiconductor laser array 3 is coated with a reflection reducing film having the reflectance of not more than ten and several %.

The first collimator lens 5 has a configuration similar to that in the first embodiment (FIG. 6). The front and back lens surfaces of the first collimator lens 5 are cylindrical surfaces with a generatrix along the y-axis direction. The dimensions of the first collimator lens 5 are the length of 0.4 mm-1 mm in the x-axis direction, the length of 12 mm in the y-axis direction, and the length of 0.6 mm-1 mm in the z-axis direction. The first collimator lens 5 is of an elongated shape along the y-axis direction.

The first collimator lens 5 has no refracting action in the plane including the generatrix direction (y-axis direction) but has the refracting action in the plane perpendicular to the generatrix. Since the beam emitted from each active layer 3a has the large divergence angle in the vertical direction as described above, it is necessary to suppress the divergence of the beam by use of the refracting action, in order to increase the efficiency of collection of the beam. The first collimator lens 5 and the semiconductor laser array 3 are set in such a positional relation that the generatrix of the first collimator lens 5 is perpendicular to the vertical direction (z-axis direction) of the semiconductor laser array 3. By this setup, it is feasible to refract the beam emitted from each active layer 3a, in the plane perpendicular to the generatrix of the first collimator lens 5 and to collimate it. Namely, the first collimator lens 5 refracts and collimates the component in the vertical direction (z-axis direction) of the beam emitted from each active layer 3a. For efficient collimation, the first collimator lens 5 with a large NA (e.g., NA≧0.5) and a short focal point (e.g., f≦1.5 mm) is located so that the principal point thereof is at the focal length thereof from the active layer 3a. The beams emitted from the respective active layers 3a in the semiconductor laser array 3 are incident all to one first collimator lens 5.

The path rotator 7 has a structure similar to that in the first embodiment (FIG. 7). The path rotator 7 is made of an optically transparent material such as glass or quartz. The length in the x-axis direction is 1.5 mm, the length in the y-axis direction is 12 mm, and the length in the z-axis direction is 1.5 mm. As described, the path rotator 7 is of an elongated shape along the y-axis direction.

The path rotator 7 rotates the transverse section of each beam collimated in the z-axis direction by the first collimator lens 5, by about 90°. All the beams emitted from the first collimator lens 5 are incident to the path rotator 7. The path rotator 7 has an input surface 7a and an output surface 7b facing each other. This input surface 7a has a plurality of cylindrical surfaces with the width of 0.5 mm arranged in parallel. These cylindrical surfaces extend at the angle of 45° relative to the y-axis direction. The number of these cylindrical surfaces is equal to the number of active layers 3a in the semiconductor laser array 3. Namely, these cylindrical surfaces are in one-to-one correspondence to the active layers 3a. Similarly, the output surface 7b also has a plurality of cylindrical surfaces with the width of 0.5 mm arranged in parallel. These cylindrical surfaces also extend at the angle of 45° relative to the y-axis direction. These cylindrical surfaces are also in one-to-one correspondence to the active layers 3a.

Therefore, the beams emitted from the respective active layers 3a in the semiconductor laser array 3 are incident all to one corresponding path rotator 7.

Other examples of the path rotator are described in aforementioned Document 1.

Figure 42:
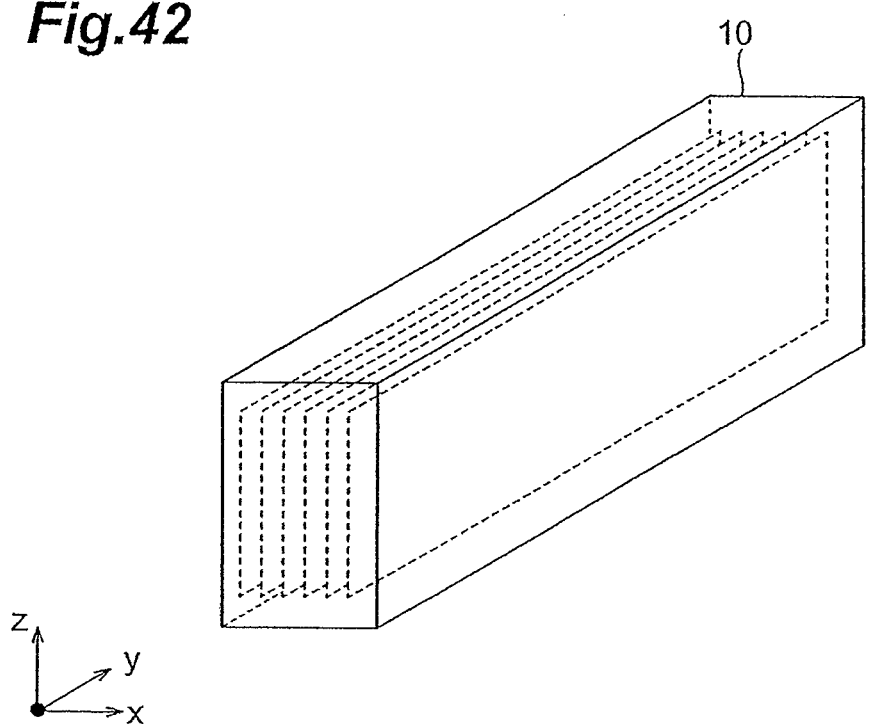
FIG. 42 is a perspective view showing a configuration of a wavelength selector applied to the semiconductor laser apparatus of the fifteenth embodiment.

FIG. 42 is a perspective view showing the configuration of the wavelength selector 10. The wavelength selector 10 has a periodic distribution of refractive indices in the thickness direction (approximately in the x-axis direction) and is able to Bragg-reflect part of incident light. The wavelength selector 10 receives each beam outputted from the path rotator 7, as normally incident light, reflects part of light of a specific wavelength satisfying the Bragg condition in the normally incident light, returns at least part of the reflected light to the active layer 3a having emitted the light, and transmits the rest of the light of the specific wavelength. The known wavelength selector 10 of this type is, for example, a product LuxxMaster™ available from PD-LD Inc.

The optical element 9 is constructed in a structure in which a total reflecting film is formed on one surface (a surface facing the path rotator 7) of a substrate of flat plate shape made of an optically transparent material, and a reflecting portion constructed of this total reflecting film reflects the light incident from the path rotator 7, at a high reflectance (e.g., the reflectance of not less than 99.5%). The optical element 9 is preferably constructed as follows: the reflecting portion is inclined at a certain inclination angle relative to the plane perpendicular to the optical axis of each beam emitted from the path rotator 7, and the inclination angle is smaller than a half of the divergence angle in the z-axis direction of the beam emitted from the path rotator 7. This permits at least part of incident light to the reflecting portion of the optical element 9 to be normally incident to the reflecting portion, and permits the reflected light to return through the path opposite to the input path to the active layer 3a. The reflecting portion of the optical element 9 and the wavelength selector 10 are located at different positions in the z-axis direction. A laser resonator is constructed between the reflecting portion of the optical element 9 and the wavelength selector 10.

Figure 43:
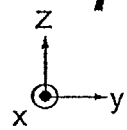
FIG. 43A shows transverse sections (output patterns) of beams generated in active layers before incidence to the first collimator lens, FIG. 43B transverse sections of the beams after passage of the beams emitted from the active layers, through the first collimator lens.
FIG. 43C is an illustration showing transverse sections of the beams transmitted by the first collimator lens, after passage through the path rotator.

Subsequently, the operation of the semiconductor laser apparatus 240 of the fifteen embodiment will be described using FIGS. 41A-41B and 43A-43C. FIG. 43A shows the transverse sections (output patterns) before incidence of the beams generated in the active layers 3a, to the first collimator lens 5, FIG. 43B the transverse sections of the beams after passage of the beams emitted from the active layers 3a, through the first collimator lens 5, and FIG. 43C is an illustration showing the transverse sections of the beams after passage of the beams transmitted by the first collimator lens 5, through the path rotator 7.

Each active layer 3a in the semiconductor laser array 3 emits a beam L1 into the x-axis direction. This beam L1 has the divergence angle of 8° in the y-axis direction and the divergence angle of 30° in the z-axis direction with the center on the optical axis (chain line in FIGS. 41A and 41B). The length in the vertical direction (z-axis direction) of the transverse section of each active layer 3a is one hundredth to one two hundredth of the length in the horizontal direction (y-axis direction). Therefore, the transverse section of each beam L1 is horizontally elongated upon emission from the active layer 3a. The beam emitted from each active layer 3a diverges before arrival at the first collimator lens 5 (FIG. 43A). The vertical length of the transverse section of each beam incident to the first collimator lens 5 is determined by the focal length of the first collimator lens 5.

The beam L1 emitted from each active layer 3a is incident to the first collimator lens 5. The first collimator lens 5 refracts the beam L1 in the plane perpendicular to the y-axis (i.e., a plane parallel to the xz plane), and outputs the refracted light as a beam L2 in the x-axis direction. The beam L2 has the divergence angle of about 0.2° in the z-axis direction and is not subjected to refraction in the y-axis direction. Namely, after the emission from the first collimator lens 5, the horizontal divergence angle is larger than the vertical divergence angle, and thus the transverse section of the beam at a position distant from the first collimator lens 5 has a horizontally elongated shape (FIG. 43B). Since the first collimator lens 5 has no refracting action in the plane including the y-axis, the divergence angle in the y-axis direction is an angle similar to that of the beam L1.

Each beam L2 refracted and outputted by the first collimator lens 5 is incident to the path rotator 7 before adjacent beams intersect with each other. The path rotator 7 rotates the transverse section of each beam L2 by about 90° and outputs the rotated beam as a beam L3 into the x-axis direction. The beam L2 collimated in the z-axis direction is converted here into the beam L3 collimated in the y-axis direction. This results in converting the transverse section of each beam into a shape long in the z-axis direction and short in the horizontal direction (FIG. 43C). Since the beam L3 results from the rotation of the transverse section of the beam L2 by about 90°, the direction of the divergence angle of the beam L2 is also rotated by about 90°. Namely, the beam L3 becomes nearly parallel light in the y-axis direction and has the divergence angle in the z-axis direction. Since the beam L3 is nearly parallel light in the y-axis direction, it is feasible to prevent adjacent beams L3 from intersecting with each other. The beam L3 emitted through the rotation of the transverse section by the path rotator 7 is incident to the reflecting portion of the optical element 9 or to the wavelength selector 10.

At least part of the light from the path rotator 7 impinging on and reflected by the reflecting portion of the optical element 9 travels in the opposite direction to the optical path from the active layer 3a to the reflecting portion of the optical element 9 to return to the active layer 3a. The return beam travels back to the active layer 3a of the semiconductor laser array 3 to be amplified in the active layer 3a, and the beam further travels to the end face (reflecting surface) opposite to the end face (output surface) from which the laser light is emitted from the semiconductor laser array 3. The beam reaching the reflecting surface is reflected by the reflecting surface and is again emitted from the active layer 3a into the x-axis direction. A part of the emitted beam travels again through the optical path to the reflecting portion of the optical element 9 or to the wavelength selector 10.

On the other hand, part of light of the specific wavelength in the light incident from the path rotator 7 to the wavelength selector 10 is Bragg-reflected, and the rest is transmitted by the wavelength selector 10. At least part of the reflected light travels in the opposite direction to the optical path from the active layer 3a to the wavelength selector 10 to return to the active layer 3a. The return beam travels back to the active layer 3a of the semiconductor laser array 3 to be amplified in the active layer 3a, and further travels to the end face (reflecting surface) opposite to the end face (output surface) from which the laser light is emitted from the semiconductor laser array 3. The beam reaching the reflecting surface is reflected by the reflecting surface and is outputted again from the active layer 3a into the x-axis direction. A part of the emitted beam travels again through the optical path to the reflecting portion of the optical element 9 or to the wavelength selector 10.

As described above, the external laser resonator is constructed between the reflecting portion of the optical element 9 and the wavelength selector 10, each active layer 3a is located inside the resonator, and the beam resonates in part in the external resonator to cause induced emission in the active layer 3a. This makes the spatial transverse mode of laser light from the induced emission closer to the single mode. On the other hand, the light transmitted by the wavelength selector 10 is emitted to the outside of the semiconductor laser apparatus 240. This becomes final output light from the semiconductor laser apparatus 240.

As described above, the semiconductor laser apparatus 240 of the fifteenth embodiment has the resonance path including the path of the beam reflected by the reflecting portion of the optical element 9, and the output path including the path of the beam transmitted by the transmitting portion. In the semiconductor laser apparatus 240, therefore, the light generated in each active layer 3a in the semiconductor laser array 3 resonates in the resonance path to make the spatial transverse mode closer to the single mode, and the laser light with the divergence angle reduced by the configuration to make the spatial transverse mode closer to the single mode can be outputted from the output path to the outside. Therefore, the semiconductor laser apparatus 240 is able to reduce the divergence angle of the final output light.

Since the resonance path and the output path are separated by the arrangement of the reflecting portion in the optical element 9 and the wavelength selector 10, the reflecting portion of total reflection is provided without use of a half mirror or the like for separation of the two paths. Therefore, the semiconductor laser apparatus obtains stronger resonance light and stronger output light than in the case where the half mirror or the like is used to form the path of resonance light and the path of output light.

Furthermore, since the semiconductor laser apparatus 240 of the fifteen embodiment has the wavelength selector 10 on one side of the resonator, the light of the specific wavelength selected by this wavelength selector 10 selectively resonates in the external resonator, and the light of this specific wavelength can be outputted to the outside. Therefore, the semiconductor laser apparatus 240 is able to narrow the spectral width of the final output light.

Figure 44:
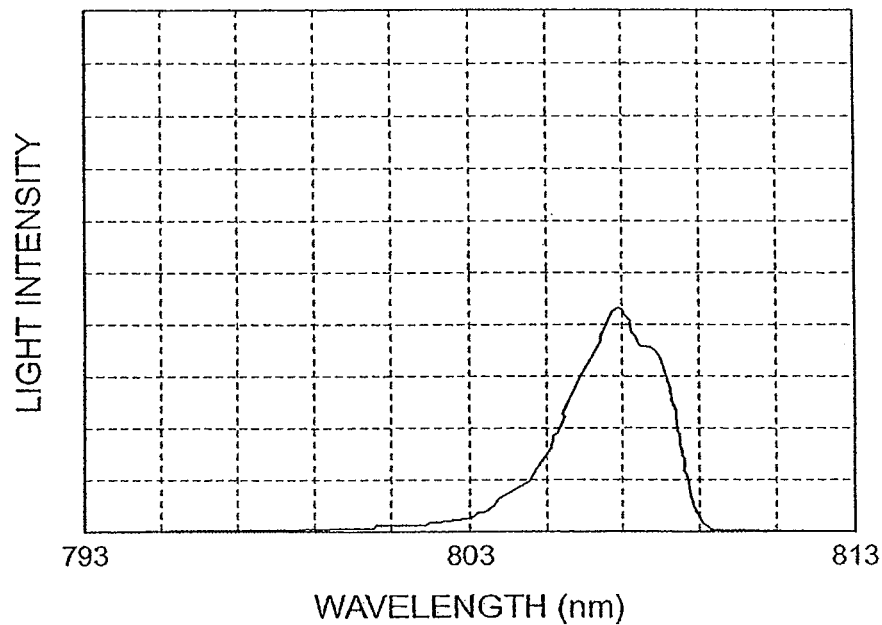
FIG. 44 is a spectrum of light generated in an active layer of a semiconductor laser array applied to the semiconductor laser apparatus of the fifteenth embodiment.
Figure 45:
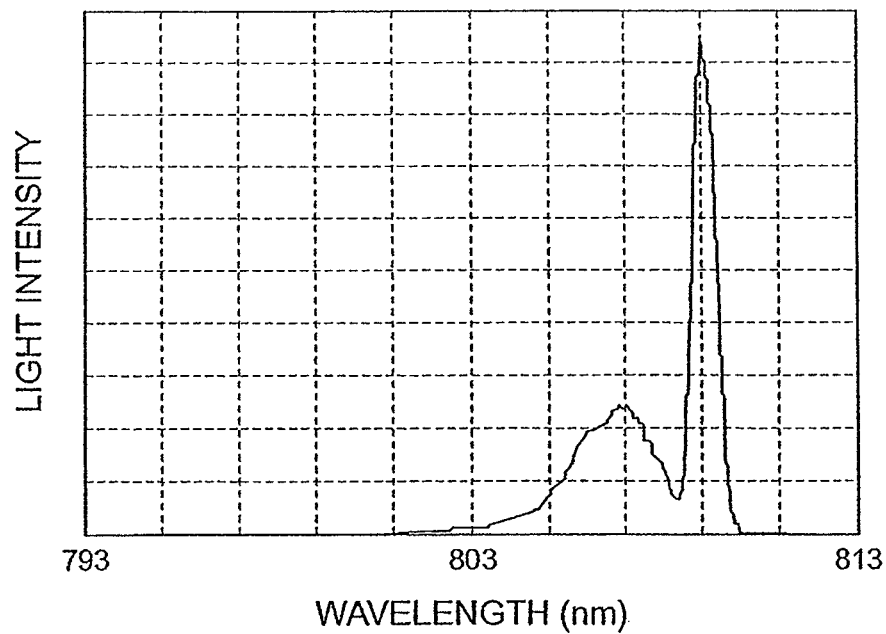
FIG. 45 is a spectrum of light transmitted by a wavelength selector applied to the semiconductor laser apparatus of the fifteenth embodiment.

FIG. 44 is a spectrum of the light generated in the active layer 3a of the semiconductor laser array 3, and FIG. 45 a spectrum of the light transmitted and emitted from the wavelength selector 10 of the semiconductor laser apparatus 240 of the fifteenth embodiment. As seen from a comparison between the two figures, the laser light outputted from the semiconductor laser apparatus 240 has a peak at the wavelength of 809 nm satisfying the Bragg condition in the wavelength selector 10, and has a narrowed spectral width.

Sixteenth Embodiment

Figure 46A:
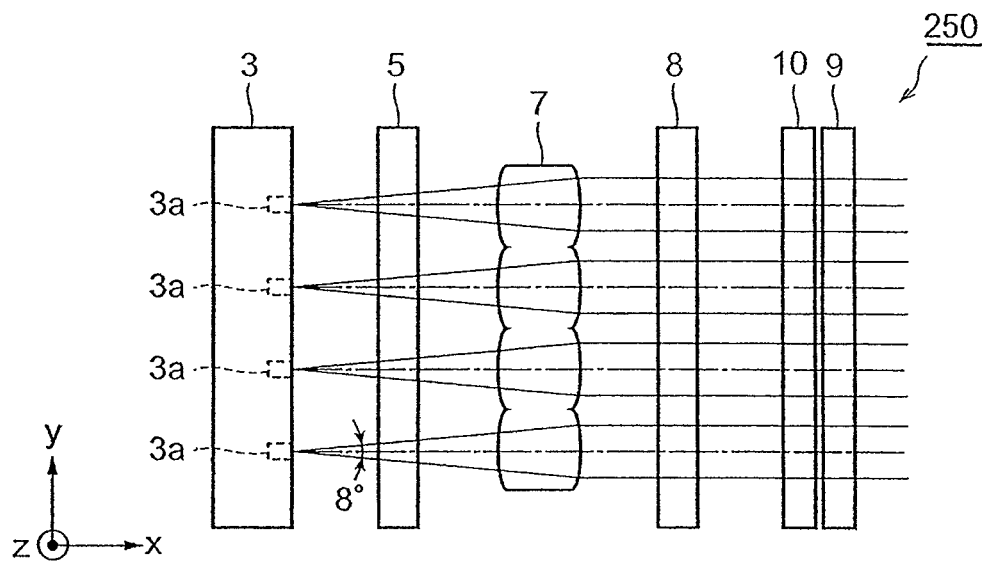
FIG. 46A is a plan view showing a configuration of the sixteenth embodiment of the semiconductor laser apparatus according to the present invention, and FIG. 46B a side view thereof.
Figure 46B:
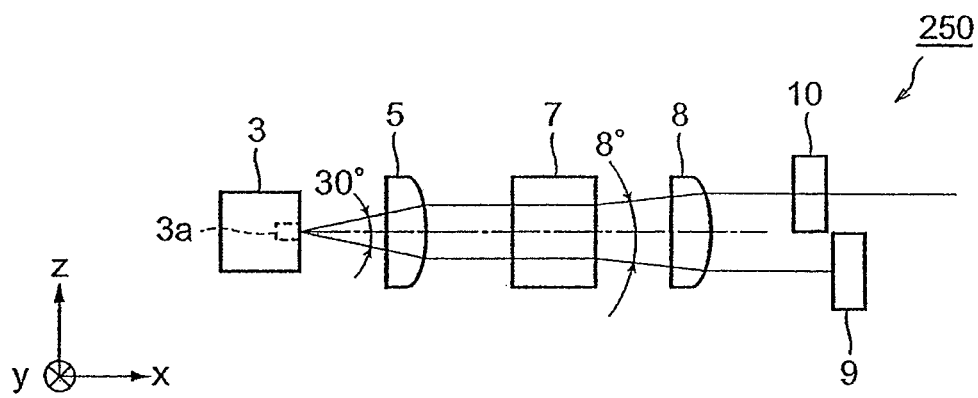

FIG. 46A is a plan view showing a configuration of the sixteenth embodiment of the semiconductor laser apparatus according to the present invention, and FIG. 46B a side view thereof. The semiconductor laser apparatus 250 of the sixteenth embodiment has a semiconductor laser array 3, a first collimator lens 5, a path rotator 7, a second collimator lens 8, a wavelength selector 10, and an optical element 9.

The semiconductor laser apparatus 250 of the sixteenth embodiment is different from the semiconductor laser apparatus 240 of the fifteenth embodiment (FIGS. 41A and 41B) in that the second collimator lens 8 is provided between the wavelength selector 10 and optical element 9, and the path rotator 7. The configuration of the semiconductor laser apparatus 250 except for this difference is much the same as the configuration of the semiconductor laser apparatus 240 of the aforementioned fifteenth embodiment.

The second collimator lens 8 has much the same shape as the shape of the first collimator lens 5 shown in FIG. 6. The front and back lens surfaces of this second collimator lens 8 are cylindrical surfaces with a generatrix along the y-axis direction. The second collimator lens 8 has no refracting action in the plane including the generatrix direction, but has the refracting action in the plane perpendicular to the generatrix. The length in the y-axis direction is 12 mm, the length in the x-axis direction 0.5-3 mm, and the length in the z-axis direction 1.5-10 mm. The beams emitted from the path rotator 7 are incident all to the second collimator lens 8. The second collimator lens 8 is so set that the generatrix thereof is perpendicular to the z-axis direction. Since the second collimator lens is so set, it is able to refract each beam emitted from the path rotator 7, in the plane perpendicular to the generatrix of the second collimator lens 8 to make it closer to parallel light.

In the semiconductor laser apparatus 250 of the sixteenth embodiment, the second collimator lens 8 is able to refract each beam transmitted by the path rotator 7, so as to make the beam closer to parallel light in the plane perpendicular to the longitudinal direction. This also makes it feasible to increase the distance between the path rotator 7 and the wavelength selector 10 and also makes it feasible to increase the distance between the optical element 9 or the wavelength selector 10 and the path rotator 7 and to offer greater degree of freedom of design for the semiconductor laser apparatus 250. Since each beam traveling from the second collimator lens 8 toward the wavelength selector 10 and the optical element 9 is a nearly parallel beam, each of the wavelength selector 10 and optical element 9 is arranged substantially in parallel with the yz plane.

In the semiconductor laser apparatus 250 of the sixteenth embodiment, the optical element 9 and the wavelength selector 10 may be elements separated from each other, but they may be elements formed on a common substrate of flat plate shape. Specifically, a reflecting portion for reflecting the light is provided in a partial region of a substrate of flat plate shape, and the wavelength selector for Bragg-reflecting part of the light of the specific wavelength is provided in another region. This configuration decreases the number of parts constituting the semiconductor laser apparatus and facilitates the assembly thereof.

Seventeenth Embodiment

Figure 47A:
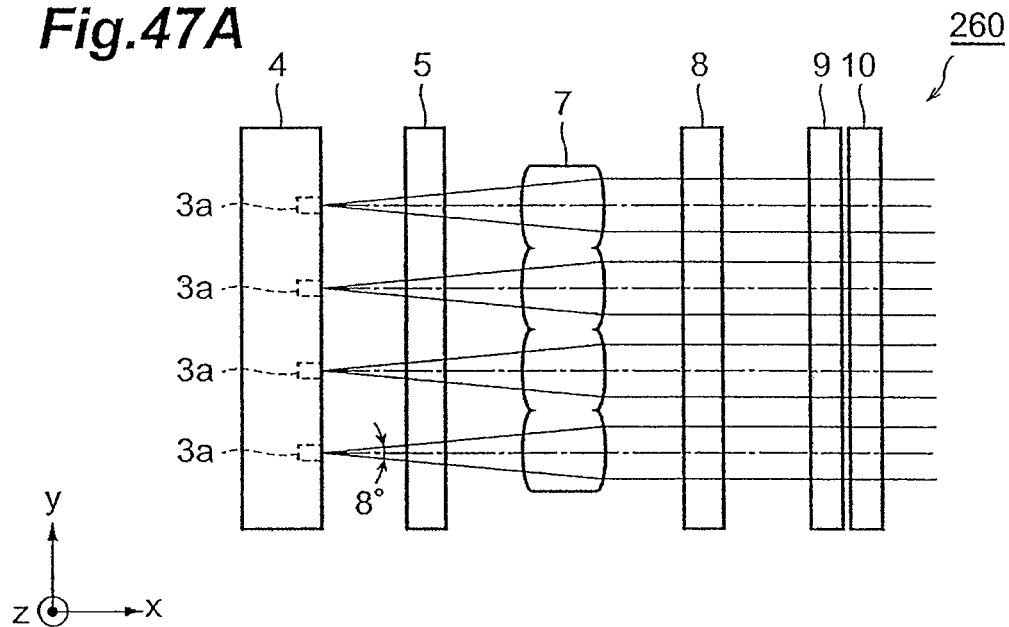
FIG. 47A is a plan view showing a configuration of the seventeenth embodiment of the semiconductor laser apparatus according to the present invention, and FIG. 47B a side view thereof.
Figure 47B:
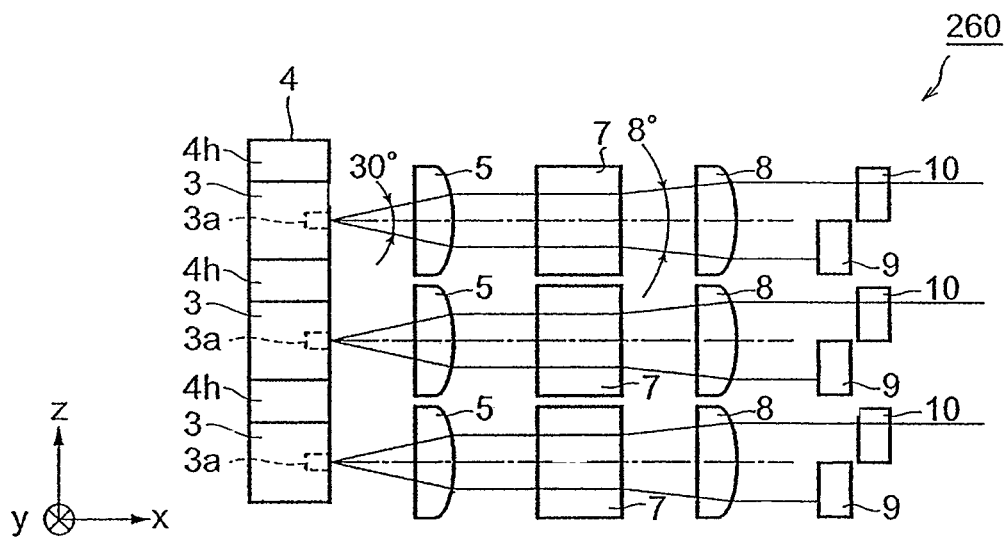

FIG. 47A is a plan view showing a configuration of the seventeenth embodiment of the semiconductor laser apparatus according to the present invention, and FIG. 47B a side view thereof. The semiconductor laser apparatus 260 of the seventeenth embodiment has a semiconductor laser array stack 4, first collimator lenses 5, path rotators 7, second collimator lenses 8, wavelength selectors 10, and optical elements 9.

The semiconductor laser apparatus 260 of the seventeenth embodiment is different from the semiconductor laser apparatus 250 of the sixteenth embodiment (FIGS. 46A and 46B) in that the semiconductor laser apparatus 260 has the semiconductor laser array stack 4 including a plurality of semiconductor laser arrays 3 and plural sets of the other components in connection with the inclusion of the plurality of semiconductor laser arrays 3. The configuration of the semiconductor laser apparatus 260 except for this difference is the same as the configuration of the semiconductor laser apparatus 250 of the sixteenth embodiment described above.

The semiconductor laser array stack 4 has a configuration similar to that in the fifth embodiment (FIG. 17). The semiconductor laser array stack 4, as shown in this FIG. 17, has the structure in which a plurality of semiconductor laser arrays 3 and a plurality of heat sinks 4h are alternately arranged along the z-axis direction. The heat sinks 4h cool the semiconductor laser arrays 3. The heat sinks 4h have a cooling water path formed by combining copper members of flat plate shape. Cooling water circulates in this cooling water path.

Each semiconductor laser array 3 has a configuration similar to that in the first embodiment (FIG. 3). Each first collimator lens 5 has a configuration similar to that in the first embodiment (FIG. 6). Each path rotator 7 also has a configuration similar to that in the first embodiment (FIG. 7). Each second collimator lens 8 has the structure shown in FIG. 14. Each wavelength selector 10 has a configuration similar to that in the fifteenth embodiment (FIG. 42). Each optical element 9 has a configuration similar to that in the first embodiment. The semiconductor laser arrays 3, first collimator lenses 5, path rotators 7, second collimator lenses 8, wavelength selectors 10, and optical elements 9 are arranged in the same manner as in the aforementioned sixteenth embodiment.

In the semiconductor laser apparatus 260 of the seventeenth embodiment, the light generated in the active layers 3a of the semiconductor laser arrays 3 resonates in the resonance paths to make the spatial transverse mode closer to the single mode, and the laser light with the divergence angle reduced by the configuration to make the spatial transverse mode closer to the single mode can be outputted from the output paths to the outside. Therefore, the semiconductor laser apparatus 260 is able to decrease the divergence angle of the final output light. Since the semiconductor laser apparatus 260 is provided with the wavelength selectors 10, it is able to reduce the spectral width of the final output light.

In the semiconductor laser apparatus 260 of the seventeenth embodiment, the optical elements 9 and the wavelength selectors 10 may be separate elements from each other, and may also be elements formed on a common substrate of flat plate shape. Specifically, reflecting portions for reflecting the light are provided in partial regions on a substrate of flat plate shape, the wavelength selectors for Bragg-reflecting part of the light of the specific wavelength are provided in other regions, and the reflecting portions and wavelength selectors are alternately arranged in the z-axis direction. This reduces the number of parts constituting the semiconductor laser apparatus and facilitates the assembly thereof.

Eighteenth Embodiment

Figure 48A:
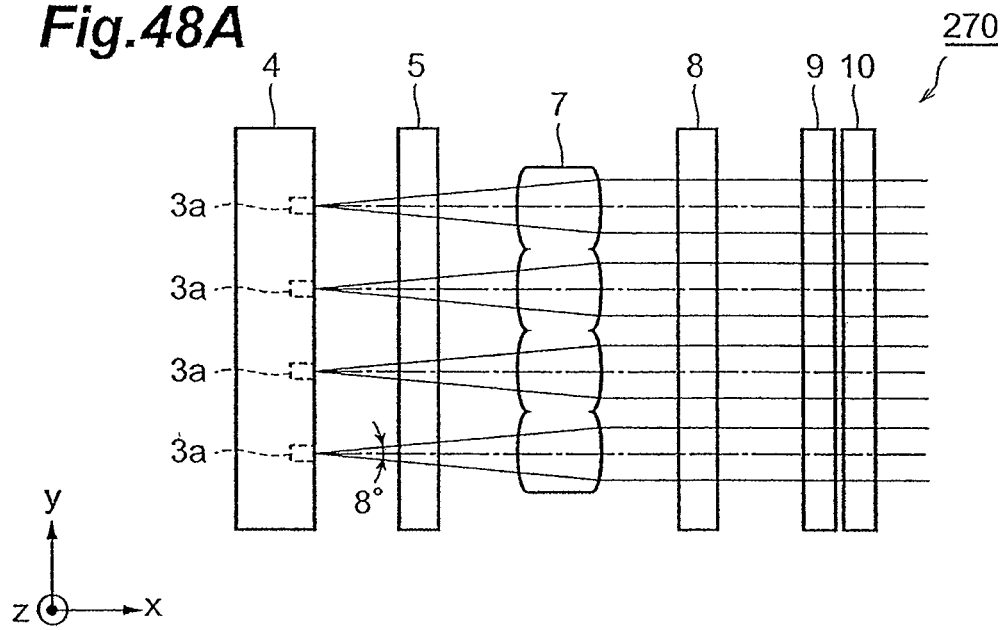
FIG. 48A is a plan view showing a configuration of the eighteenth embodiment of the semiconductor laser apparatus according to the present invention, and FIG. 48B a side view thereof.
Figure 48B:
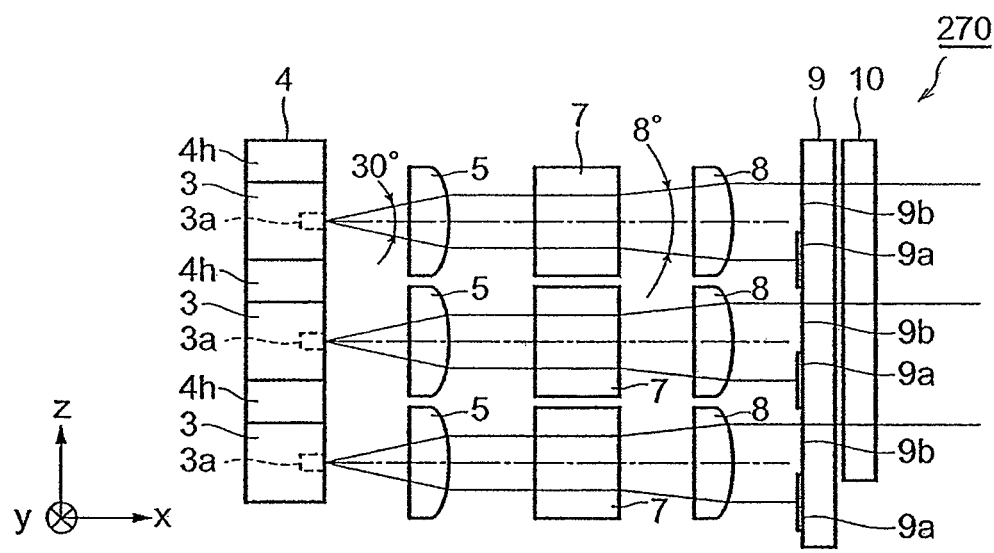

Next, FIG. 48A is a plan view showing a configuration of the eighteenth embodiment of the semiconductor laser apparatus according to the present invention, and FIG. 48B a side view thereof. The semiconductor laser apparatus 270 of this eighteenth embodiment has a semiconductor laser array stack 4, first collimator lenses 5, path rotators 7, second collimator lenses 8, a wavelength selector 10, and an optical element 9.

The semiconductor laser apparatus 270 of the eighteenth embodiment is different from the semiconductor laser apparatus 260 of the seventeenth embodiment (FIGS. 47A and 47B) in that the wavelength selector 10 is an integral member and the optical element 9 is an integral member. The configuration of the semiconductor laser apparatus 270 except for this difference is the same as the configuration of the semiconductor laser apparatus 100, 240 in the first embodiment and the fifteenth embodiment described above.

Figure 49:
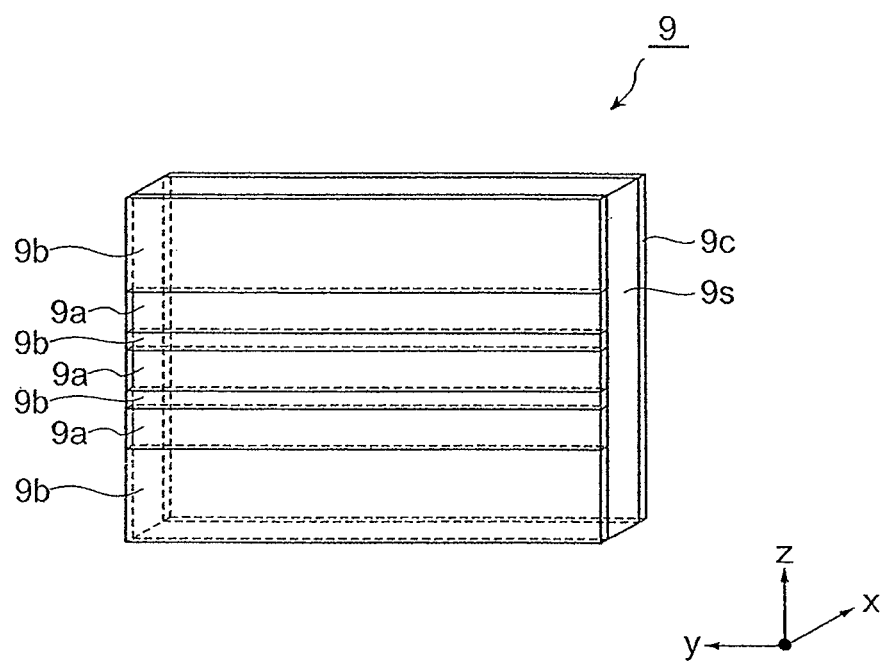
FIG. 49 is a perspective view showing a configuration of an optical element applied to the semiconductor laser apparatus of the eighteenth embodiment.

FIG. 49 is a perspective view showing the configuration of the optical element 9 applied to the semiconductor laser apparatus 270 of the eighteenth embodiment. This FIG. 49 is a perspective view of the optical element 9 as viewed from the second collimator lenses 8 side. The optical element 9 receives each of the beams emitted from the second collimator lenses 8, and reflecting portions 9a and transmitting portions 9b for each received beam are alternately provided along the z-axis direction. Then the optical element 9 returns at least part of light reflected by the reflecting portions 9a, to the active layers 3a having emitted the light. The optical element 9 transmits light incident to the transmitting portions 9b to make the light incident to the wavelength selector 10.

The optical element 9 is an element in which reflecting portions 9a and transmitting portions 9b are alternately formed along the z-axis direction on one surface (a surface on the second collimator lenses 8 side) of a substrate 9s of flat plate shape made of an optically transparent material such as glass or quartz. Each of the reflecting portions 9a and transmitting portions 9b extends in a constant width in the foregoing predetermined direction and along the z-axis direction. Namely, the optical element 9 has a plurality of reflecting portions 9a in a stripe pattern.

Each reflecting portion 9a preferably reflects incident light from the second collimator lens 8 at a high reflectance (e.g., the reflectance of not less than 99.5%) and is preferably constructed, for example, of a total reflecting film. Each transmitting portion 9b preferably transmits incident light from the path rotator 7 at a high transmittance (e.g., the transmittance of not less than 99.5%) and is preferably constructed, for example, of a reflection reducing film. Preferably, a reflection reducing film is formed on the other surface (the surface opposite to the second collimator lenses 8 side) of the substrate 9s.

A pair of reflecting portion 9a and transmitting portion 9b adjacent to each other correspond to one semiconductor laser array 3 and a boundary between those reflecting portion 9a and transmitting portion 9b is parallel to the y-axis direction and is in the transverse section of each beam arriving at the optical element 9 from the second collimator lens 8. Therefore, the reflecting portion 9a reflects a partial sectional portion of each beam arriving at the optical element 9 from the second collimator lens 8, toward the second collimator lens 8. On the other hand, the transmitting portion 9b transmits the rest sectional portion of each beam arriving at the optical element 9 from the second collimator lens 8.

In the semiconductor laser apparatus 270 of this eighteenth embodiment, the light generated in each active layer 3a of the semiconductor laser array 3 also resonates in the resonance path to make the spatial transverse mode closer to the single mode, and the laser light with the divergence angle reduced by the configuration to make the spatial transverse mode closer to the single mode can be outputted from the output path to the outside. Therefore, the semiconductor laser apparatus 270 is able to reduce the divergence angle of the final output light. Since the semiconductor laser apparatus 270 is provided with the wavelength selector 10, it is able to reduce the spectral width of the final output light. Since the apparatus is provided with only one set of wavelength selector 10 and optical element 9, it becomes easier to assemble the semiconductor laser apparatus 270 and to achieve adjustment of the optical axis.

Nineteenth Embodiment

Figure 50A:
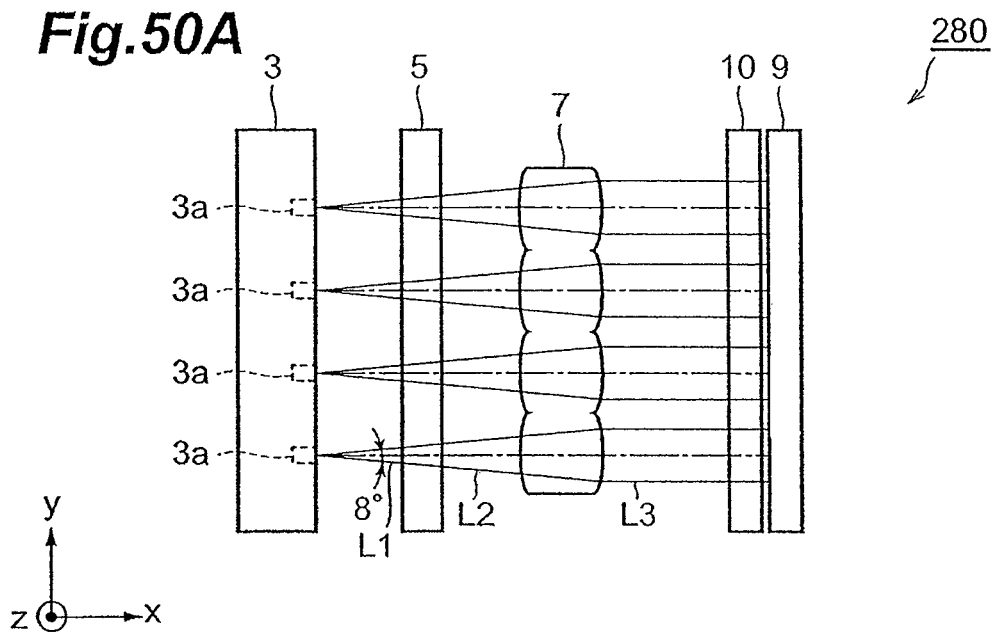
FIG. 50A is a plan view showing a configuration of the nineteenth embodiment of the semiconductor laser apparatus according to the present invention, and FIG. 50B a side view thereof.
Figure 50B:
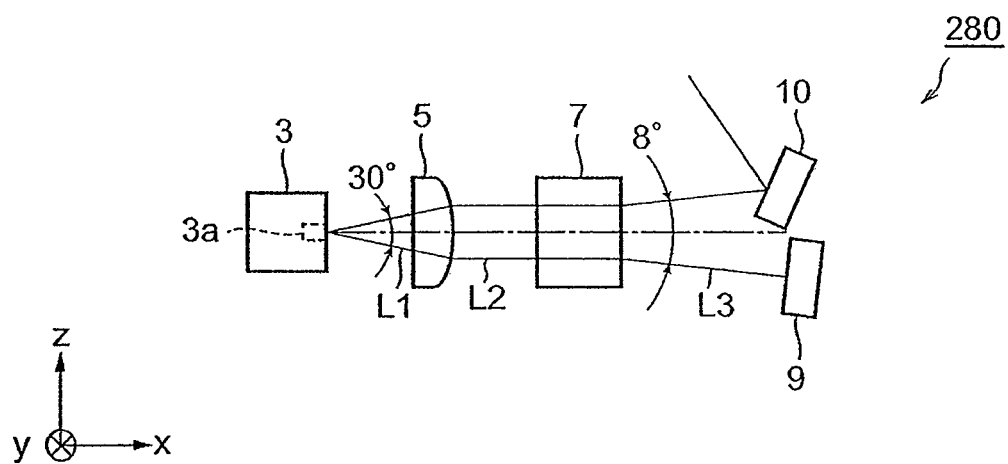

FIG. 50A is a plan view showing a configuration of the nineteenth embodiment of the semiconductor laser apparatus according to the present invention, and FIG. 50B a side view thereof. The semiconductor laser apparatus 280 of the nineteenth embodiment has a semiconductor laser array 3, a first collimator lens 5, a path rotator 7, a wavelength selector 10, and an optical element 9.

The semiconductor laser apparatus 280 of the nineteenth embodiment is different from the semiconductor laser apparatus 240 of the fifteenth embodiment (FIGS. 41A and 41B) in that the wavelength selector 10 is a Raman-Nath diffraction grating element of a reflection type. The configuration of the semiconductor laser apparatus 280 except for this difference is the same as the configuration of the semiconductor laser apparatus 240 of the aforementioned fifteenth embodiment and the description thereof is thus omitted herein.

In this nineteenth embodiment, the wavelength selector 10 receives each beam with the transverse section rotated by the path rotator 7, as incident light, reflects the incident light by Raman-Nath diffraction, returns light of a specific diffraction order (e.g., the first order) of a specific wavelength among diffracted light components, to the active layer having emitted the light, and outputs light (e.g., the 0-order light) except for the light of the specific diffraction order of the specific wavelength, to the outside.

In the semiconductor laser apparatus 280 of this configuration, a beam emitted from each active layer 3a of the semiconductor laser array 3 emerges with divergence in the z-axis direction from each active layer 3a, and is refracted by the first collimator lens 5 to become nearly parallel light in the z-axis direction, and thereafter the path rotator 7 rotates the transverse section of the beam by about 90°. Each beam transmitted by this path rotator 7 is radiated with divergence in the z-axis direction to enter the optical element 9 or the wavelength selector 10.

At least part of light reflected by the optical element 9 is returned to the active layer 3a having emitted the light. The light of the specific diffraction order of the specific wavelength in the light entering the wavelength selector 10 is returned to the active layer 3a having emitted the light. This forms an external resonator between the optical element 9 and the wavelength selector 10 to cause induced emission in the active layer 3a located inside the resonator, so as to achieve lasing. On the other hand, the light except for the light of the specific diffraction order of the specific wavelength in the light entering the wavelength selector 10 is outputted as output light from the semiconductor laser apparatus 280 to the outside. In this semiconductor laser apparatus 280, the final output light also has a small divergence angle and a narrow spectral width.

Twentieth Embodiment

Figure 51A:
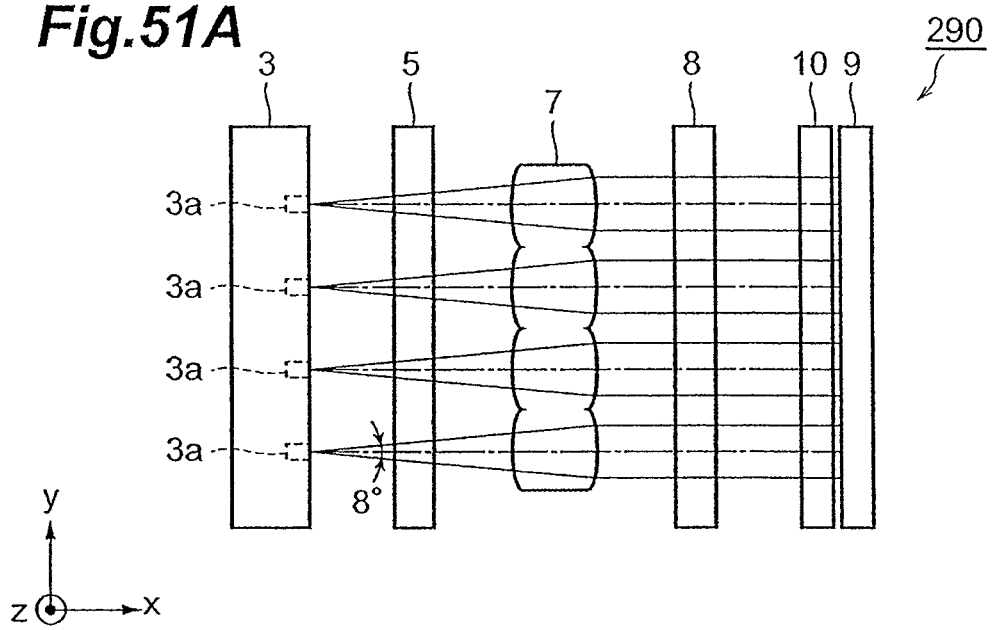
FIG. 51A is a plan view showing a configuration of the twentieth embodiment of the semiconductor laser apparatus according to the present invention, and FIG. 51B a side view thereof.
Figure 51B:
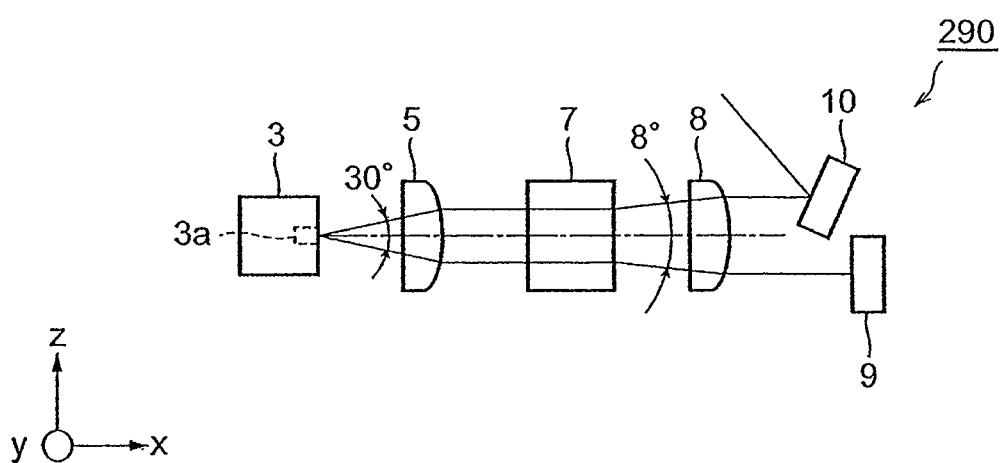

FIG. 51A is a plan view showing a configuration of the twentieth embodiment of the semiconductor laser apparatus according to the present invention, and FIG. 51B a side view thereof. The semiconductor laser apparatus 290 of the twentieth embodiment has a semiconductor laser array 3, a first collimator lens 5, a path rotator 7, a second collimator lens 8, a wavelength selector 10, and an optical element 9.

The semiconductor laser apparatus 290 of the twentieth embodiment is different from the semiconductor laser apparatus 250 of the sixteenth embodiment (FIGS. 46A and 46B) in that the wavelength selector 10 is a Raman-Nath diffraction grating element of the reflection type. The configuration of the semiconductor laser apparatus 290 except for this difference is the same as the configuration of the semiconductor laser apparatus 250 of the aforementioned sixteenth embodiment and the description thereof is thus omitted herein.

In this twentieth embodiment, the wavelength selector 10 receives each beam with the transverse section rotated by the path rotator 7, as incident light, reflects the incident light by Raman-Nath diffraction, returns light of a specific diffraction order (e.g., the first order) of a specific wavelength among diffracted light components, to the active layer having emitted the light, and outputs light (e.g., the 0-order light) except for the light of the specific diffraction order of the specific wavelength, to the outside.

In the semiconductor laser apparatus 290 of this configuration, a beam emitted from each active layer 3a of the semiconductor laser array 3 emerges with divergence in the z-axis direction from each active layer 3a, and is refracted by the first collimator lens 5 to become nearly parallel light in the z-axis direction, and thereafter the path rotator 7 rotates the transverse section of the beam by about 90°. Each beam transmitted by this path rotator 7 is radiated with divergence in the z-axis direction, is further refracted by the second collimator lens 8 to become nearly parallel light, and then enters the optical element 9 or the wavelength selector 10.

At least part of light reflected by the optical element 9 is returned to the active layer 3a having emitted the light. The light of the specific diffraction order of the specific wavelength in the light entering the wavelength selector 10 is returned to the active layer 3a having emitted the light. This forms an external resonator between the optical element 9 and the wavelength selector 10 to cause induced emission in the active layer 3a located inside the resonator, so as to achieve lasing. On the other hand, the light except for the light of the specific diffraction order of the specific wavelength in the light entering the wavelength selector 10 is outputted as output light from the semiconductor laser apparatus 290 to the outside. In this semiconductor laser apparatus 290, the final output light also has a small divergence angle and a narrow spectral width.

Twenty First Embodiment

Figure 52A:
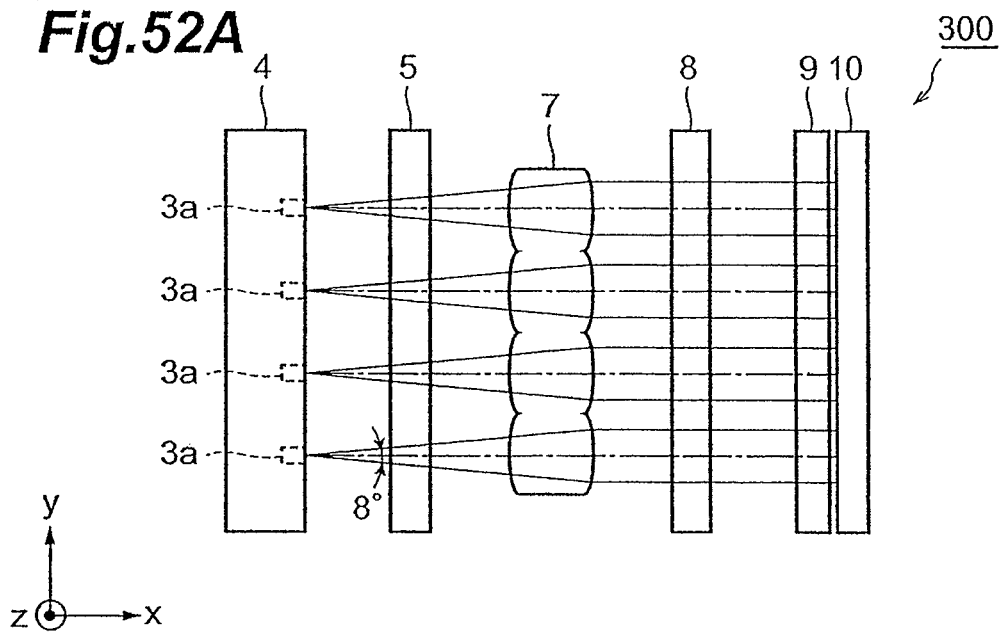
FIG. 52A is a plan view showing a configuration of the twenty first embodiment of the semiconductor laser apparatus according to the present invention, and FIG. 52B a side view thereof.
Figure 52B:
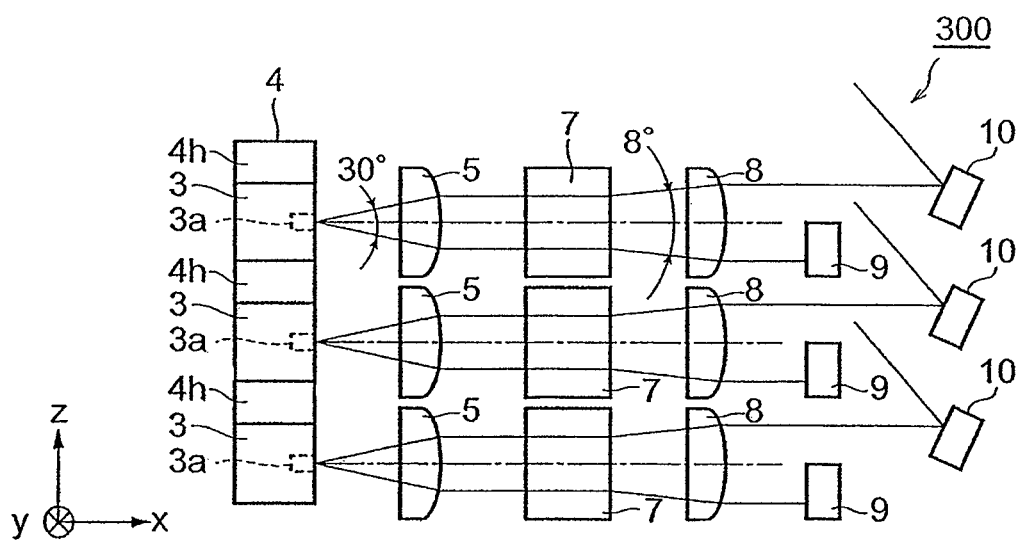

FIG. 52A is a plan view showing a configuration of the twenty first embodiment of the semiconductor laser apparatus according to the present invention, and FIG. 52B a side view thereof. The semiconductor laser apparatus 300 of this twenty first embodiment has a semiconductor laser array stack 4, first collimator lenses 5, path rotators 7, second collimator lenses 8, wavelength selectors 10, and optical elements 9.

The semiconductor laser apparatus 300 of this twenty first embodiment is different from the semiconductor laser apparatus 260 of the seventeenth embodiment (FIGS. 47A and 47B) in that the wavelength selectors 10 are Raman-Nath diffraction grating elements of the reflection type. The configuration of the semiconductor laser apparatus 300 except for this difference is the same as the configuration of the semiconductor laser apparatus 260 of the aforementioned seventeenth embodiment and the description thereof is thus omitted herein.

In this twenty first embodiment, each wavelength selector 10 receives each beam with the transverse section rotated by the path rotator 7, as incident light, reflects the incident light by Raman-Nath diffraction, returns light of a specific diffraction order (e.g., the first order) of a specific wavelength among diffracted light components, to the active layer having emitted the light, and outputs light (e.g., the 0-order light) except for the light of the specific diffraction order of the specific wavelength, to the outside.

In this semiconductor laser apparatus 300, each of the semiconductor laser arrays 3 in the semiconductor laser array stack 4 is provided with a set of first collimator lens 5, path rotator 7, second collimator lens 8, wavelength selector 10, and optical element 9, and each set operates in the same manner as in the case of the aforementioned twentieth embodiment. In the semiconductor laser apparatus 300 of the twenty first embodiment, the final output light also has a small divergence angle and a narrow spectral width.

Twenty Second Embodiment

Figure 53A:
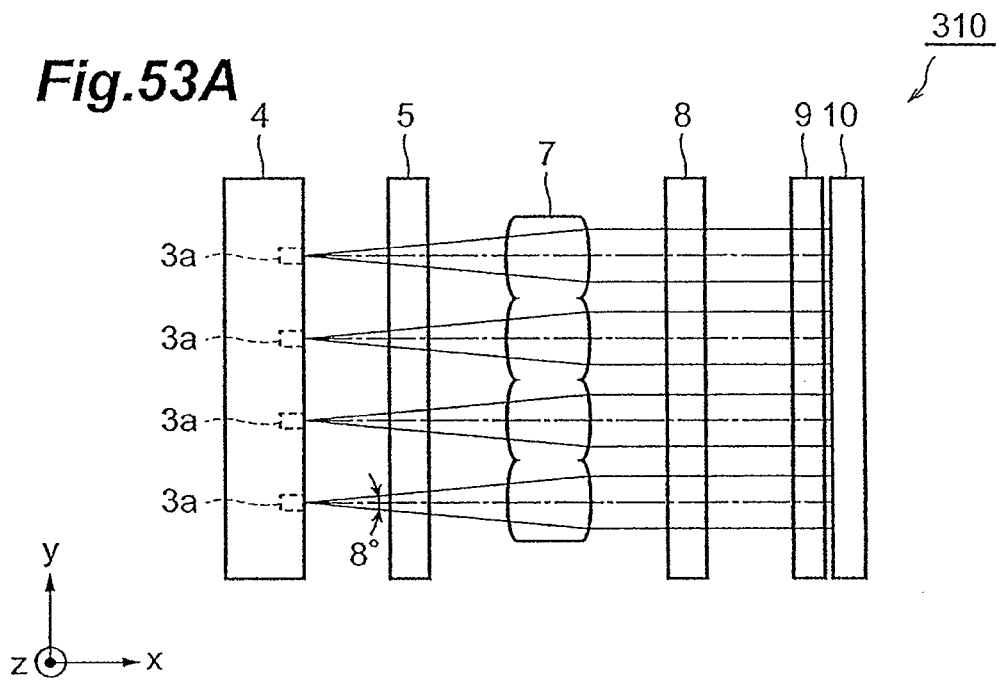
FIG. 53A is a plan view showing a configuration of the twenty second embodiment of the semiconductor laser apparatus according to the present invention, and FIG. 53B a side view thereof.
Figure 53B:
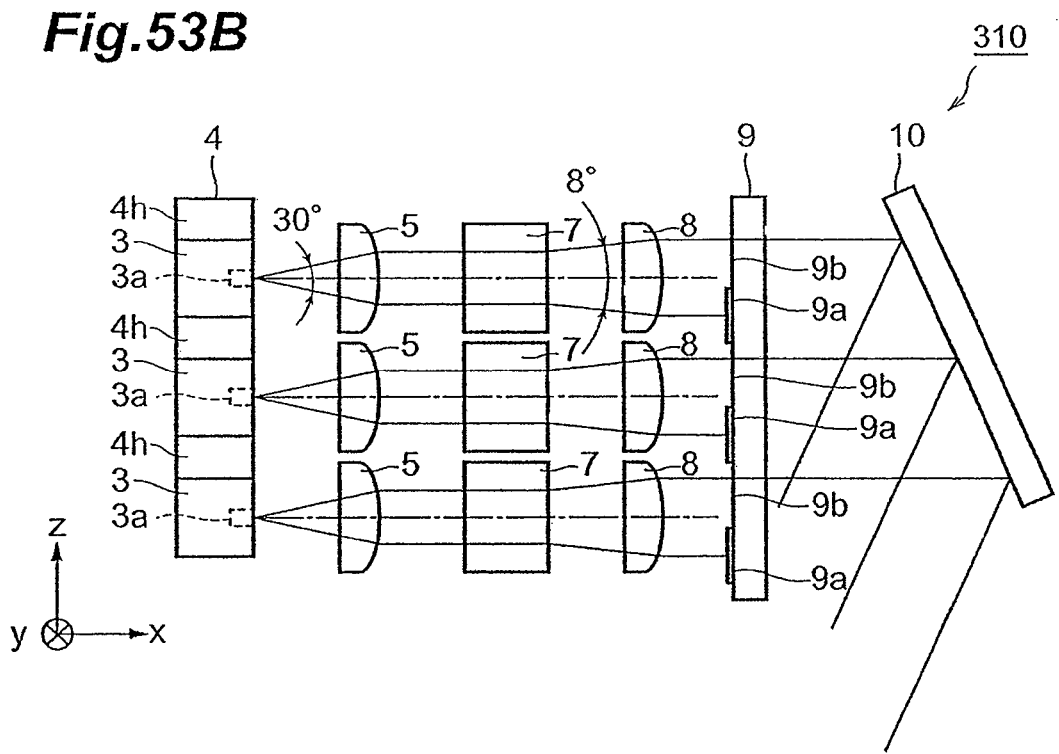

FIG. 53A is a plan view showing a configuration of the twenty second embodiment of the semiconductor laser apparatus according to the present invention, and FIG. 53B a side view thereof. The semiconductor laser apparatus 310 of the twenty second embodiment has a semiconductor laser array stack 4, first collimator lenses 5, path rotators 7, second collimator lenses 8, a wavelength selector 10, and an optical element 9.

The semiconductor laser apparatus 310 of this twenty second embodiment is different from the semiconductor laser apparatus 300 of the twenty first embodiment (FIGS. 52A and 52B) in that the wavelength selector 10 is an integral member and the optical element 9 is an integral member. The configuration of the semiconductor laser apparatus 310 except for this difference is the same as the configuration of the semiconductor laser apparatus 300 of the aforementioned twenty first embodiment.

The semiconductor laser apparatus 310 of the twenty second embodiment operates in the same manner as in the case of the twenty first embodiment. In this semiconductor laser apparatus 310, the final output light also has a small divergence angle and a narrow spectral width. Since the apparatus has only one set of wavelength selector 10 and optical element 9, it is easier to achieve the assembly of the semiconductor laser apparatus 310 and adjustment of the optical axis.

The present invention is not limited to the above-described embodiments, but can be modified in various ways. For example, in each of the fifteenth and sixteenth embodiments, it is also possible to adopt an optical element in which the reflecting portions and transmitting portions as shown in FIG. 49 are alternately arranged along the z-axis direction on a substrate. Each of the seventeenth and eighteenth embodiments may be configured without the second collimator lenses, and in this case, each of the optical element and the wavelength selector is preferably inclined.

Twenty Third Embodiment

Figure 54A:
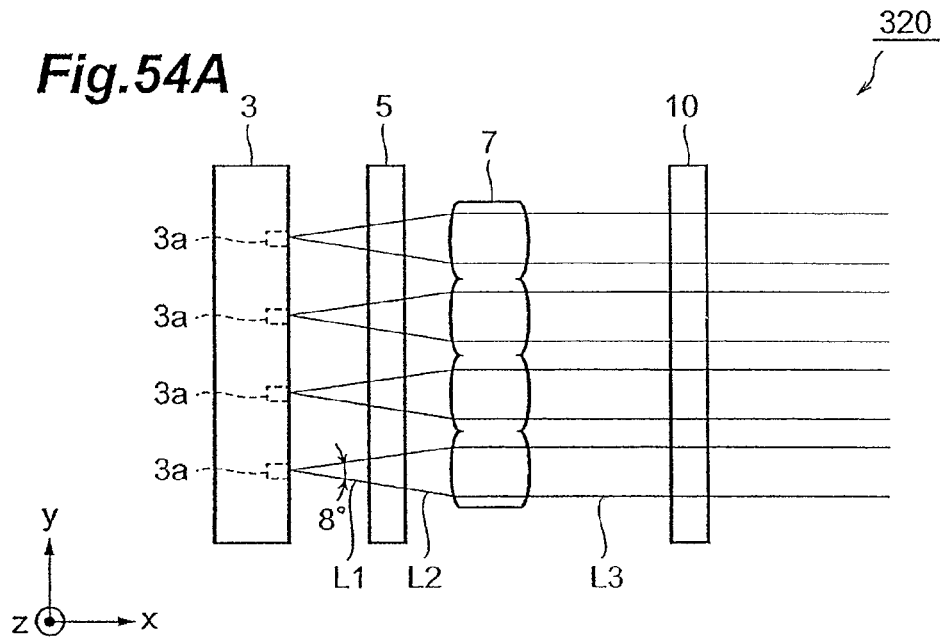
FIG. 54A is a plan view showing a configuration of the twenty third embodiment of the semiconductor laser apparatus according to the present invention, and FIG. 54B a side view thereof.
Figure 54B:
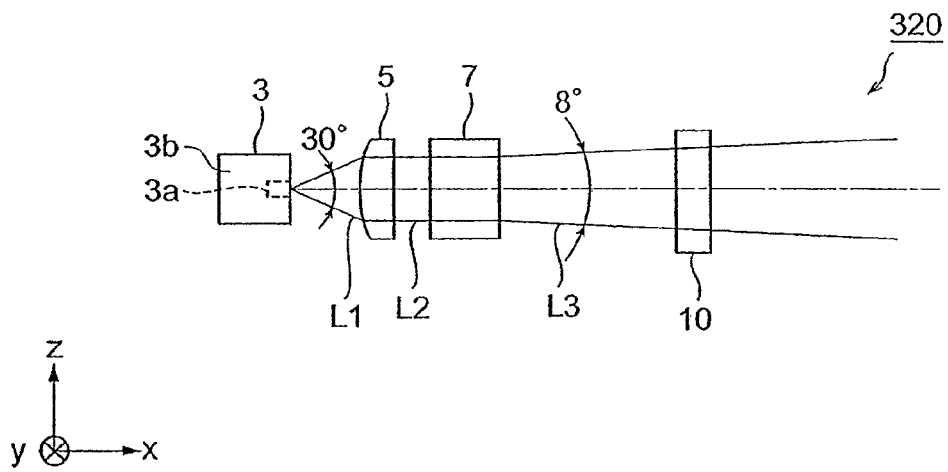
Figure 55:
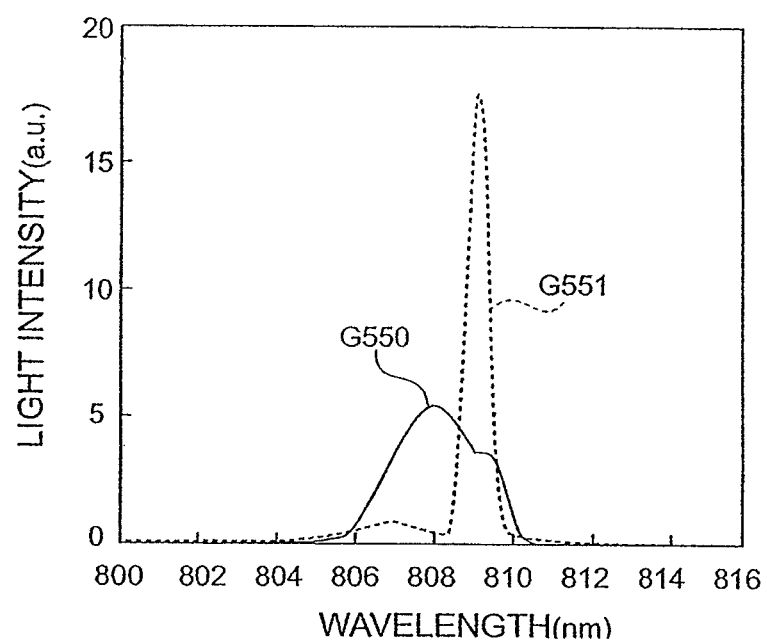
FIG. 55 is a spectrum of output light from a semiconductor laser array applied to the semiconductor laser apparatus of the twenty third embodiment, and a spectrum of output light from an external resonator in the semiconductor laser apparatus of the twenty third embodiment.

FIG. 54A is a plan view (a view from the z-axis direction) showing a configuration of the twenty third embodiment of the semiconductor laser apparatus according to the present invention, and FIG. 54B a side view thereof (a view from the y-axis direction). FIG. 55 shows a spectrum (graph G550) of output light from the semiconductor laser array applied to the semiconductor laser apparatus 320 of the twenty third embodiment, and a spectrum of output light from the semiconductor laser apparatus 320 of the twenty third embodiment (light emitted through an external resonator in the semiconductor laser apparatus 320).

The semiconductor laser apparatus 320 of this twenty third embodiment has a semiconductor laser array 3, a first collimator lens 5, and a path rotator 7 as the semiconductor laser apparatus 100 of the first embodiment does; however, the semiconductor laser apparatus 100 of the first embodiment has the reflecting mirror 9 as an optical element, whereas the semiconductor laser apparatus 320 has a wavelength selector 10 (product LuxxMaster™ with the reflectance of 50% available from PD-LD Inc.).

In the semiconductor laser apparatus 320 of the twenty third embodiment having the structure as described above, as shown in FIG. 55, the laser light outputted from the semiconductor laser apparatus 320 (i.e., the light through the external resonator in the apparatus 320) has a peak at the wavelength of 809 nm satisfying the Bragg condition in the wavelength selector 10, and a narrow spectral width.

Twenty Fourth Embodiment

Figure 56A:
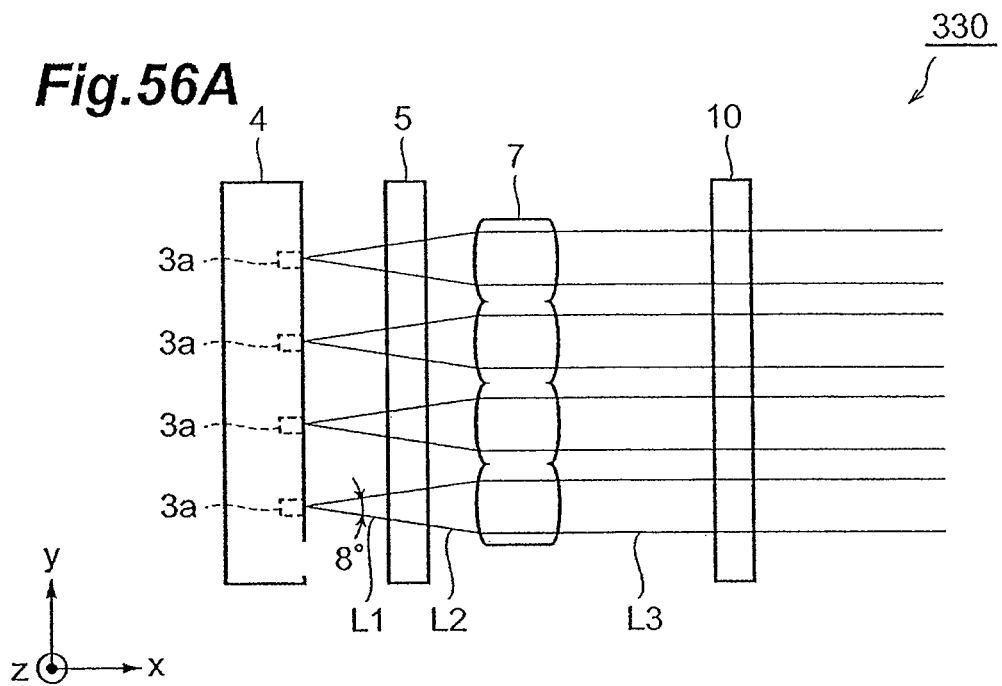
FIG. 56A is a plan view showing a configuration of the twenty fourth embodiment of the semiconductor laser apparatus according to the present invention, and FIG. 56B a side view thereof.
Figure 56B:
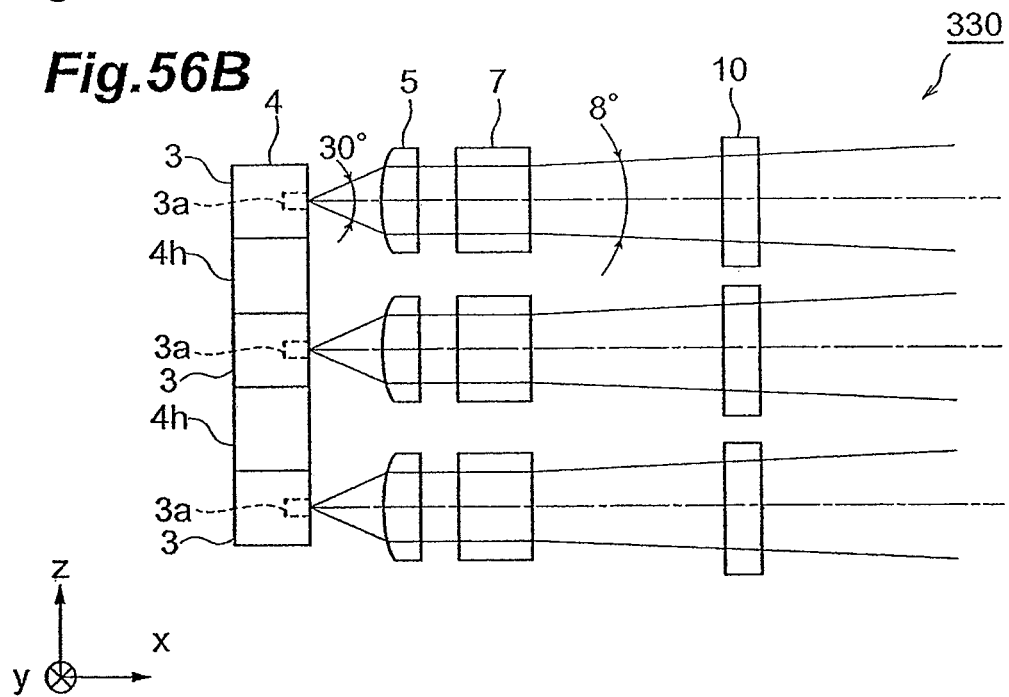

FIG. 56A is a plan view (a view from the z-axis direction) showing a configuration of the twenty fourth embodiment of the semiconductor laser apparatus according to the present invention, and FIG. 56B a side view thereof (a view from the y-axis direction). The semiconductor laser apparatus 330 of this twenty fourth embodiment has a structure in which semiconductor laser apparatus 320 according to the foregoing twenty third embodiment are stacked in the z-axis direction. Namely, this semiconductor laser apparatus 330 of the twenty fourth embodiment has a semiconductor laser array stack 4, first collimator lenses 5, path rotators 7, and wavelength selectors 10 as optical elements.

The semiconductor laser array stack 4 has a configuration similar to that in the fifth embodiment (FIG. 17). The semiconductor laser array stack 4, as shown in FIG. 17, has the structure in which a plurality of semiconductor laser arrays 3 and a plurality of heat sinks 4*h* are alternately arranged along the z-axis direction.

The heat sinks 4*h* cool the semiconductor laser arrays 3. The heat sinks 4*h* have a cooling water path formed by combining copper members of flat plate shape. Cooling water circulates in this cooling water path.

Each first collimator lens 5 has a configuration similar to that in the first embodiment and the twenty third embodiment (FIG. 6). Each first collimator lens 5 is so set that the generatrix of the first collimator lens 5 is perpendicular to the vertical direction (z-axis direction) of the opposed semiconductor laser array 3. By this setup, it is feasible to refract the beam from each active layer 3*a*, in the plane perpendicular to the generatrix of the first collimator lens 5 and to collimate the beam. Namely, the first collimator lens 5 refracts and collimates the component in the vertical direction (z-axis direction) of the beam emitted from each active layer 3*a*. For efficient collimation, each first collimator lens 5 is arranged in the vicinity of the active layers 3*a*. For this reason, the first collimator lenses 5 are in one-to-one correspondence to the semiconductor laser arrays 3. Namely, the number of first collimator lenses 5 installed is equal to the number of semiconductor laser arrays 3. Each first collimator lens 5 is arranged to face one semiconductor laser array 3. Therefore, the beams emitted from the respective active layers 3*a* of one semiconductor laser array 3 are incident all to one first collimator lens 5.

Each path rotator 7 also has a configuration similar to that in the first embodiment and the twenty third embodiment (FIG. 7). The path rotator 7 rotates the transverse section of each beam collimated by the first collimator lens 5, by about 90°. For this reason, the path rotators 7 are arranged in one-to-one correspondence to the first collimator lenses 5. Namely, each path rotator 7 is arranged to face one first collimator lens 5. Therefore, all the beams emitted from one first collimator lens 5 are incident to one corresponding path rotator 7. The cylindrical surfaces of the respective path rotators 7 are in one-to-one correspondence to the active layers 3*a*. Therefore, the beams emitted from the respective active layers 3*a* of one semiconductor laser array 3 are incident all to one corresponding path rotator 7.

Each wavelength selector 10 as an optical element has a configuration similar to that in the fifteenth embodiment (FIG. 42) and, just as in the case of the twenty third embodiment, the product LuxxMaster™ with the reflectance of 50% available from PD-LD Inc. is applied thereto. Therefore, the wavelength selectors 10 are arranged in one-to-one correspondence to the respective path rotators 7 and each wavelength selector 10 constitutes an external resonator in cooperation with each active layer 3a in the semiconductor laser array stack 4.

In the semiconductor laser apparatus 330 of the twenty fourth embodiment, as described above, the laser light generated in the semiconductor laser arrays 3 resonates in the external resonator paths to make the spatial transverse mode closer to the single mode, and the laser light with the divergence angle reduced by the configuration to make the spatial transverse mode closer to the single mode can be outputted to the outside. As described above, the semiconductor laser apparatus 330 is able to reduce the divergence angle of the final output light.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The present invention is suitably applicable to the semiconductor laser apparatus for emitting the laser light with the small divergence angle and for emitting the laser light with the small divergence angle and narrow spectral width.

The invention claimed is:

1. A semiconductor laser apparatus comprising:
   a semiconductor laser array stack in which a plurality of semiconductor laser arrays, each semiconductor laser array having a plurality of active layers each of which extends along a first direction on a predetermined plane and which are arranged along a second direction perpendicular to the first direction and in parallel on the predetermined plane, are stacked in a third direction perpendicular to the predetermined plane;

a first collimator lens for collimating a plurality of beams emitted from said respective active layers, in the third direction perpendicular to the predetermined plane;

a path rotator for outputting each beam arriving from said first collimator lens and collimated in the third direction, with a predetermined divergence angle in the third direction in a state in which a transverse section of the beam is rotated by about 90°; and an optical element arranged at a position where said optical element crosses at least a part of each beam with the predetermined divergence angle in the third direction, outputted from said path rotator, and transmits the rest of the beam, and having a reflecting surface constituting at least a part of an external resonator in cooperation with said active layers, wherein the reflecting surface is so inclined at a predetermined angle relative to a plane perpendicular to an optical axis of each beam outputted from said path rotator, as to totally reflect a part of each arriving beam to return the totally reflected part of each beam to the associated one of said active layers, wherein an angle of installation of the reflecting surface in said optical element is smaller than a half of the divergence angle of each beam outputted from said path rotator.

2. A semiconductor laser apparatus according to claim 1, wherein the reflecting surface is arranged to cross the optical axis of each beam outputted from said path rotator.

* * * * *